US012660153B2

(12) United States Patent
Kuan et al.

(10) Patent No.: US 12,660,153 B2
(45) Date of Patent: Jun. 16, 2026

(54) SEMICONDUCTOR DEVICE INCLUDING SUPPORTING LAYERS TO REINFORCE 3D MEMORY STRUCTURE

(71) Applicant: NANYA TECHNOLOGY CORPORATION, New Taipei City (TW)

(72) Inventors: Shih-Fan Kuan, Taoyuan City (TW); Hsu-Cheng Fan, Taoyuan City (TW); Jiann-Jong Wang, New Taipei City (TW); Chung-Hsin Lin, New Taipei City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 589 days.

(21) Appl. No.: 17/963,462

(22) Filed: Oct. 11, 2022

(65) Prior Publication Data

US 2024/0121939 A1    Apr. 11, 2024

(51) Int. Cl.
*H10B 12/00* (2023.01)

(52) U.S. Cl.
CPC ............. *H10B 12/30* (2023.02); *H10B 12/03* (2023.02); *H10B 12/05* (2023.02); *H10B 12/482* (2023.02)

(58) Field of Classification Search
CPC ........ H10B 12/30; H10B 12/03; H10B 12/05; H10B 12/482; H10B 12/02; H10B 12/488
USPC ....................................................... 257/296
See application file for complete search history.

(56) References Cited

U.S. PATENT DOCUMENTS

| | | | | |
|---|---|---|---|---|
| 2011/0266604 A1* | 11/2011 | Kim | ....................... | H10B 43/20 257/314 |
| 2016/0322368 A1* | 11/2016 | Sun | ......................... | G11C 11/223 |
| 2018/0323199 A1* | 11/2018 | Roberts | ................ | H10D 64/518 |
| 2019/0206869 A1* | 7/2019 | Kim | ...................... | H10B 12/20 |
| 2021/0012828 A1* | 1/2021 | Kim | ...................... | G11C 11/4097 |
| 2022/0122974 A1* | 4/2022 | Ryu | ...................... | H10B 12/50 |
| 2022/0122975 A1* | 4/2022 | Ryu | ...................... | H10B 12/30 |
| 2022/0139916 A1* | 5/2022 | Kwak | .................... | H10D 30/63 257/300 |
| 2022/0208260 A1 | 6/2022 | Chiang et al. | | |
| 2022/0285356 A1 | 9/2022 | Son | | |

FOREIGN PATENT DOCUMENTS

| | | |
|---|---|---|
| TW | 202201723 A | 1/2022 |
| TW | 202221898 A | 6/2022 |

* cited by examiner

*Primary Examiner* — Duy T Nguyen

(74) *Attorney, Agent, or Firm* — MUNCY, GEISSLER, OLDS & LOWE, P.C.

(57)         ABSTRACT

A semiconductor device and a method of manufacturing the same are provided. The semiconductor device includes a substrate, a word line, a first capacitor, a second capacitor, a first bit line and a second bit line. The word line is disposed on the substrate and extends along a first direction. The first capacitor extends along a second direction different from the first direction and is located at a first level. The second capacitor extends along the second direction and is located at a second level different from the first level. The first bit line is electrically connected to the first capacitor and the word line. The second bit line is electrically connected to the second capacitor and the word line.

16 Claims, 110 Drawing Sheets

120-5
130-4
120-4
130-3
120-3
130-2
120-2
130-1
120-1
110

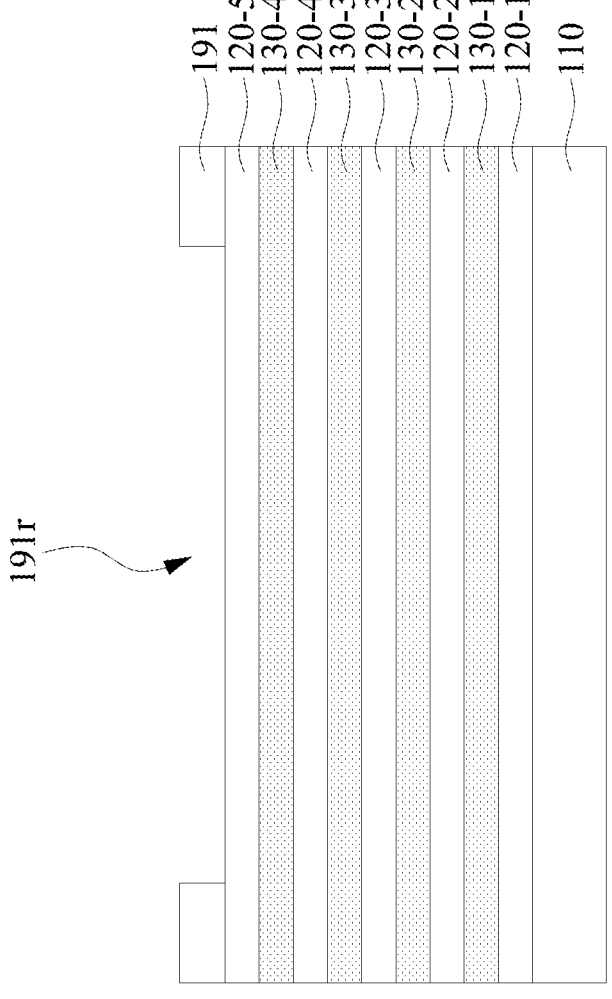
191
120-5
130-4
120-4
130-3
120-3
130-2
120-2
130-1
120-1
110
191r
FIG. 4B
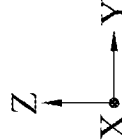
Z
X Y

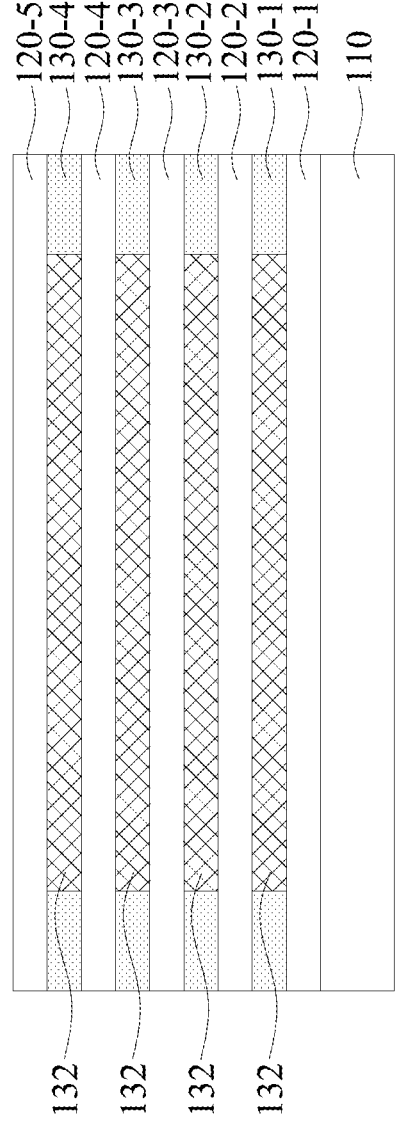
FIG. 6B
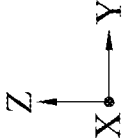

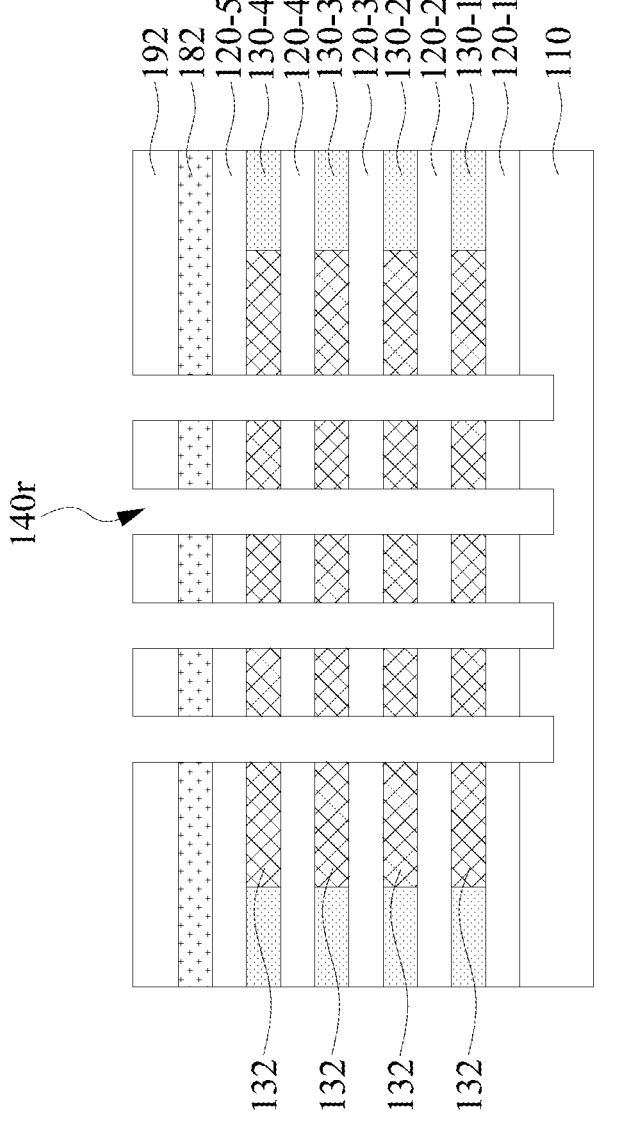
192
182
120-5
130-4
120-4
130-3
120-3
130-2
120-2
130-1
120-1
110
140r
132
132
132
132
FIG. 9B
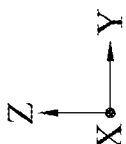
Z
X
Y 182
120-5
130-4
120-4
130-3
120-3
130-2
120-2
130-1
120-1
110

140r 132
132
132
132

182
120-5
130-4
120-4
130-3
120-3
130-2
120-2
130-1
120-1
110

142

140r 132
132
132
132

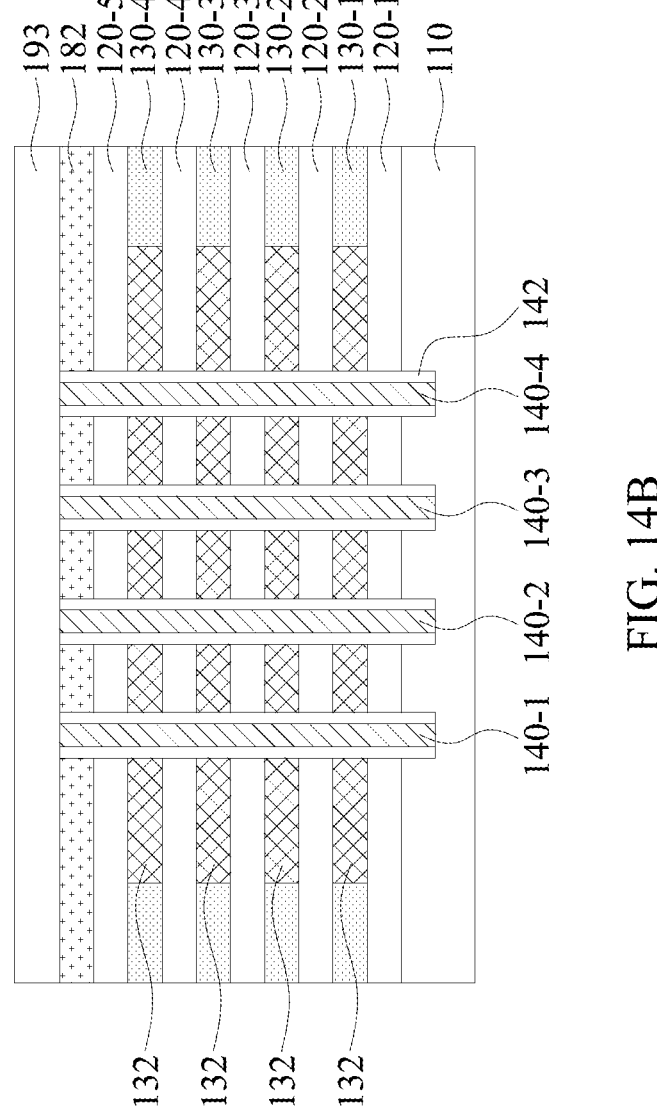
FIG. 14B
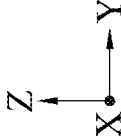

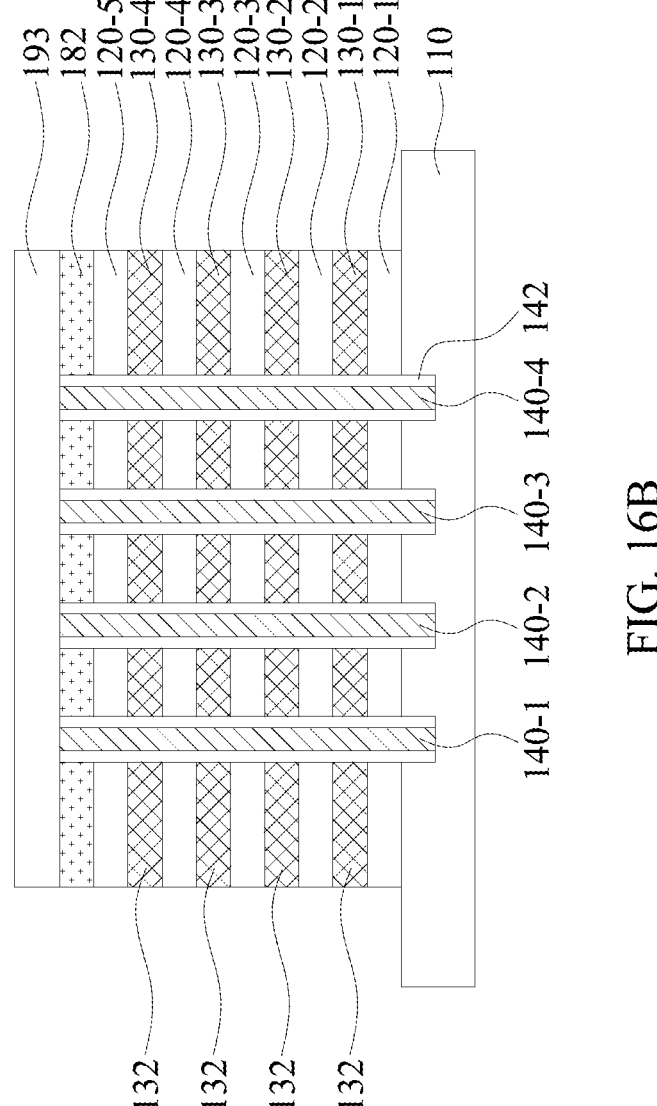
FIG. 16B
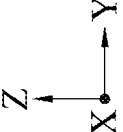

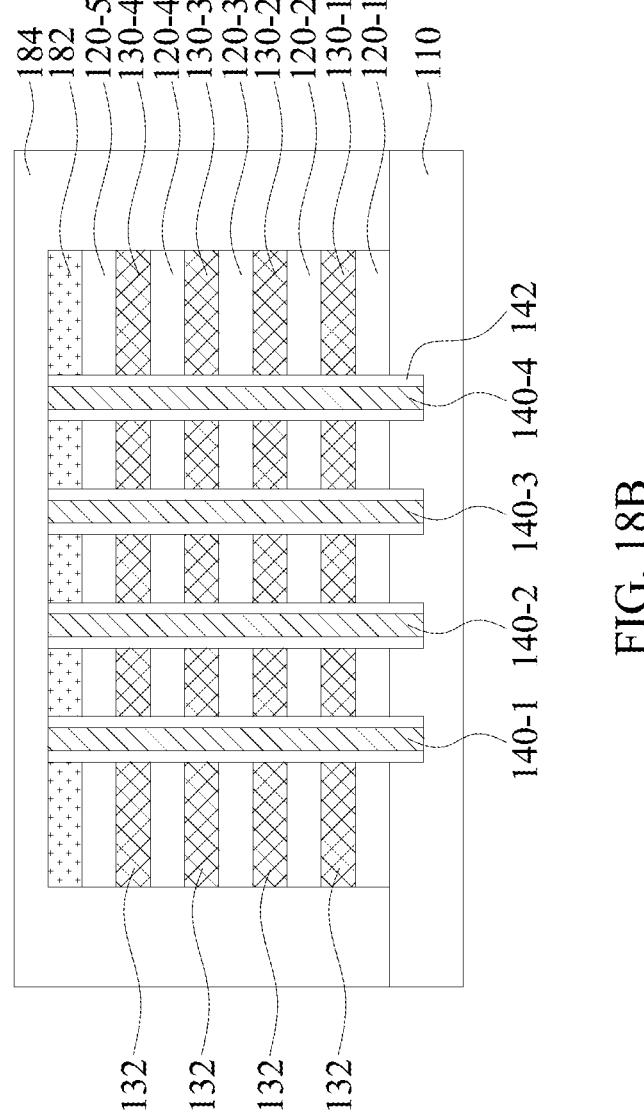
FIG. 18B
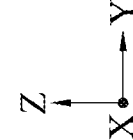

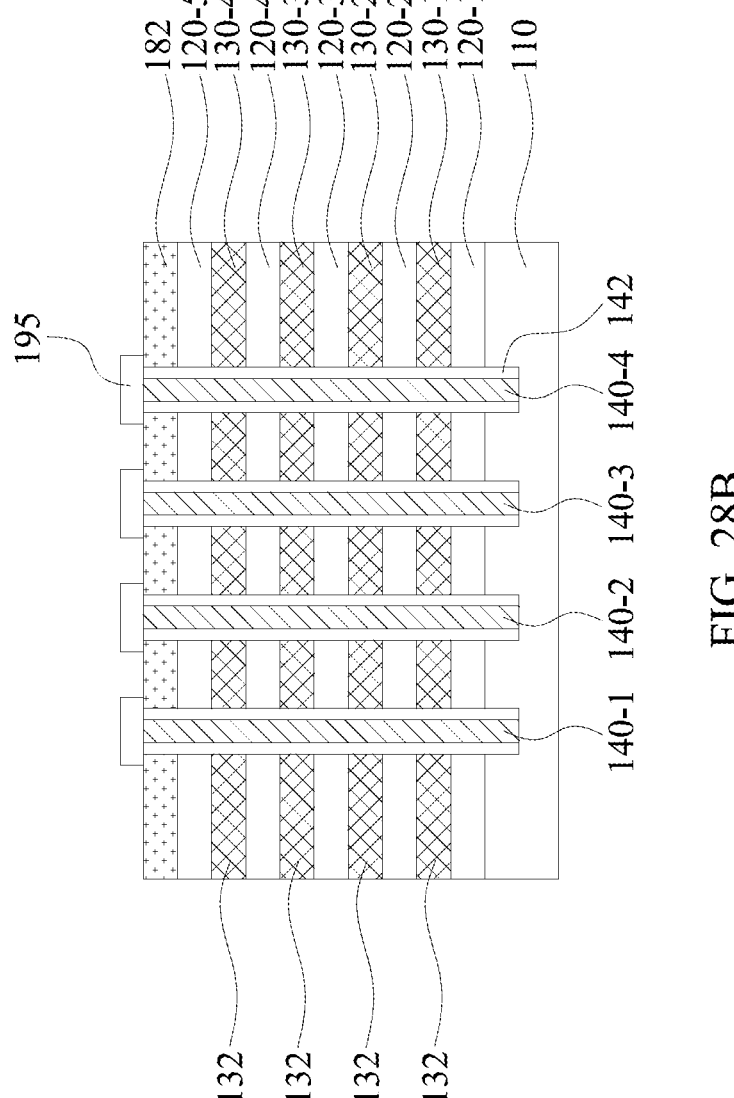
195
182
120-5
130-4
120-4
130-3
120-3
130-2
120-2
130-1
120-1
110
142
140-4
140-3
140-2
140-1
132
132
132
132
FIG. 28B
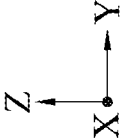
Z
X
Y 196
182
130-4
130-3
130-2
130-1
110
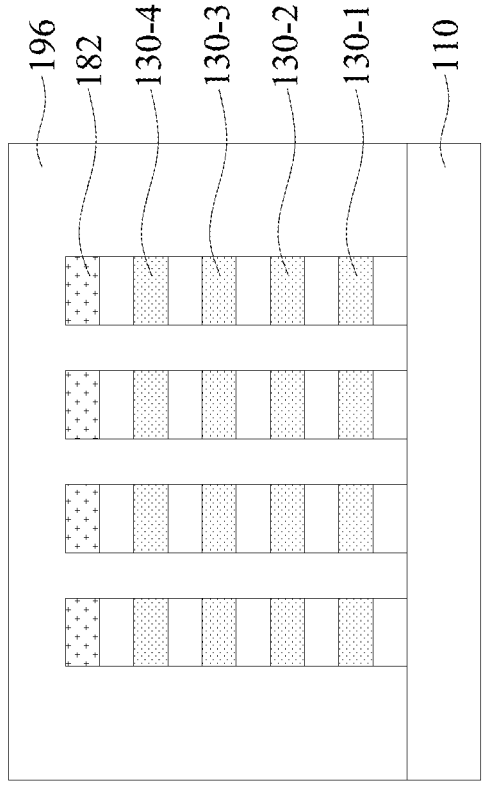
FIG. 30B
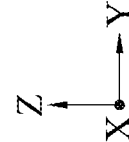

182
130-4
130-3
130-2
130-1
110

122r

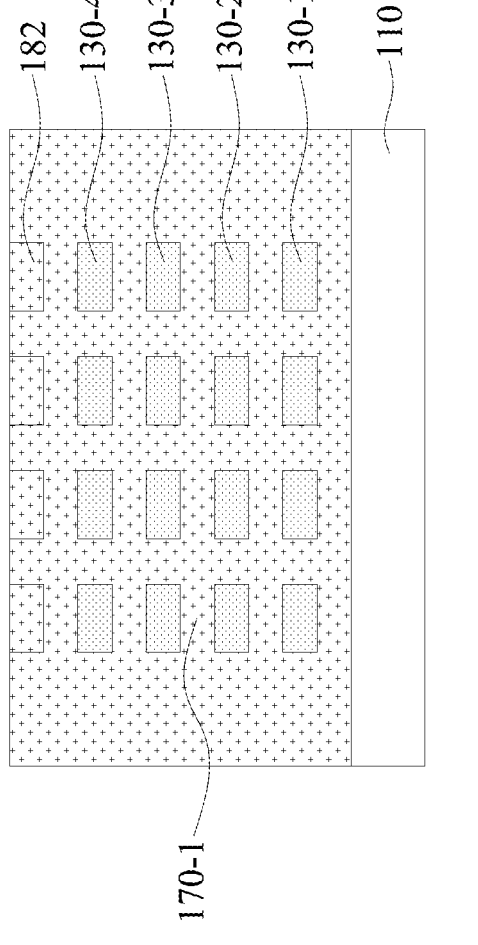
FIG. 34B
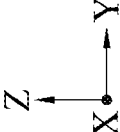

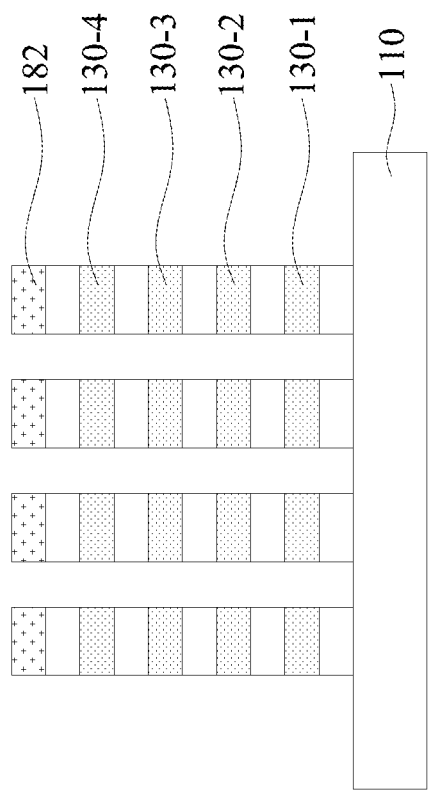
182
130-4
130-3
130-2
130-1
110
FIG. 35B
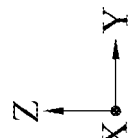
Z
X
Y 182    130-4    130-3    130-2    130-1    110

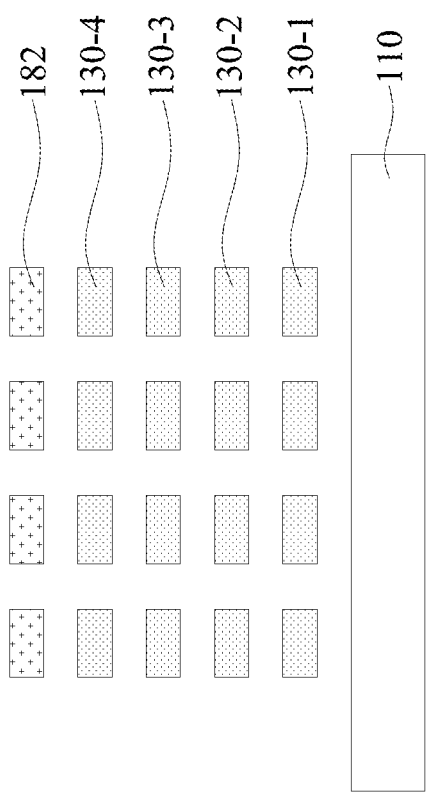
FIG. 37B
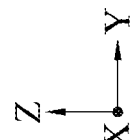

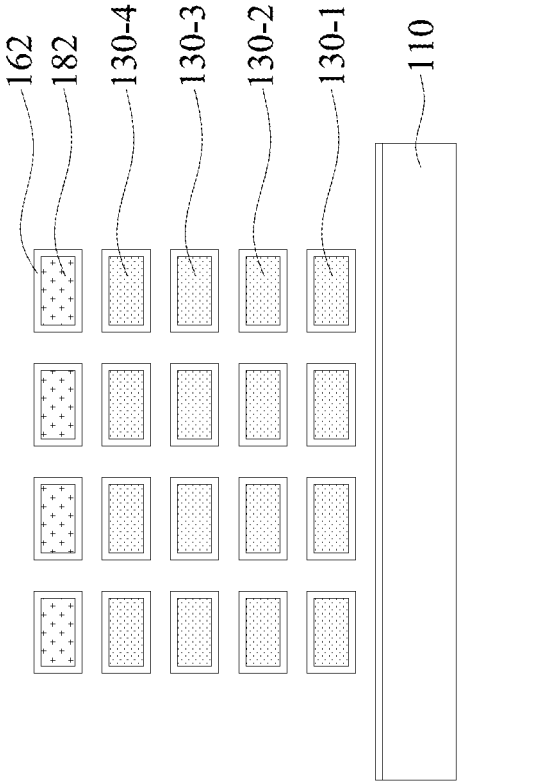
162
182
130-4
130-3
130-2
130-1
110
FIG. 38B
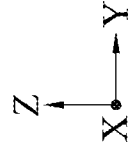

164
162
182
130-4
130-3
130-2
130-1
110

1e

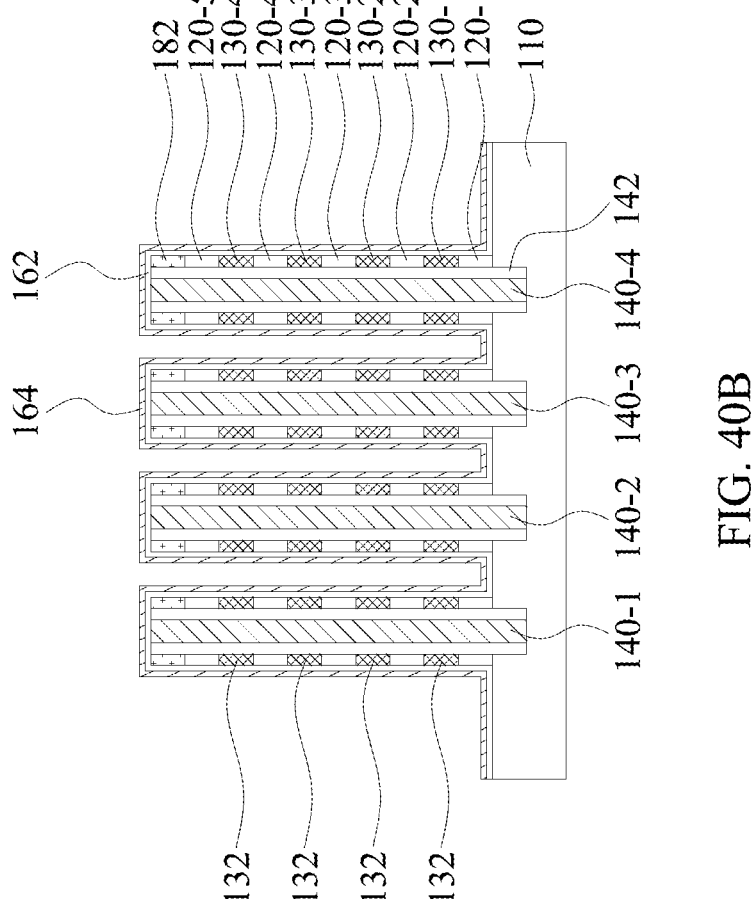
FIG. 40B
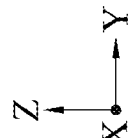

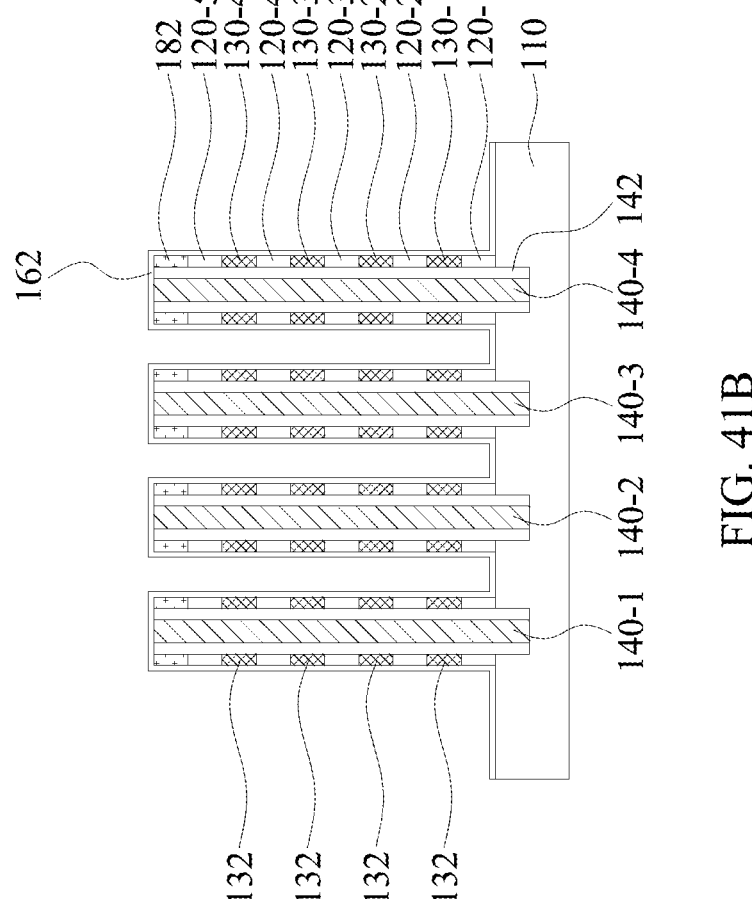
FIG. 41B
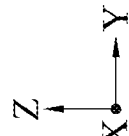

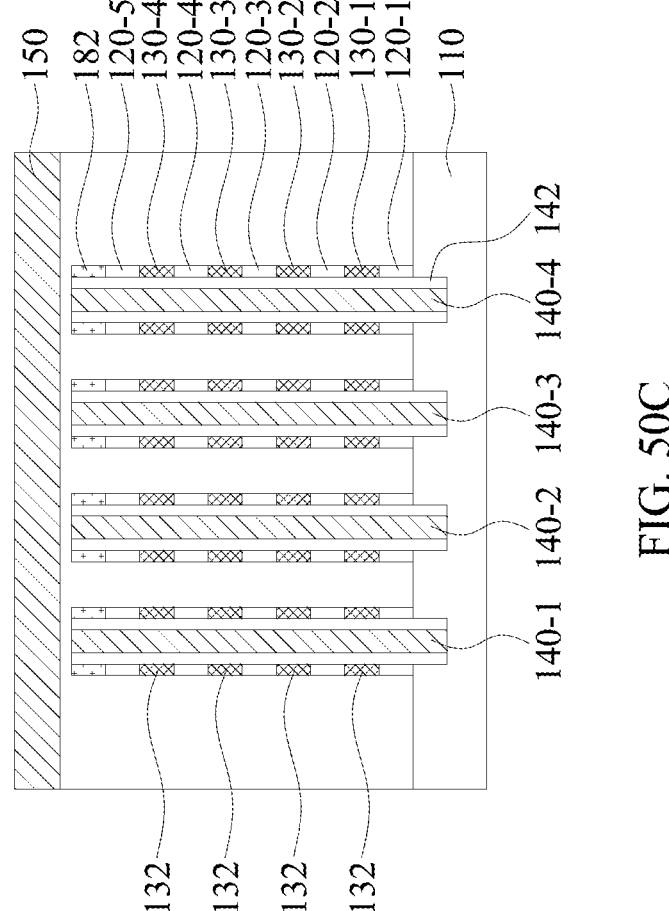
FIG. 50C
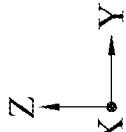

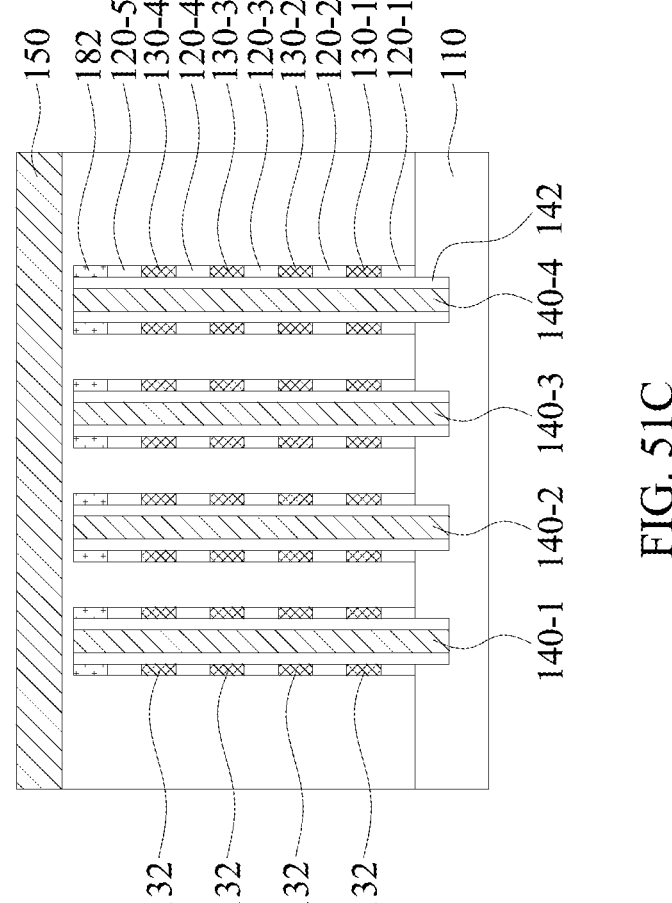
FIG. 51C
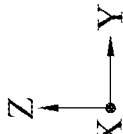

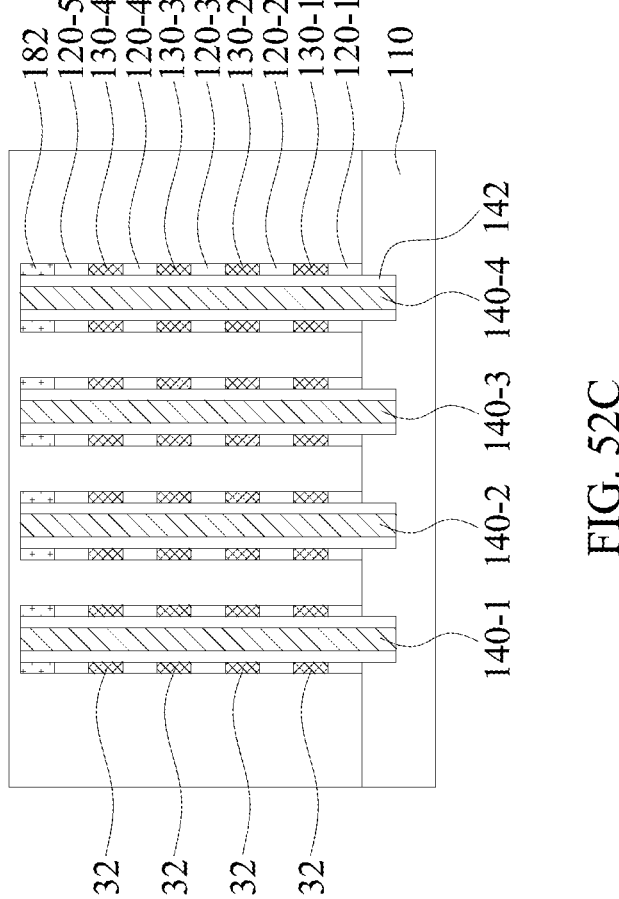
FIG. 52C
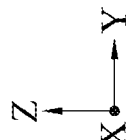

SEMICONDUCTOR DEVICE INCLUDING SUPPORTING LAYERS TO REINFORCE 3D MEMORY STRUCTURE

TECHNICAL FIELD

The present disclosure relates to a semiconductor device and a method of manufacturing the same, and in particularly to a semiconductor device including a three-dimensional memory structure.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, in which F represents the photolithographic minimum feature width or critical dimension (CD). However, recently, DRAM manufacturers are facing significant challenges in minimizing memory cell area as word line spacing continues to be reduced.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a word line, a first capacitor, a second capacitor, a first bit line and a second bit line. The word line is disposed on the substrate and extends along a first direction. The first capacitor extends along a second direction different from the first direction and is located at a first level. The second capacitor extends along the second direction and is located at a second level different from the first level. The first bit line is electrically connected to the first capacitor and the word line. The second bit line is electrically connected to the second capacitor and the word line.

Another aspect of the present disclosure provides a semiconductor device. The semiconductor device includes a substrate, a first word line, a second word line, a first capacitor, a second capacitor, and a supporting layer. The first word line is disposed on the substrate and extends along a first direction. The second word line is disposed on the substrate and extends along the first direction. The first capacitor is electrically connected to the first word line and extends along a second direction different from the first direction. The first capacitor is located at a first level. The second capacitor is electrically connected to the second word line and extends along the second direction. The second capacitor is located at the first level. The supporting layer extends along a third direction different from the first direction and the second direction. The supporting layer extends across the first capacitor and the second capacitor.

Another aspect of the present disclosure provides a method for manufacturing a semiconductor device. The method includes providing a substrate. The method also includes forming a word line disposed on the substrate. The word line extends along a first direction. The method further includes forming a first capacitor. The first capacitor extends along a second direction different from the first direction and located at a first level. In addition, the method includes forming a second capacitor. The second capacitor extends along the second direction and located at a second level different from the first level. The method also includes forming a first bit line electrically connected to the first capacitor and the word line. The method further includes forming a second bit line electrically connected to the second capacitor and the word line.

The embodiments of the present disclosure provide a semiconductor device. The semiconductor device may define a three-dimensional memory device. For example, the capacitors and the word lines may be arranged horizontally, which reduces the overall thickness of the semiconductor device. Further, the semiconductor device may include supporting layers. The supporting layers may be configured to reinforce the intermediate structure during manufacturing processes. The supporting layers may be configured to increase the length of the first electrode of the capacitor and prevent the first electrode from collapsing, which may increase the number of capacitors.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4A and FIG. 4B illustrate one or more stages of an exemplary method for manufacturing a semiconductor device according to some embodiments of the present disclosure.

FIG. 6A and FIG. 6B illustrate one or more stages of an exemplary method for manufacturing a semiconductor device according to some embodiments of the present disclosure.

FIG. 9A and FIG. 9B illustrate one or more stages of an exemplary method for manufacturing a semiconductor device according to some embodiments of the present disclosure.

FIG. 14A and FIG. 14B illustrate one or more stages of an exemplary method for manufacturing a semiconductor device according to some embodiments of the present disclosure.

FIG. 16A and FIG. 16B illustrate one or more stages of an exemplary method for manufacturing a semiconductor device according to some embodiments of the present disclosure.

FIG. 18A and FIG. 18B illustrate one or more stages of an exemplary method for manufacturing a semiconductor device according to some embodiments of the present disclosure.

FIG. 28A and FIG. 28B illustrate one or more stages of an exemplary method for manufacturing a semiconductor device according to some embodiments of the present disclosure.

FIG. 30A and FIG. 30B illustrate one or more stages of an exemplary method for manufacturing a semiconductor device according to some embodiments of the present disclosure.

FIG. 34A and FIG. 34B illustrate one or more stages of an exemplary method for manufacturing a semiconductor device according to some embodiments of the present disclosure.

FIG. 35A and FIG. 35B illustrate one or more stages of an exemplary method for manufacturing a semiconductor device according to some embodiments of the present disclosure.

FIG. 37A and FIG. 37B illustrate one or more stages of an exemplary method for manufacturing a semiconductor device according to some embodiments of the present disclosure.

FIG. 38A and FIG. 38B illustrate one or more stages of an exemplary method for manufacturing a semiconductor device according to some embodiments of the present disclosure.

FIG. 40A and FIG. 40B illustrate one or more stages of an exemplary method for manufacturing a semiconductor device according to some embodiments of the present disclosure.

FIG. 41A and FIG. 41B illustrate one or more stages of an exemplary method for manufacturing a semiconductor device according to some embodiments of the present disclosure.

FIG. 50A, FIG. 50B and FIG. 50C illustrate one or more stages of an exemplary method for manufacturing a semiconductor device according to some embodiments of the present disclosure.

FIG. 51A, FIG. 51B and FIG. 51C illustrate one or more stages of an exemplary method for manufacturing a semiconductor device according to some embodiments of the present disclosure.

FIG. 52A, FIG. 52B and FIG. 52C illustrate one or more stages of an exemplary method for manufacturing a semiconductor device according to some embodiments of the present disclosure.

DETAILED DESCRIPTION

Figure 1A:
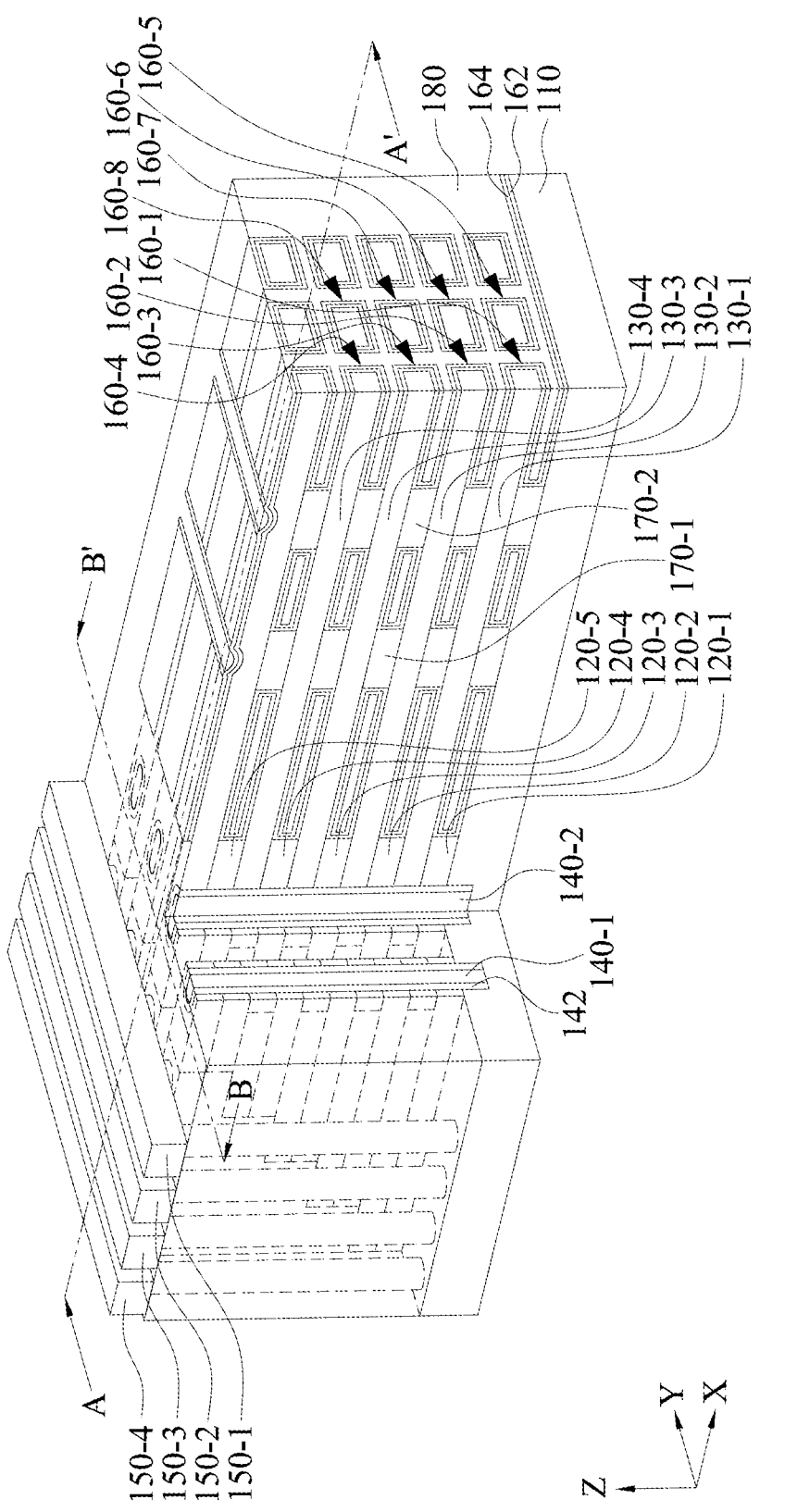
FIG. 1A is a perspective view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Referring to FIG. 1A, FIG. 1A is a perspective view of a semiconductor device 100, in accordance with some embodiments of the present disclosure. The semiconductor device 100 may be included in a memory device. The memory device may include, for example, a dynamic random access memory (DRAM) device, a one-time programming (OTP) memory device, a static random access memory (SRAM) device, or other suitable memory devices.

As shown in FIG. 1A, the semiconductor device 100 may include a substrate 110, isolation layers 120-1, 120-2, 120-3, 120-4, and 120-5, semiconductor layers 130-1, 130-2, 130-3, and 130-4, word lines 140-1 and 140-2, bit lines 150-1, 150-2, 150-3, and 150-4, capacitors 160-1, 160-2, 160-3, 160-4, 160-5, 160-6, 160-7, and 160-8, supporting layers 170-1 and 170-2, as well as a dielectric layer 180.

The substrate 110 may be a semiconductor substrate, such as a bulk semiconductor, a semiconductor-on-insulator (SOI) substrate, or the like. The substrate 110 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 110 may have a multilayer structure, or the substrate 110 may include a multilayer compound semiconductor structure.

In some embodiments, the isolation layer 120-1 may be disposed on the substrate 110. In some embodiments, the isolation layer 120-1 may be in contact with the substrate 110. The isolation layer 120-2 may be disposed on the isolation layer 120-1. In some embodiments, the isolation layer 120-2 may be spaced apart from the isolation layer 120-1 by the semiconductor layer 130-1. The isolation layer 120-3 may be disposed on the isolation layer 120-2. In some embodiments, the isolation layer 120-3 may be spaced apart from the isolation layer 120-2 by the semiconductor layer 130-2. The isolation layer 120-4 may be disposed on the isolation layer 120-3. In some embodiments, the isolation layer 120-4 may be spaced apart from the isolation layer 120-3 by the semiconductor layer 130-3. The isolation layer 120-5 may be disposed on the isolation layer 120-4. In some embodiments, the isolation layer 120-5 may be spaced apart from the isolation layer 120-4 by the semiconductor layer 130-4. In some embodiments, the isolation layers 120-1, 120-2, 120-3, 120-4, and 120-5 may be stacked along the Z direction. In some embodiments, the isolation layers 120-1, 120-2, 120-3, 120-4, and 120-5 may be located at different horizontal levels. Each of the isolation layers 120-1, 120-2, 120-3, 120-4, and 120-5 may include a dielectric material, such as silicon oxide (SiO$_x$), silicon nitride (Si$_x$N$_y$), silicon oxynitride (SiON), or other suitable materials.

In some embodiments, the semiconductor layer 130-1 may be disposed on the substrate 110. In some embodiments, the semiconductor layer 130-1 may be disposed on the isolation layer 120-1. In some embodiments, the semiconductor layer 130-1 may be in contact with the isolation layer 120-1. In some embodiments, the semiconductor layer 130-2 may be disposed on the semiconductor layer 130-1. In some embodiments, the semiconductor layer 130-2 may be disposed on the isolation layer 120-2. In some embodiments, the semiconductor layer 130-3 may be disposed on the semiconductor layer 130-2. In some embodiments, the semiconductor layer 130-3 may be disposed on the isolation layer 120-3. In some embodiments, the semiconductor layer 130-4 may be disposed on the semiconductor layer 130-3. In some embodiments, the semiconductor layer 130-4 may be disposed on the isolation layer 120-4. In some embodiments, the semiconductor layers 130-1, 130-2, 130-3, and 130-4 may be stacked along the Z direction. In some embodiments, each of the semiconductor layers 130-1, 130-2, 130-3, and 130-4 may extend along the X direction. In some embodiments, the semiconductor layers 130-1, 130-2, 130-3, and 130-4 may be located at different horizontal levels. In some embodiments, each of the semiconductor layers 130-1, 130-2, 130-3, and 130-4 may include a semiconductor material, such as silicon (Si), germanium (Ge), tin (Sn), antimony (Sb) in a single crystal form, a polycrystalline form, or an amorphous form.

In some embodiments, the word lines 140-1 and 140-2 may be disposed on the substrate 110. In some embodiments, the word line 140-1 may be disposed between, for example, the bit line 150-1 and the capacitor 160-1. In some embodiments, the word lines 140-1 and 140-2 may penetrate a portion of the substrate 110. In some embodiments, the word lines 140-1 and 140-2 may extend along the Z direction. In some embodiments, each of the word lines 140-1 and 140-2 may penetrate the isolation layers 120-1, 120-2, 120-3, 120-4, and 120-5. In some embodiments, each of the word lines 140-1 and 140-2 may penetrate the semiconductor layers 130-1, 130-2, 130-3, and 130-4. In some embodiments, the word lines 140-1 and 140-2 may be arranged along the Y direction. In some embodiments, each of the word lines 140-1 and 140-2 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, each of the bit lines 150-1, 150-2, 150-3, and 150-4 may be disposed on the isolation layer 120-5. In some embodiments, each of the bit lines 150-1, 150-2, 150-3, and 150-4 may extend along the Y direction. In some embodiments, each of the bit lines 150-1, 150-2, 150-3, and 150-4 may be arranged along the X direction. In some embodiments, each of the bit lines 150-1, 150-2, 150-3, and 150-4 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, the capacitors 160-1, 160-2, 160-3, 160-4, 160-5, 160-6, 160-7, and 160-8 may be arranged along the two-dimensional array. In some embodiments, the capacitors 160-1, 160-2, 160-3, and 160-4 may be stacked along the Z direction. In some embodiments, the capacitors 160-1, 160-2, 160-3, and 160-4 may be located at different horizontal levels. In some embodiments, the capacitors 160-1, 160-2, 160-3, 160-4, 160-5, 160-6, 160-7, and 160-8 may extend along the X direction. In some embodiments, the capacitor 160-1 may be disposed on the substrate 110. In some embodiments, the capacitor 160-2 may be disposed on the capacitor 160-1. In some embodiments, the capacitor 160-3 may be disposed on the capacitor 160-2. In some embodiments, the capacitor 160-4 may be disposed on the capacitor 160-3. In some embodiments, the capacitors 160-1 and 160-5 may be arranged along the Y direction.

In some embodiments, each of the capacitors 160-1, 160-2, 160-3, 160-4, 160-5, 160-6, 160-7, and 160-8 may include a first electrode, a capacitor dielectric, and a second electrode. In some embodiments, each of the semiconductor layers 130-1, 130-2, 130-3, and 130-4 may serve as the first electrode. In some embodiments, a capacitor dielectric 162 may serve as the capacitor dielectric. In some embodiments, a conductive layer 164 may serve as the second electrode.

In some embodiments, the capacitor dielectric 162 may surround the semiconductor layers 130-1, 130-2, 130-3, and 130-4. In some embodiments, the capacitor dielectric 162 may have a ring-shaped profile in a cross-sectional view. In some embodiments, the capacitor dielectric 162 may be in contact with the supporting layers 170-1 and 170-2. In some embodiments, the capacitor dielectric 162 may extend along the X direction. The capacitor dielectric 162 may include a high-k material. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the conductive layer 164 may surround the capacitor dielectric 162. In some embodiments, the conductive layer 164 may surround the semiconductor layers 130-1, 130-2, 130-3, and 130-4. In some embodiments, the conductive layer 164 may be spaced apart from the semiconductor layers 130-1, 130-2, 130-3, and 130-4 by the capacitor dielectric 162. In some embodiments, the conductive layer 164 may have a ring-shaped profile in a cross-sectional view. In some embodiments, the conductive layer 164 may extend along the X direction. In some embodiments, the material of the conductive layer 164 may be different from that of the semiconductor layers 130-1, 130-2, 130-3, and 130-4. In some embodiments, the conductive layer 164 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, each of the supporting layers 170-1 and 170-2 may extend along the Y direction. In some embodiments, each of the supporting layers 170-1 and 170-2 may be configured to support the capacitors 160-1, 160-2, 160-3, 160-4, 160-5, 160-6, 160-7, and 160-8. In some embodiments, each of the supporting layers 170-1 and 170-2 may assist in increasing the length along the X direction of the capacitors 160-1, 160-2, 160-3, 160-4, 160-5, 160-6, 160-7, and 160-8. In some embodiments, the supporting layers 170-1 and 170-2 may be arranged along the X direction. In some embodiments, each of the supporting layers 170-1 and 170-2 may continuously extend across, for example, the capacitors 160-2 and 160-6. In some embodiments, the supporting layer 170-1 may be spaced apart from the supporting layer 170-2 by the capacitor dielectric 162. In some embodiments, the supporting layer 170-1 may be spaced apart from the supporting layer 170-2 by the conductive layer 164. In some embodiments, the supporting layer 170-1 may be spaced apart from the supporting layer 170-2 by the dielectric layer 180. In some embodiments, the supporting layer 170-1 may be disposed between, for example, the semiconductor layers 130-2 and 130-3. In some embodiments, the material of the supporting layers 170-1 and 170-2 may be different from that of the isolation layers 120-1, 120-2, 120-3, 120-4, and 120-5. In some embodiments, each of the supporting layers 170-1 and 170-2 may include silicon nitride ($Si_xN_y$), silicon oxide ($SiO_x$), silicon oxynitride (SiON), or other suitable materials.

The dielectric layer 180 may be disposed on the substrate 110. The dielectric layer 180 may be configured to separate the capacitors 160-1, 160-2, 160-3, 160-4, 160-5, 160-6, 160-7, and 160-8. In some embodiments, a portion of the dielectric layer 180 may be surrounded by the capacitor dielectric 162. In some embodiments, a portion of the dielectric layer 180 may be surrounded by the conductive layer 164. In some embodiments, a portion of the dielectric layer 180 may be disposed between two of the semiconductor layers 130-1, 130-2, 130-3, and 130-4. The dielectric layer 180 may include silicon oxide ($SiO_x$), silicon nitride ($Si_xN_y$), silicon oxynitride (SiON), or other suitable materials.

Figure 1B:
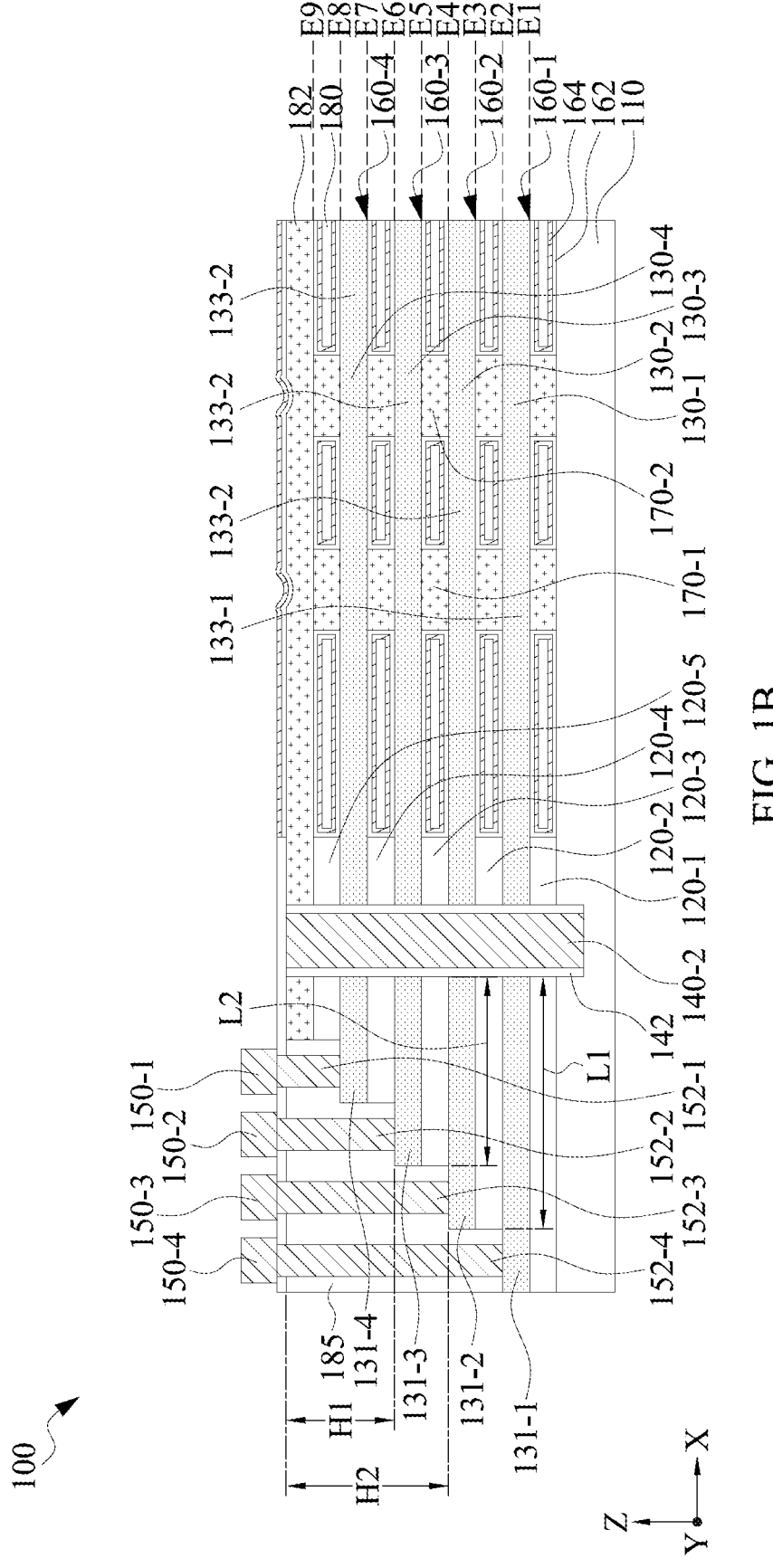
FIG. 1B is a cross-section along line A-A' of the semiconductor device as shown in FIG. 1A, in accordance with some embodiments of the present disclosure.

Referring to FIG. 1B, FIG. 1B is a cross-section along line A-A' of the semiconductor device 100 as shown in FIG. 1A, in accordance with some embodiments of the present disclosure.

In some embodiments, the isolation layer 120-1, the semiconductor layer 130-1, the isolation layer 120-2, the semiconductor layer 130-2, the isolation layer 120-3, the semiconductor layer 130-3, the isolation layer 120-4, the semiconductor layer 130-4, and the isolation layer 120-5 may be located at horizontal levels E1, E2, E3, E4, E5, E6, E7, E8, and E9, respectively.

The semiconductor device 100 may further include a gate dielectric 162. In some embodiments, the gate dielectric 162 may surround the word line 140-2. In some embodiments, the gate dielectric 162 may separate the word line 140-2 from the semiconductor layers 130-1, 130-2, 130-3, and 130-4. In some embodiments, the gate dielectric 162 may penetrate the semiconductor layers 130-1, 130-2, 130-3, and 130-4. In some embodiments, the gate dielectric 162 may penetrate the isolation layers 120-1, 120-2, 120-3, 120-4, and 120-5. In some embodiments, the gate dielectric 162 may include silicon oxide ($SiO_x$), silicon nitride ($Si_xN_y$), silicon oxynitride (SiON), or a combination thereof. In some embodiments, the gate dielectric layer may include dielectric material(s), such as high-k dielectric material. The high-k dielectric material may have a dielectric constant (k value) exceeding 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

The semiconductor layer 130-1 may include a channel layer 131-1. The semiconductor layer 130-2 may include a channel layer 131-2. The semiconductor layer 130-3 may include a channel layer 131-3. The semiconductor layer 130-4 may include a channel layer 131-4. Each of the channel layers 131-1, 131-2, 131-3, and 131-4 may serve as a channel layer of a transistor. For example, the bit line 150-1, the channel layer 131-4, and the word line 140-2 may define a transistor. In some embodiments, each of the channel layers 131-1, 131-2, 131-3, and 131-4 may have different lengths along the X direction. For example, the channel layer 131-2 may have a length L1 along the X direction, the channel layer 131-3 may have a length L2 along the X direction, and the length L1 may be greater than the length L2.

In some embodiments, each of the isolation layers 120-1, 120-2, 120-3, 120-4 and 120-5 may have different lengths along the X direction. In some embodiments, the isolation layer 120-1 may have a length greater than that of the isolation layer 120-2 along the X direction.

In some embodiments, the semiconductor device 100 may further include conductive plugs 152-1, 152-2, 152-3, and 152-4. In some embodiments, each of the conductive plugs 152-1, 152-2, 152-3, and 152-4 may extend along the Y direction. The conductive plugs 152-1, 152-2, 152-3, and 152-4 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, the bit line 150-1 may be electrically connected to the channel layer 131-4 through the conductive plug 152-1. In some embodiments, the bit line 150-2 may be electrically connected to the channel layer 131-3 through the conductive plug 152-2. In some embodiments, the bit line 150-3 may be electrically connected to the channel layer 131-2 through the conductive plug 152-3. In some embodiments, the bit line 150-4 may be electrically connected to the channel layer 131-1 through the conductive plug 152-4. Each of the conductive plugs 152-1, 152-2, 152-3, and 152-4 may have different heights along the Z direction. For example, the conductive plug 152-2 may have a height H1 along the Z direction, the conductive plug 152-3 may have a height H2 along the Z direction, and the height H2 may be greater than the height H1.

The semiconductor layer 130-1 may include a capacitor portion 133-1. The semiconductor layer 130-2 may include a capacitor portion 133-2. The semiconductor layer 130-3 may include a capacitor portion 133-3. The semiconductor layer 130-4 may include a capacitor portion 133-4. Each of the capacitor portions 133-1, 133-2, 133-3, and 133-4 may serve as the first electrode of a capacitor (e.g., 160-1). In some embodiments, the capacitor portion 133-1 may be spaced apart from the channel layer 131-1 by the word line 140-2. In some embodiments, the capacitor portion 133-1 may be spaced apart from the channel layer 131-1 by the gate dielectric 162. In some embodiments, the capacitor portion 133-1 may have a length the same as that of the capacitor portion 133-2 along the X direction.

In some embodiments, the bit line 150-1 may be electrically connected to the capacitor 160-4. In some embodiments, the bit line 150-2 may be electrically connected to the capacitor 160-3. In some embodiments, the bit line 150-3 may be electrically connected to the capacitor 160-2. In some embodiments, the bit line 150-4 may be electrically connected to the capacitor 160-1.

In some embodiments, the semiconductor device 100 may further include a dielectric layer 182. The dielectric layer 182 may cover the dielectric layer 180. The dielectric layer 182 may cover the capacitors 160-1, 160-2, 160-3, and 160-4. In some embodiments, the dielectric layer 182 may include silicon nitride ($Si_xN_y$), silicon oxide ($SiO_x$), silicon oxynitride (SiON), or other suitable materials.

In some embodiments, the semiconductor device 100 may further include a dielectric layer 185. The dielectric layer 185 may cover the isolation layers 120-1, 120-2, 120-3, 120-4, and 120-5. In some embodiments, the dielectric layer 185 may include silicon oxide ($SiO_x$), silicon nitride ($Si_xN_y$), silicon oxynitride (SiON), or other suitable materials.

In some embodiments, the word line 140-2 and the capacitors 160-1, 160-2, 160-3, and 160-4 may be arranged horizontally. In some embodiments, the word line 140-2 may overlap the capacitors 160-1, 160-2, 160-3, and 160-4 along the X direction. In some embodiments, each of the bit lines 150-1, 150-2, 150-3, and 150-4 may be located at a horizontal level greater than that of the capacitors 160-1, 160-2, 160-3, and 160-4. In some embodiments, each of the bit lines 150-1, 150-2, 150-3, and 150-4 may be located at a horizontal level greater than that of the word line 140-2.

Figure 1C:
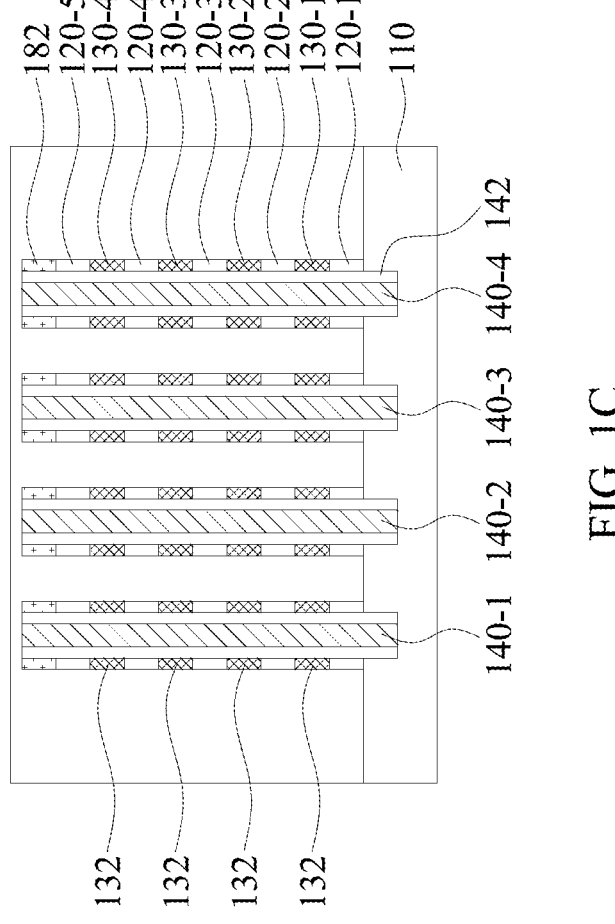
FIG. 1C is a cross-section along line B-B' of the semiconductor device as shown in FIG. 1A, in accordance with some embodiments of the present disclosure.
Figure 1C:
Figure 1C:
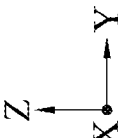

Referring to FIG. 1C, FIG. 1C is a cross-section along line B-B' of the semiconductor device 100 as shown in FIG. 1A, in accordance with some embodiments of the present disclosure.

In some embodiments, each of the semiconductor layers 130-1, 130-2, 130-3, and 130-4 may include a doped region 132. In some embodiments, the doped region 132 may have a conductive type different from that of the semiconductor layers 130-1, 130-2, 130-3, and 130-4. For example, the semiconductor layers 130-1, 130-2, 130-3, and 130-4 may have an n type. The doped region 132 may have a p type. In some embodiments, p type dopants include boron (B), other group III elements, or any combination thereof. In some embodiments, n type dopants include arsenic (As), phosphorus (P), other group V elements, or any combination thereof. The doped region 132 may have a dopant concentration greater than that of the semiconductor layers 130-1, 130-2, 130-3, and 130-4. In some embodiments, the doped region 132 may surround the gate dielectric 162. In some embodiments, the doped region 132 may surround the word lines 140-1, 140-2, 140-3, and 140-4. The doped region 132 may serve as, for example, a source/drain feature of a transistor.

In embodiments of the present disclosure, the semiconductor device 100 may define a three-dimensional memory device. For example, the capacitors and the word lines may be arranged horizontally, which reduces the overall thickness of the semiconductor device 100. The supporting layers may be configured to reinforce the intermediate structure during manufacturing processes. The supporting layers may be configured to increase the length of the first electrode of the capacitor and prevent the first electrode from collapsing, which may increase the number of capacitors.

Figure 2:
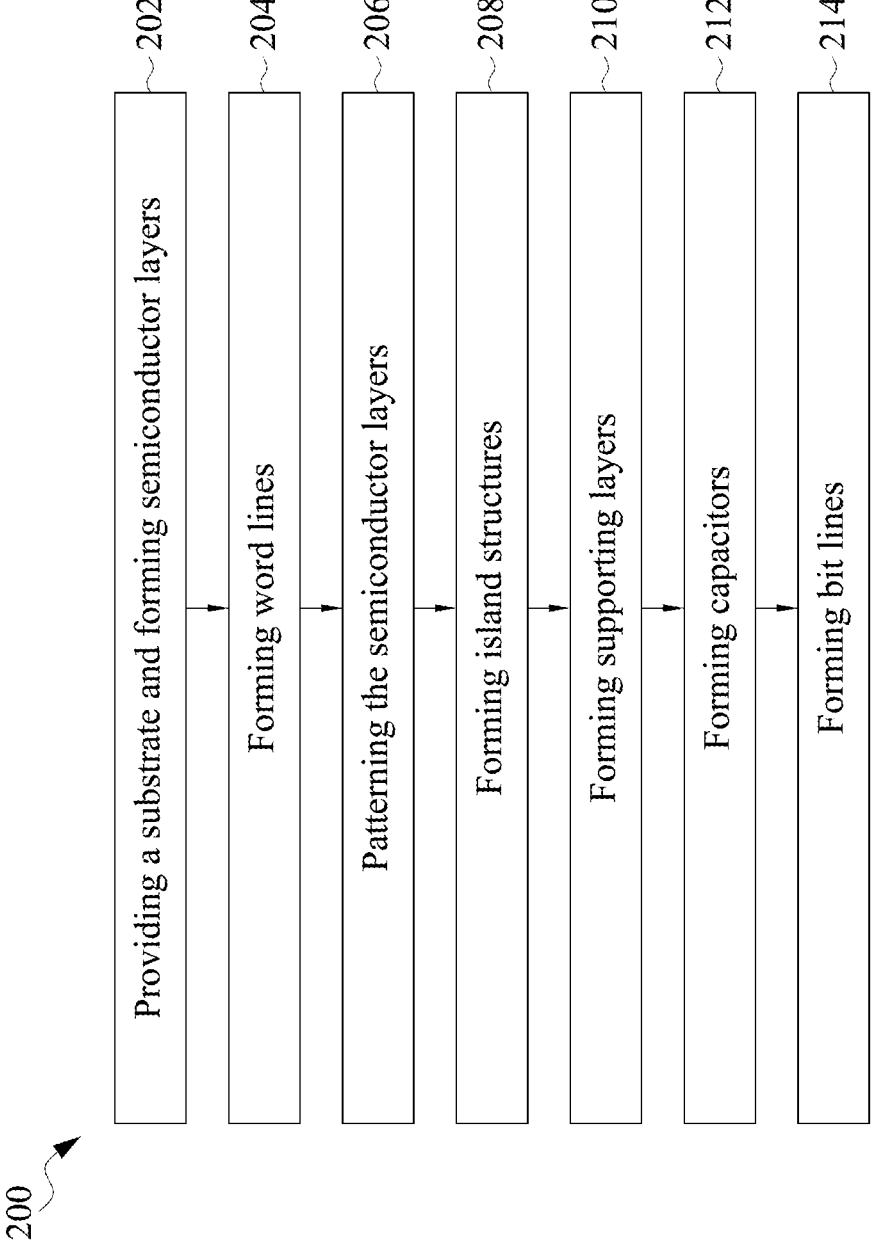
FIG. 2 is a flowchart illustrating a method of manufacturing a semiconductor device, in accordance with some embodiments of the present disclosure.

FIG. 2 is a flowchart illustrating a method 200 of manufacturing a semiconductor device, in accordance with some embodiments of the present disclosure.

The method 200 begins with operation 202 in which a substrate is provided. Semiconductor layers may be formed on the substrate.

The method 200 continues with operation 204 in which word lines may be formed.

The method 200 continues with operation 206 in which semiconductor layers may be patterned to form stepped structures.

The method 200 continues with operation 208 in which semiconductor layers may be patterned to form island structures.

The method 200 continues with operation 210 in which supporting layers may be formed to support the semiconductor layers.

The method 200 continues with operation 212 in which capacitors may be formed.

The method 200 continues with operation 214 in which bit lines may be formed.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 2. In some embodiments, the method 200 can include one or more operations depicted in FIG. 2.

FIG. 3A to FIG. 19A illustrate one or more stages of an exemplary method for manufacturing a semiconductor device 1a according to some embodiments of the present disclosure. FIG. 3B to FIG. 19B are cross-sectional views along line C-C' of FIG. 3A to FIG. 19A, respectively.

Figure 3A:
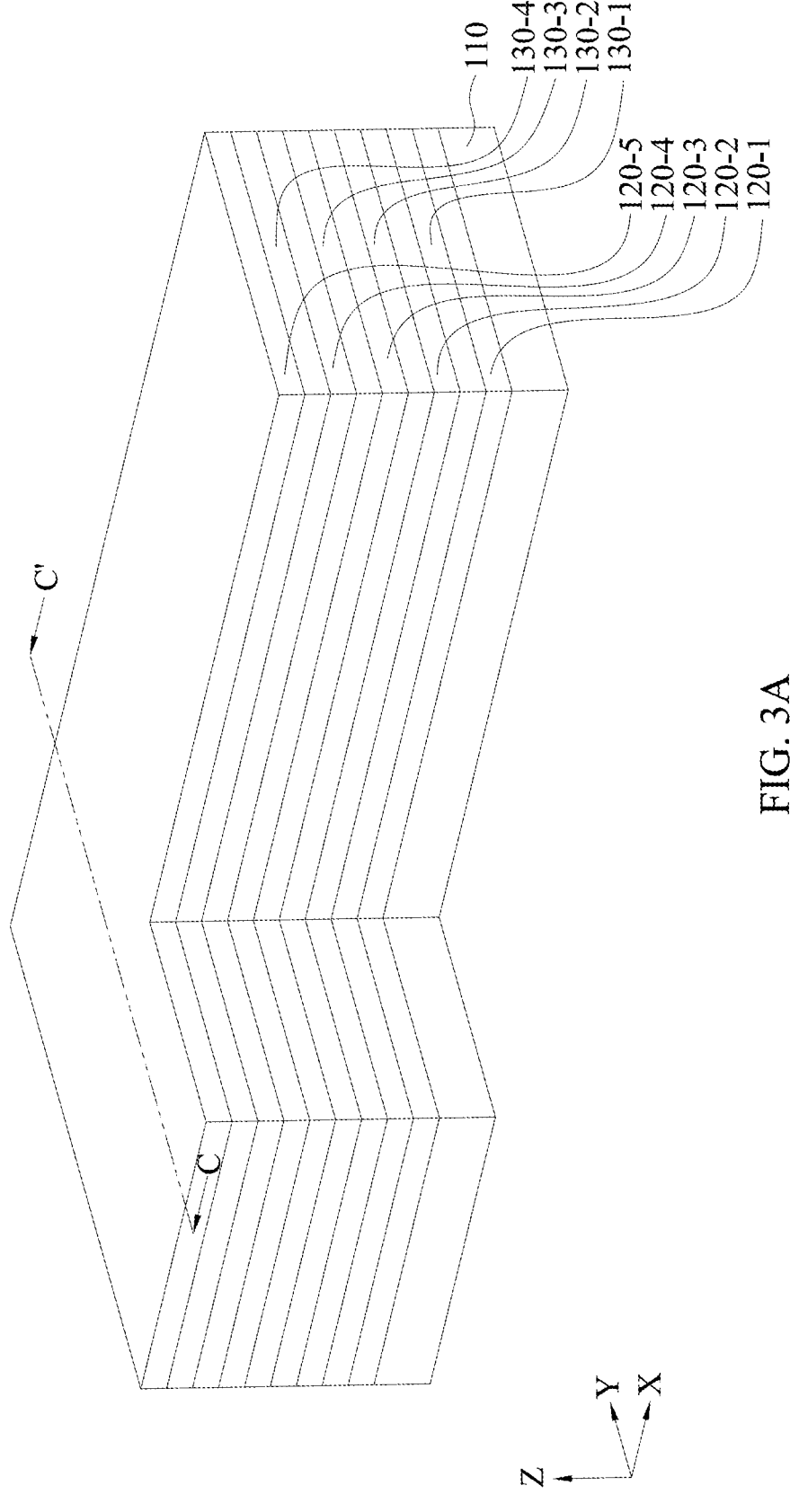
FIG. 3A and FIG. 3B illustrate one or more stages of an exemplary method for manufacturing a semiconductor device according to some embodiments of the present disclosure.
Figure 3B:
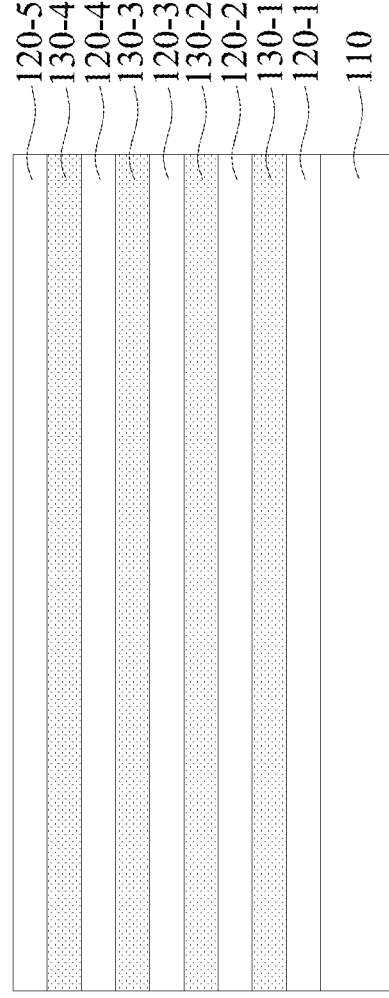
Figure 3B:
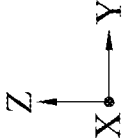

Referring to FIG. 3A and FIG. 3B, a substrate 110 may be provided. In some embodiments, isolation layers 120-1, 120-2, 120-3, 120-4, and 120-5 as well as semiconductor layers 130-1, 130-2, 130-3, and 130-4 may be alternatively formed over the substrate 110. Each of the isolation layers 120-1, 120-2, 120-3, 120-4, and 120-5 as well as the semiconductor layers 130-1, 130-2, 130-3, and 130-4 may be formed by chemical vapor deposition (CVD), atomic layer deposition (ALD), physical vapor deposition (PVD), low-pressure chemical vapor deposition (LPCVD), plasma-enhanced CVD (PECVD), or other suitable processes. In some embodiments, the isolation layers 120-1, 120-2, 120-3, 120-4, and 120-5 may include a dielectric material, such as silicon oxide. In some embodiments, the semiconductor layers 130-1, 130-2, 130-3, and 130-4 may include a semiconductor material, such as silicon. The semiconductor layers 130-1, 130-2, 130-3, and 130-4 may have a first conductive type, such as an n type or a p type.

Figure 4A:
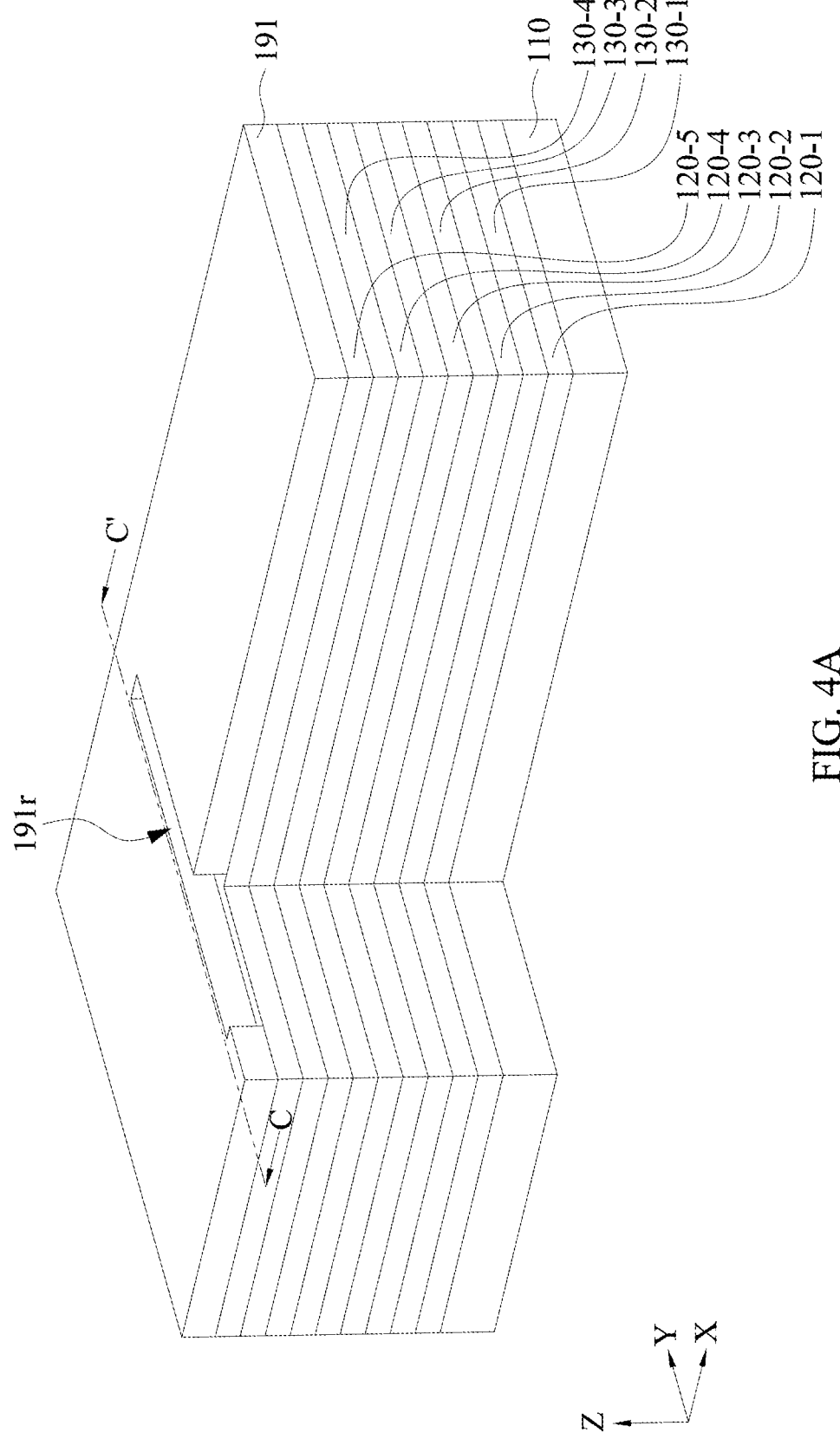

Referring to FIG. 4A and FIG. 4B, a photoresist layer 191 may be formed on the isolation layer 120-5. The photoresist layer 191 may include a negative-tone photoresist (or a negative photoresist) or a positive-tone photoresist (or a positive photoresist). The photoresist layer 191 may have an opening 191r. In some embodiments, the opening 191r may extend along the Y direction. The opening 191r may expose portions of the semiconductor layers 130-1, 130-2, 130-3, and 130-4.

Figure 5A:
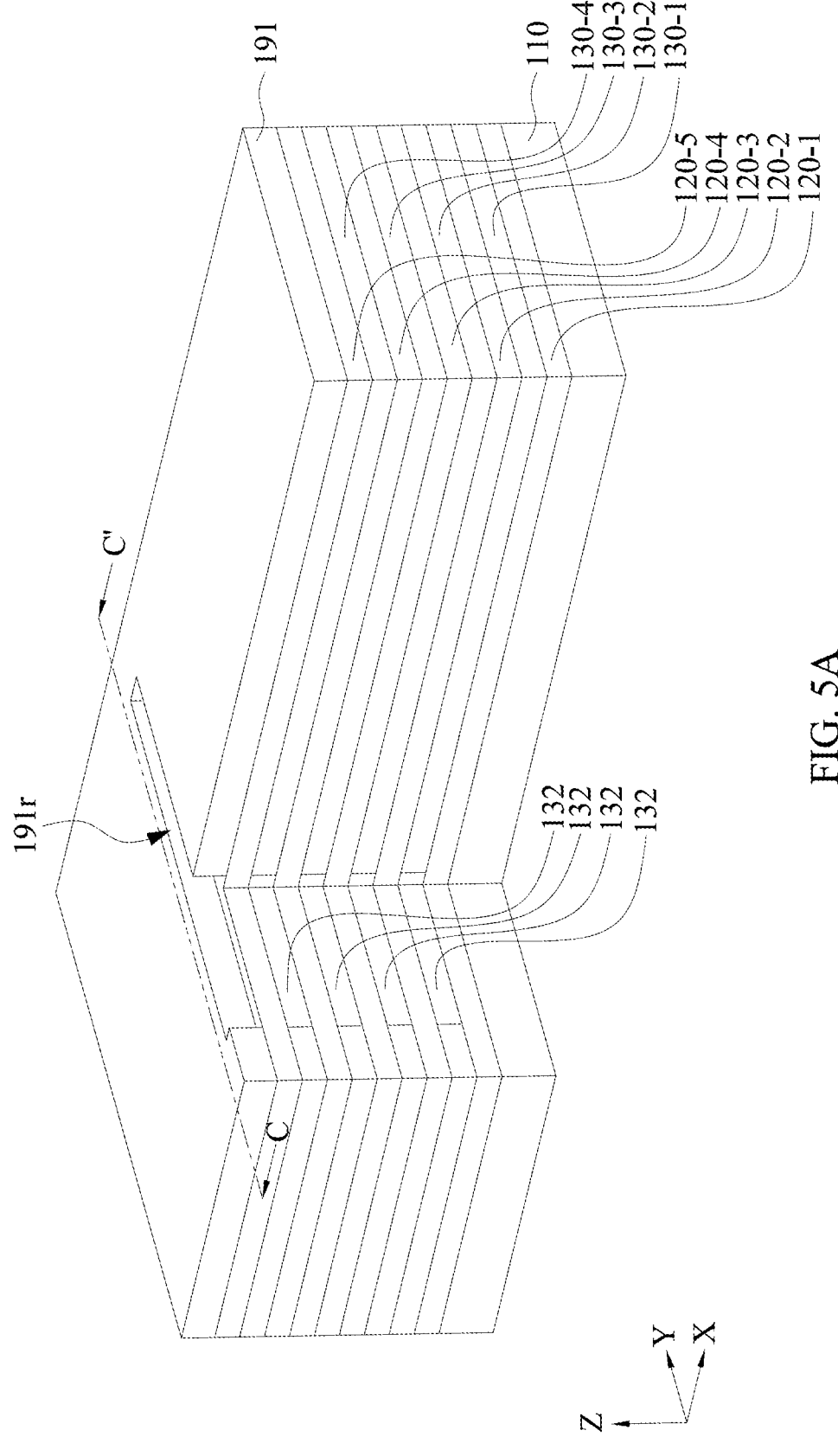
FIG. 5A and FIG. 5B illustrate one or more stages of an exemplary method for manufacturing a semiconductor device according to some embodiments of the present disclosure.
Figure 5B:
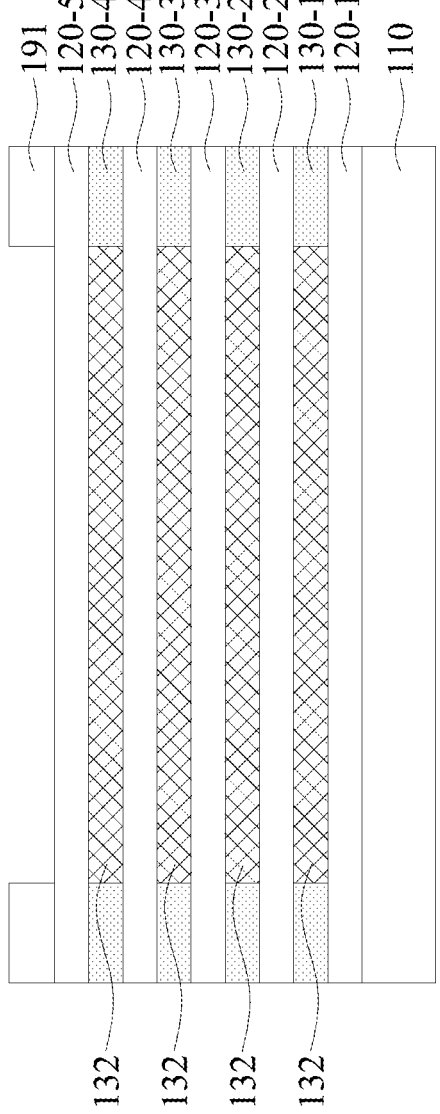
Figure 5B:
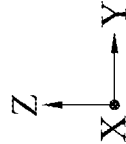

Referring to FIG. 5A and FIG. 5B, an ion-implant technique may be performed. Doped regions 132 may be formed within the semiconductor layers 130-1, 130-2, 130-3, and 130-4. In some embodiments, the doped region 132 may be formed directly under the opening 191r of the photoresist layer 191. The doped regions 132 may have a second conductive type different from the first conductive type and extend along the Y direction.

Figure 6A:
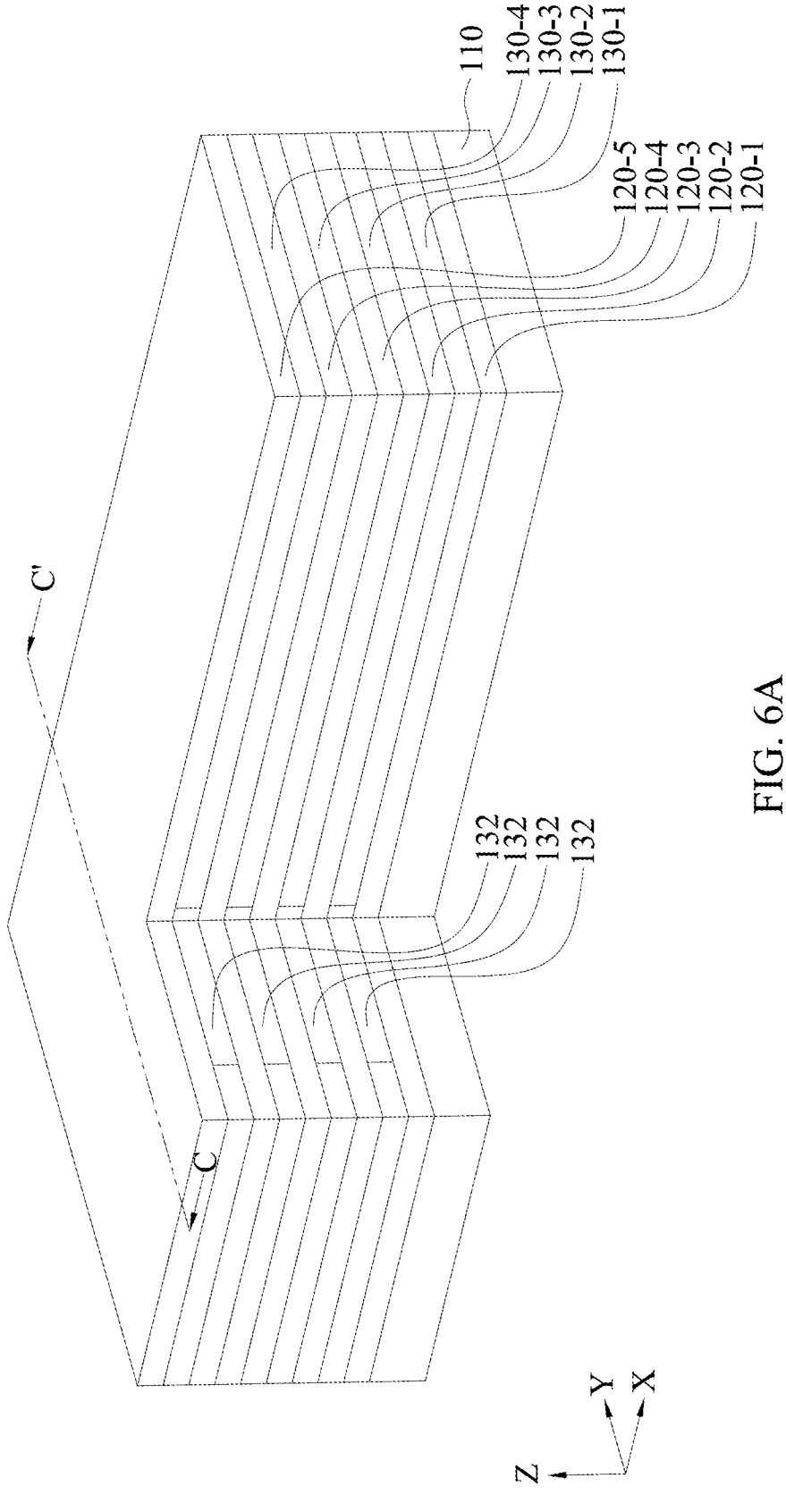

Referring to FIG. 6A and FIG. 6B, the photoresist layer 191 may be removed.

Figure 7A:
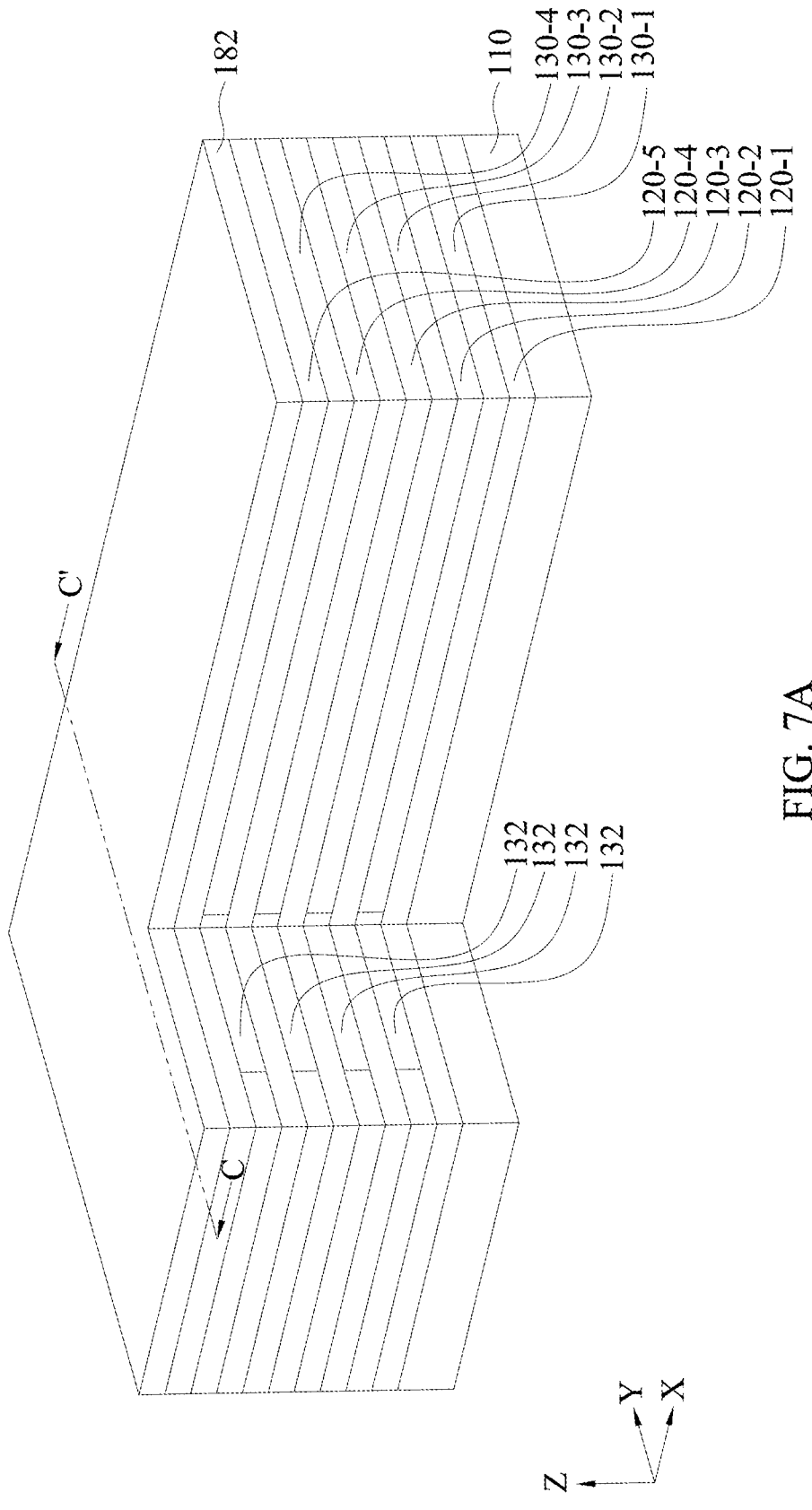
FIG. 7A and FIG. 7B illustrate one or more stages of an exemplary method for manufacturing a semiconductor device according to some embodiments of the present disclosure.
Figure 7B:
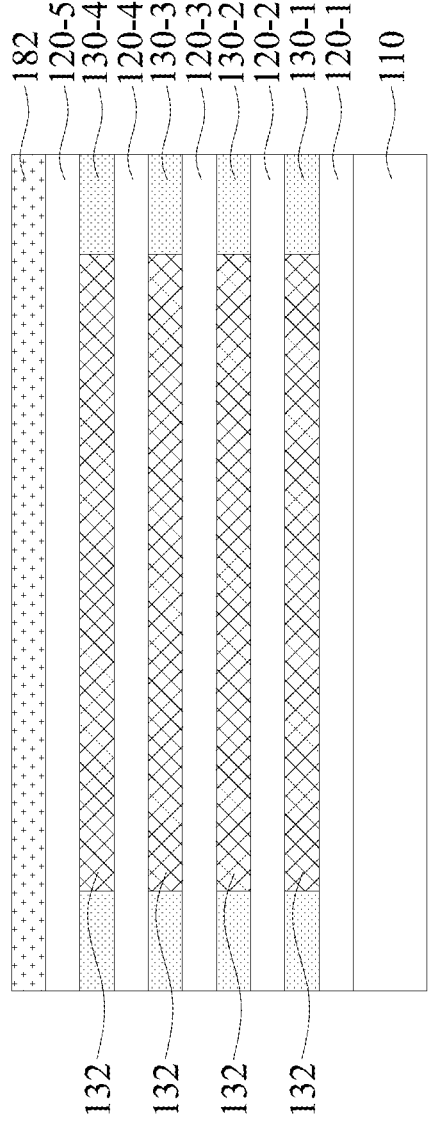

Referring to FIG. 7A and FIG. 7B, a dielectric layer 182 may be formed on the isolation layer 120-5. The dielectric layer 182 may include a dielectric material, such as silicon nitride. The dielectric layer 182 may be formed by CVD, ALD, PVD, LPCVD, PECVD, or other suitable processes.

Figure 8A:
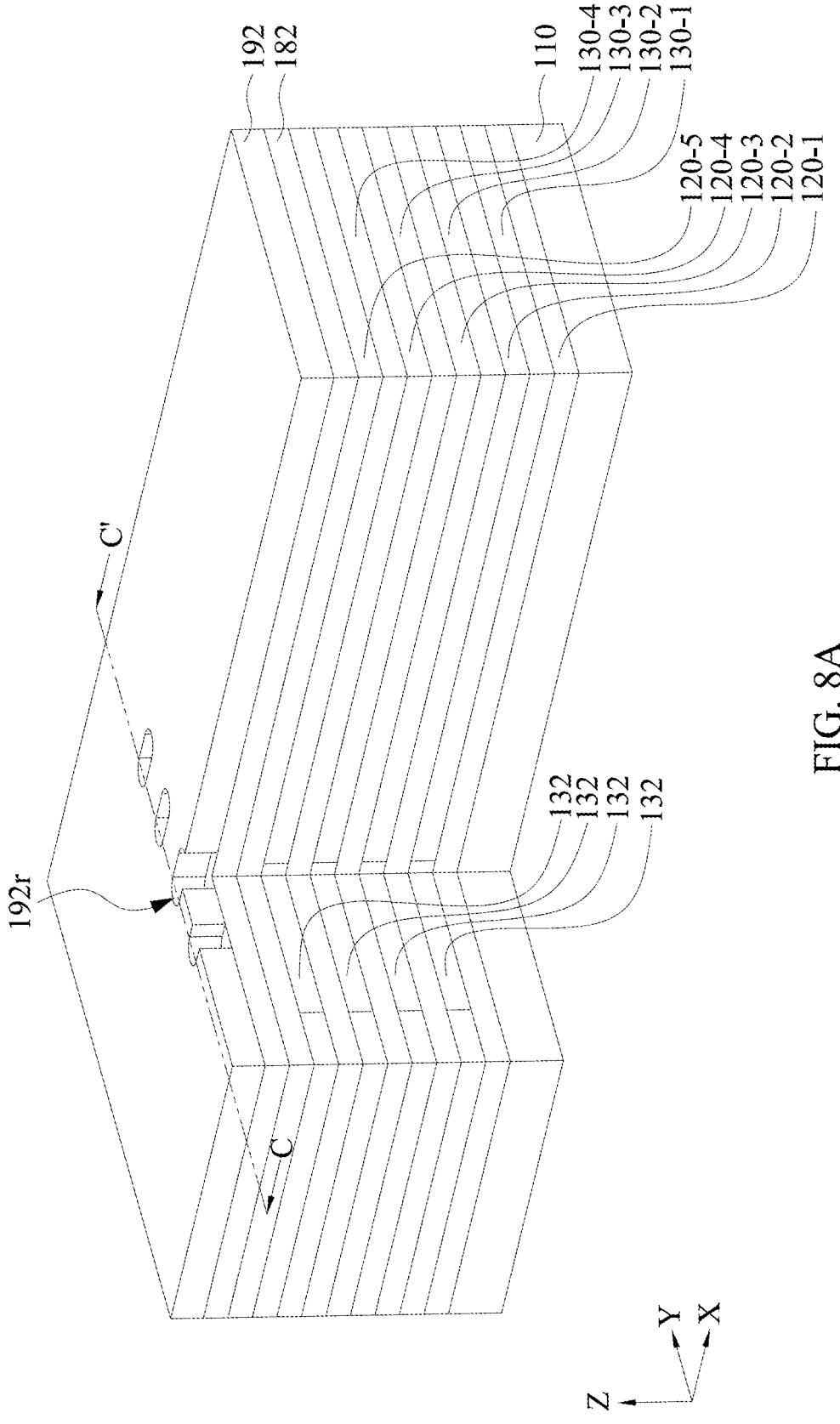
FIG. 8A and FIG. 8B illustrate one or more stages of an exemplary method for manufacturing a semiconductor device according to some embodiments of the present disclosure.
Figure 8B:
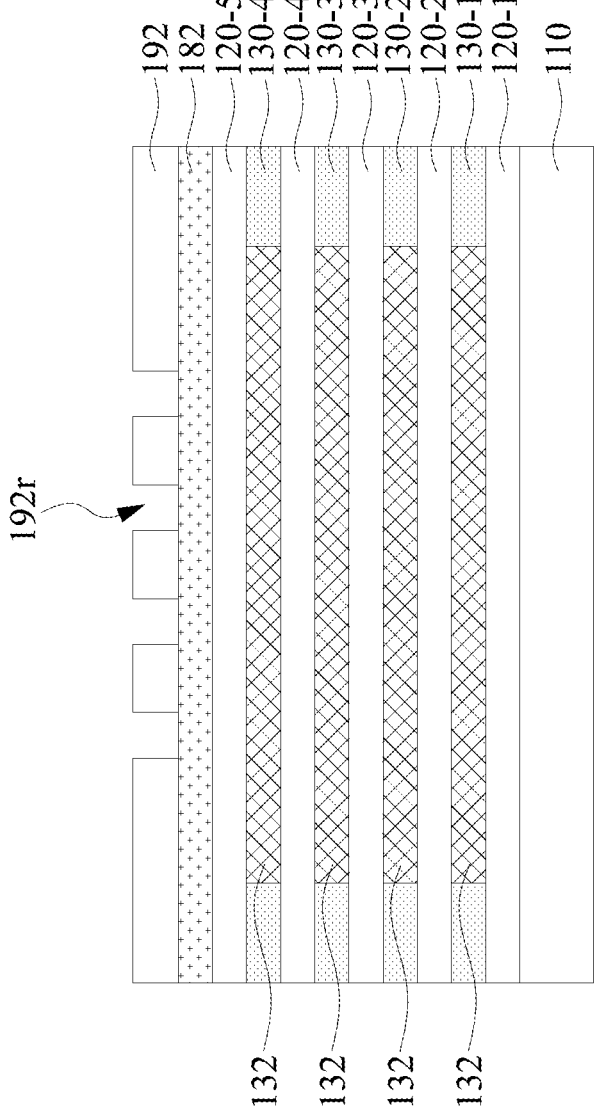

Referring to FIG. 8A and FIG. 8B, a photoresist layer 192 may be formed on the dielectric layer 182. The photoresist layer 192 may include a negative-tone photoresist or a positive-tone photoresist. The photoresist layer 192 may define a plurality of openings 192r. Each of the opening 192r of the photoresist layer 192 may expose a portion of the dielectric layer 182. In some embodiments, the doped regions 132 may be located under the opening 192r of the photoresist layer 192. Each of the openings 192r may have a circular profile, an elliptical profile, or other suitable profiles.

Figure 9A:
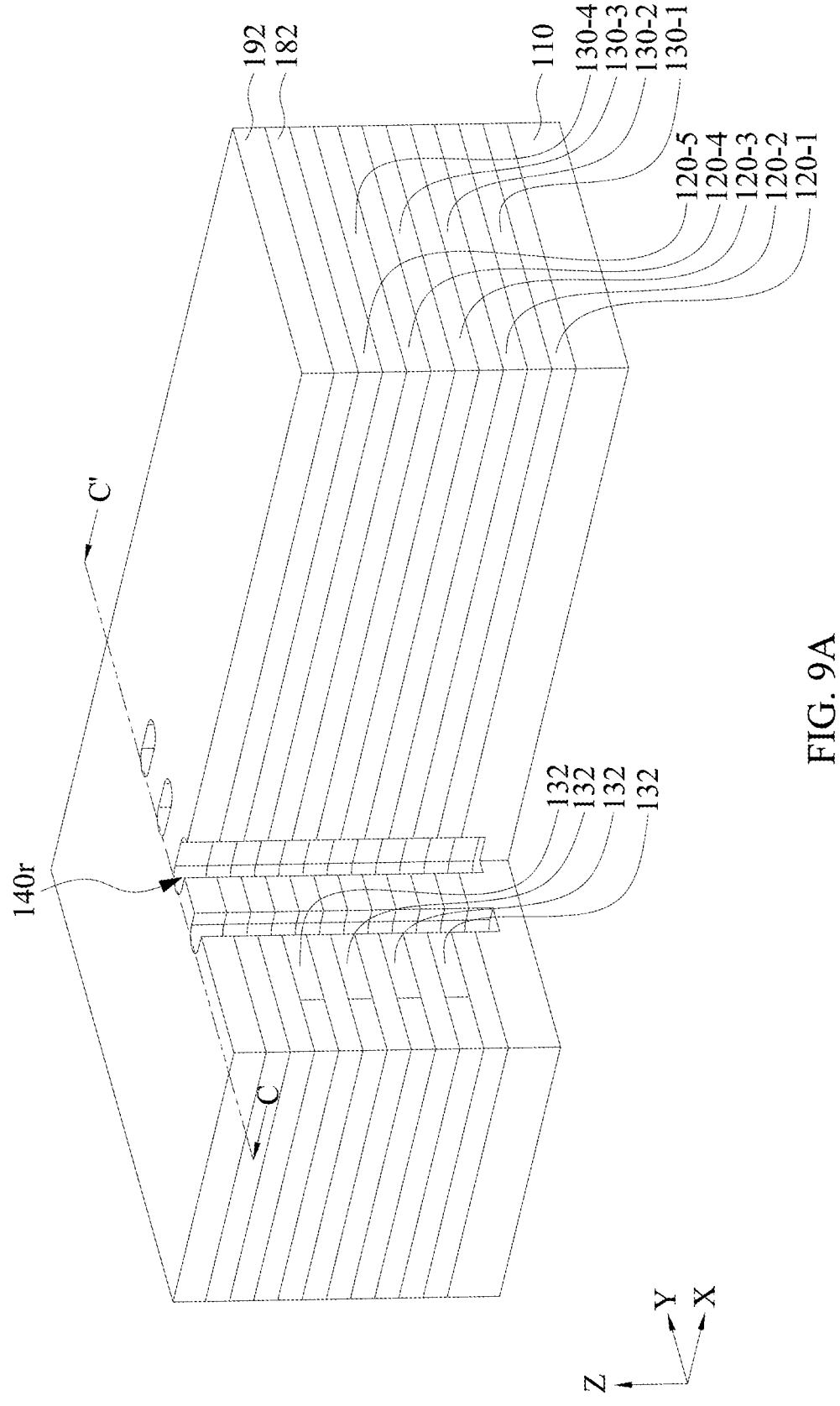

Referring to FIG. 9A and FIG. 9B, an etching technique may be performed. Portions of the isolation layers 120-1, 120-2, 120-3, 120-4, and 120-5, the semiconductor layers 130-1, 130-2, 130-3, and 130-4, as well as the dielectric layer 182, exposed by the opening 192r, may be removed. A plurality of openings 140r may be formed. Each of the openings 140r may penetrate the isolation layers 120-1, 120-2, 120-3, 120-4, and 120-5, the semiconductor layers 130-1, 130-2, 130-3, and 130-4, the dielectric layer 182, as well as the photoresist layer 192.

Figure 10A:
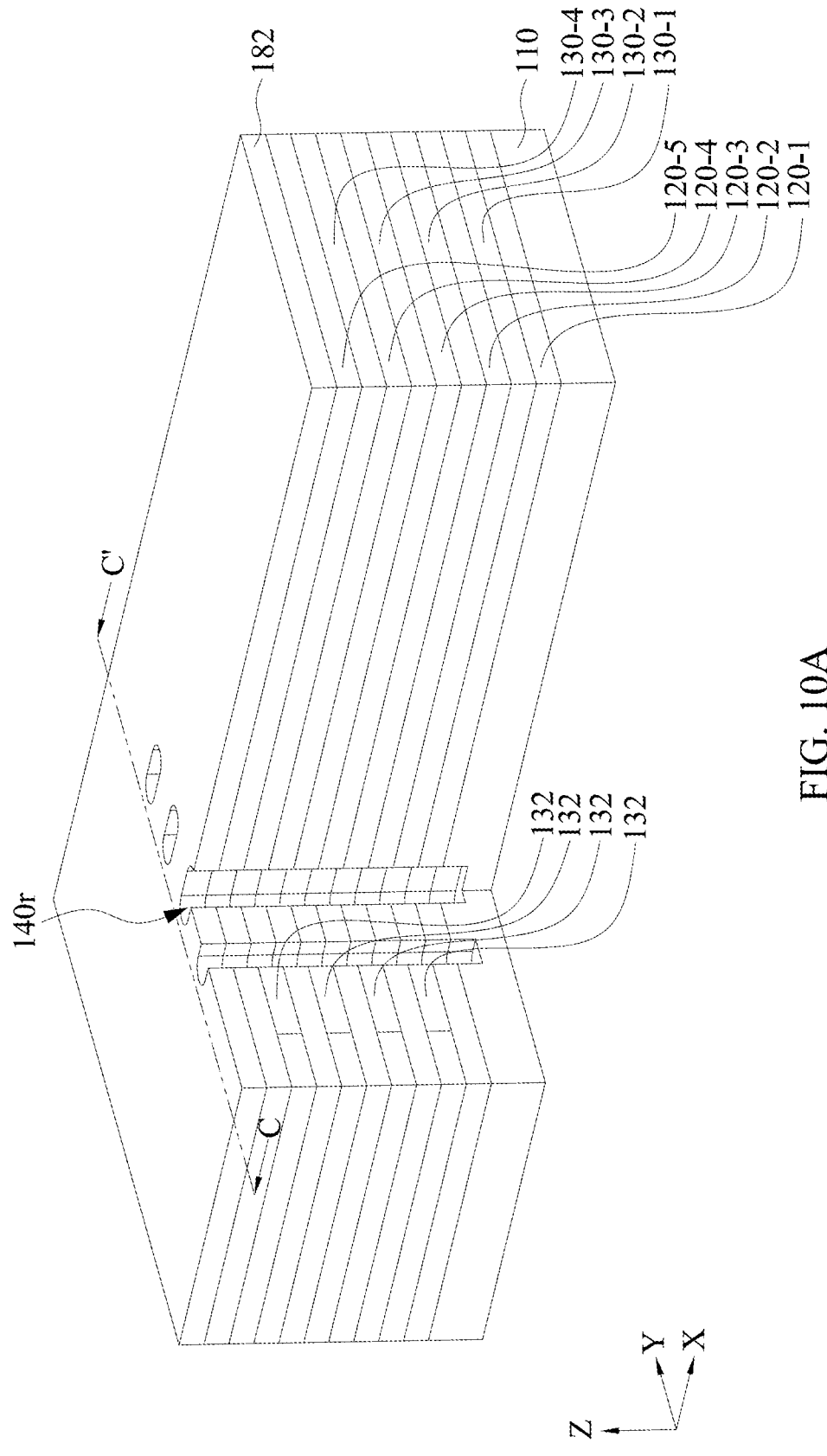
FIG. 10A and FIG. 10B illustrate one or more stages of an exemplary method for manufacturing a semiconductor device according to some embodiments of the present disclosure.
Figure 10B:
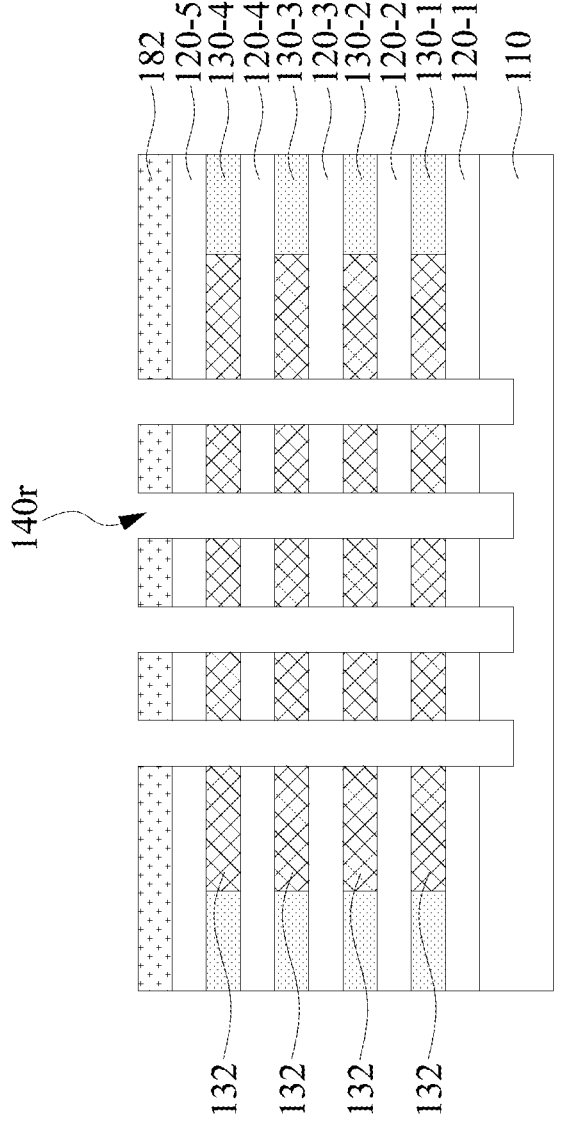
Figure 10B:
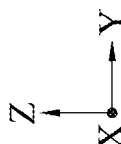

Referring to FIG. 10A and FIG. 10B, the photoresist layer 192 may be removed.

Figure 11A:
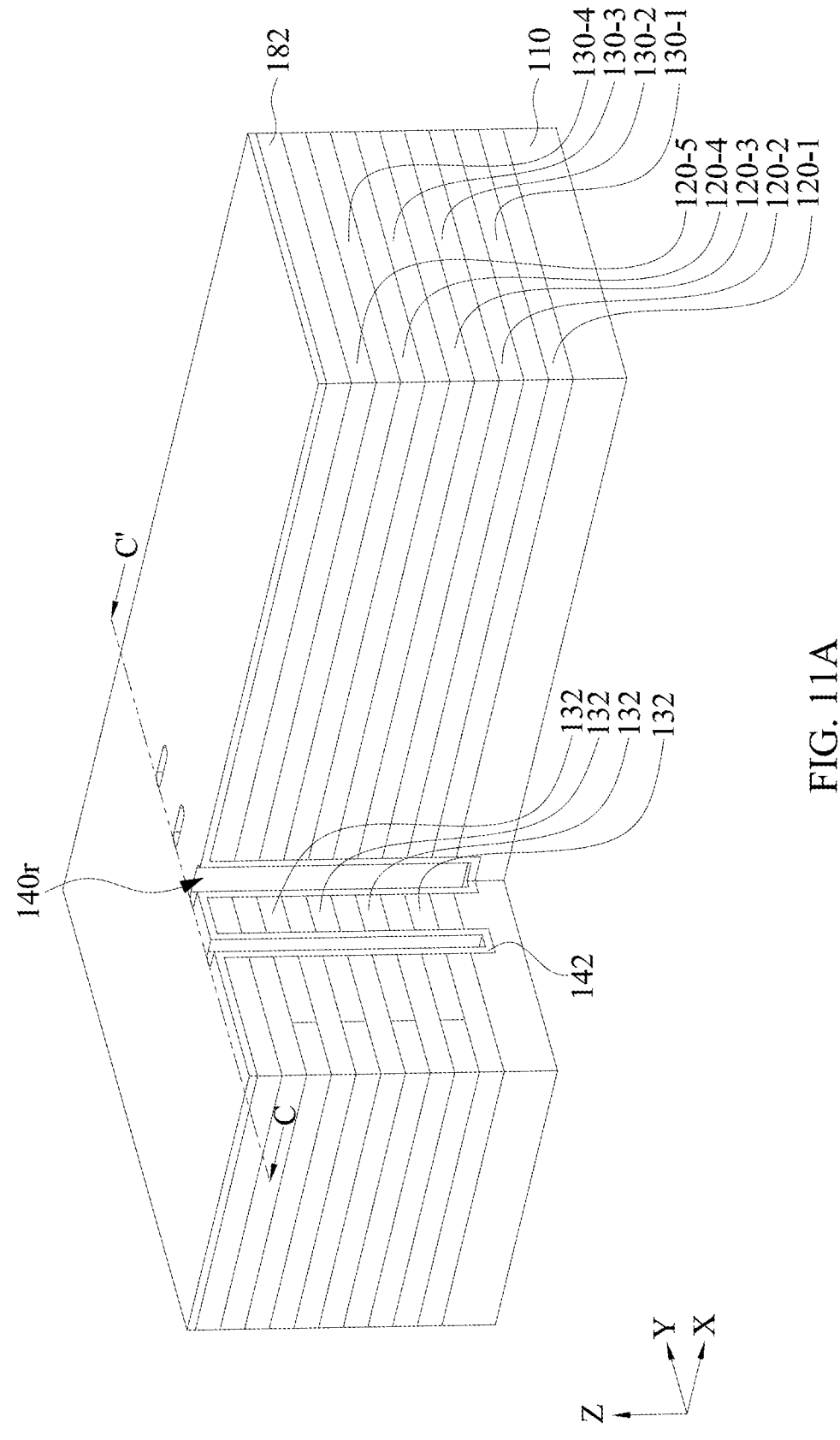
FIG. 11A and FIG. 11B illustrate one or more stages of an exemplary method for manufacturing a semiconductor device according to some embodiments of the present disclosure.
Figure 11B:
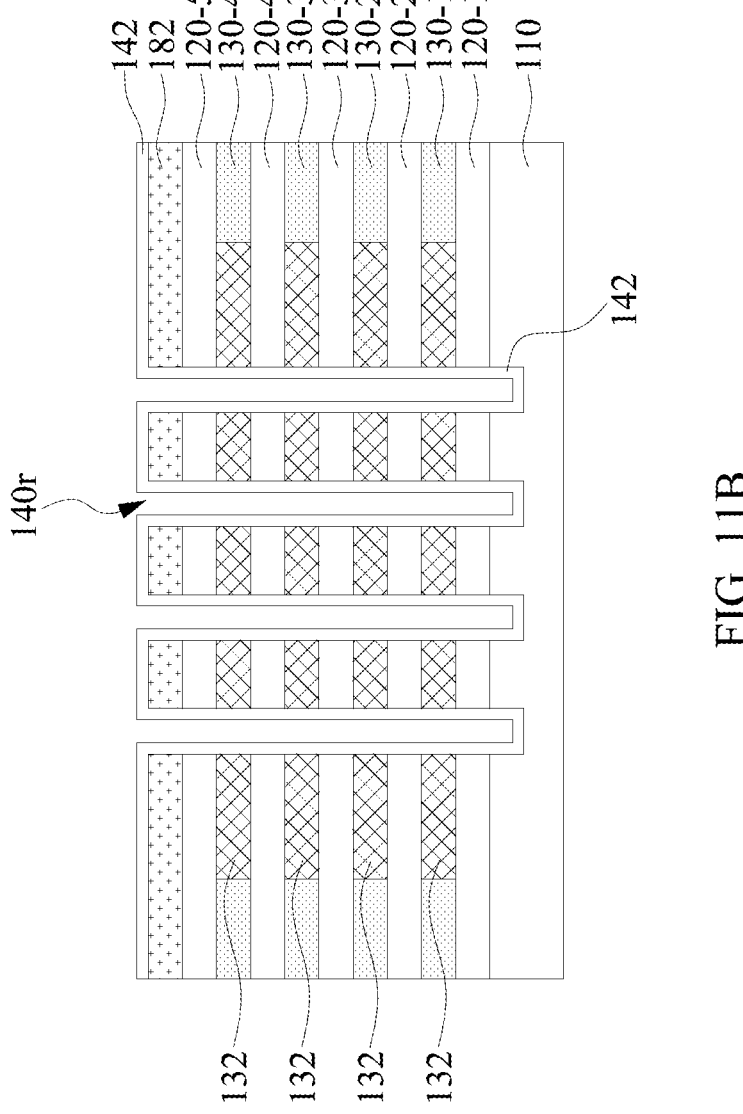

Referring to FIG. 11A and FIG. 11B, a gate dielectric 162 may be formed. In some embodiments, the gate dielectric 162 may be conformally formed within the openings 140r and over the dielectric layer 182. The gate dielectric 162 may be formed by, for example, ALD or other suitable processes.

Figure 12A:
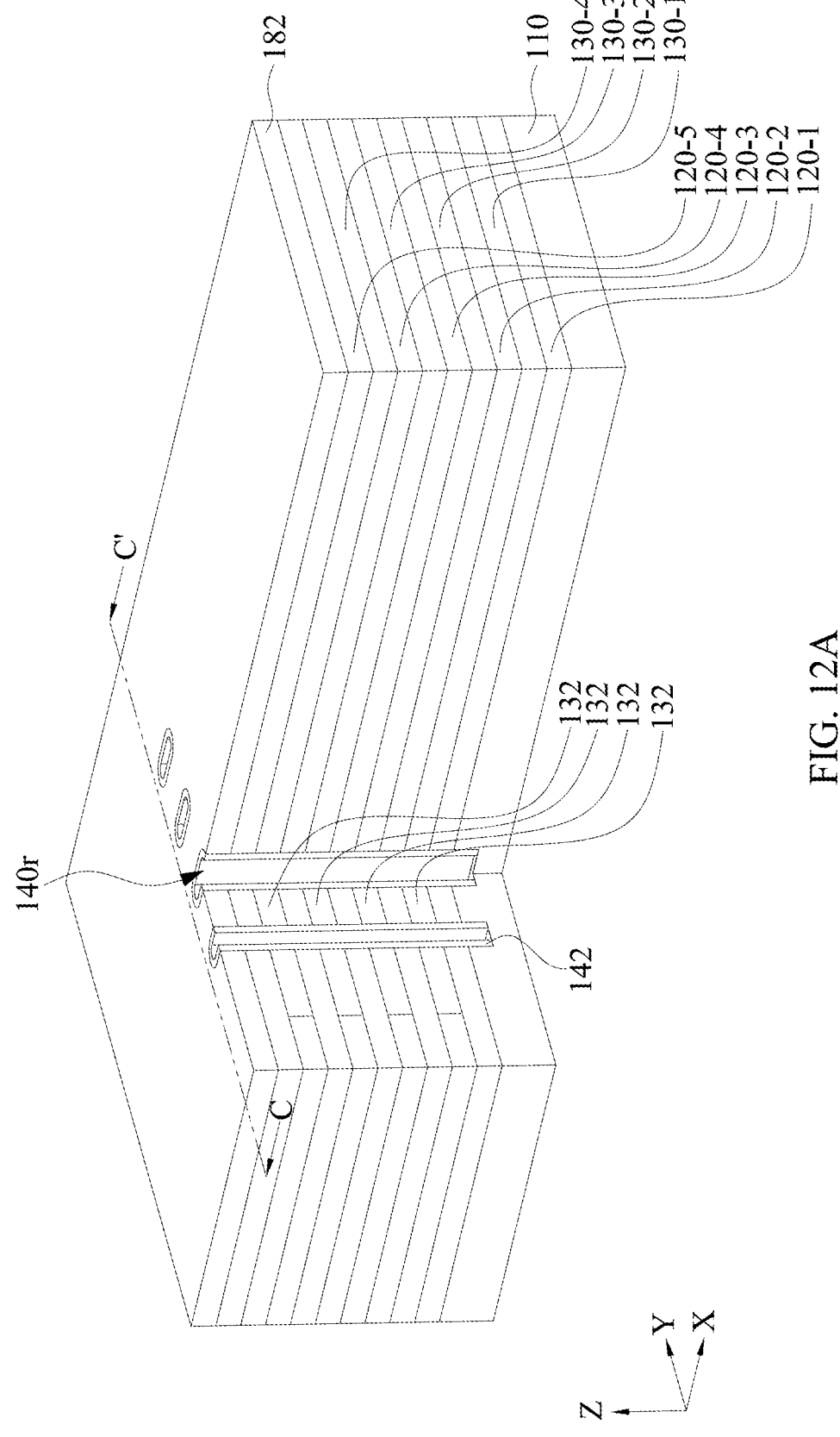
FIG. 12A and FIG. 12B illustrate one or more stages of an exemplary method for manufacturing a semiconductor device according to some embodiments of the present disclosure.
Figure 12B:
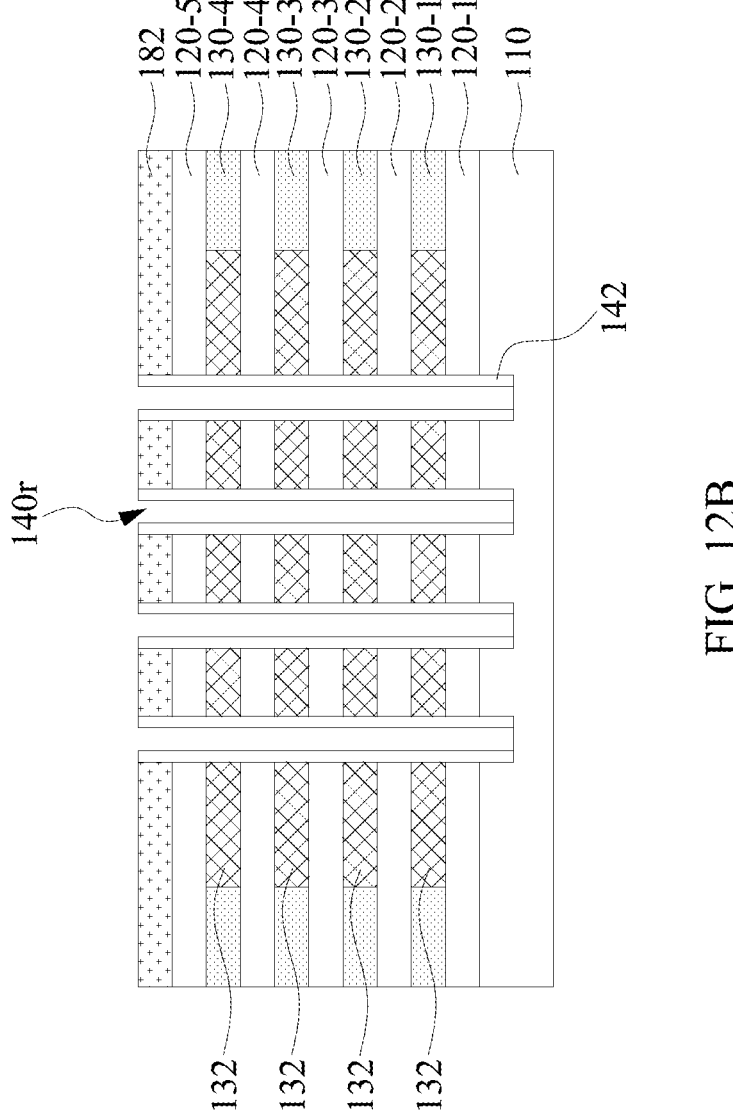
Figure 12B:
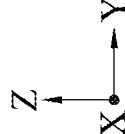

Referring to FIG. 12A and FIG. 12B, a portion of the gate dielectric 162 may be removed. The gate dielectric 162 over the dielectric layer 182 may be removed. The gate dielectric 162 disposed within the bottom of the openings 140r may be removed. The substrate 110 may be exposed from the openings 140r.

Figure 13A:
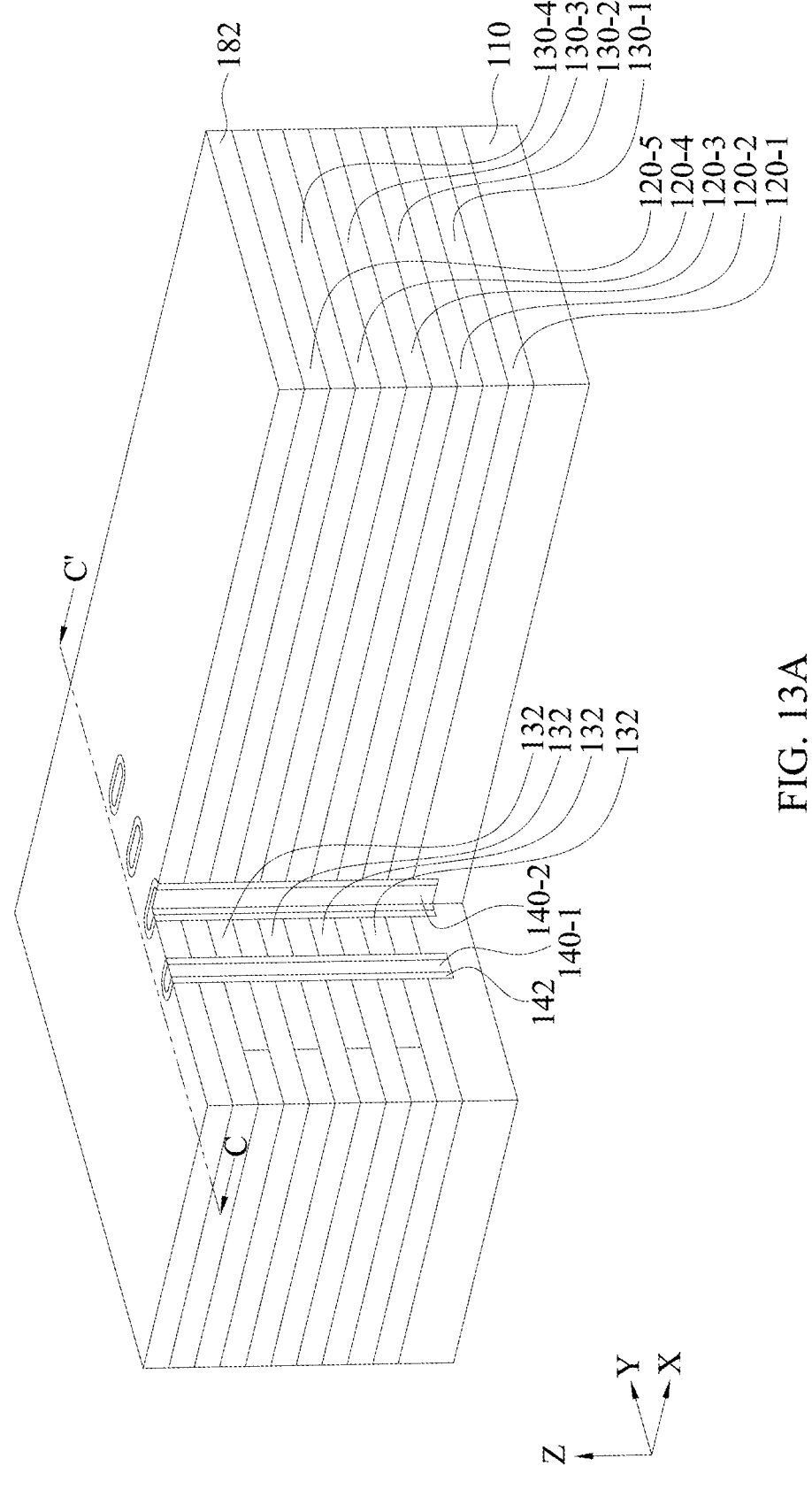
FIG. 13A and FIG. 13B illustrate one or more stages of an exemplary method for manufacturing a semiconductor device according to some embodiments of the present disclosure.
Figure 13B:
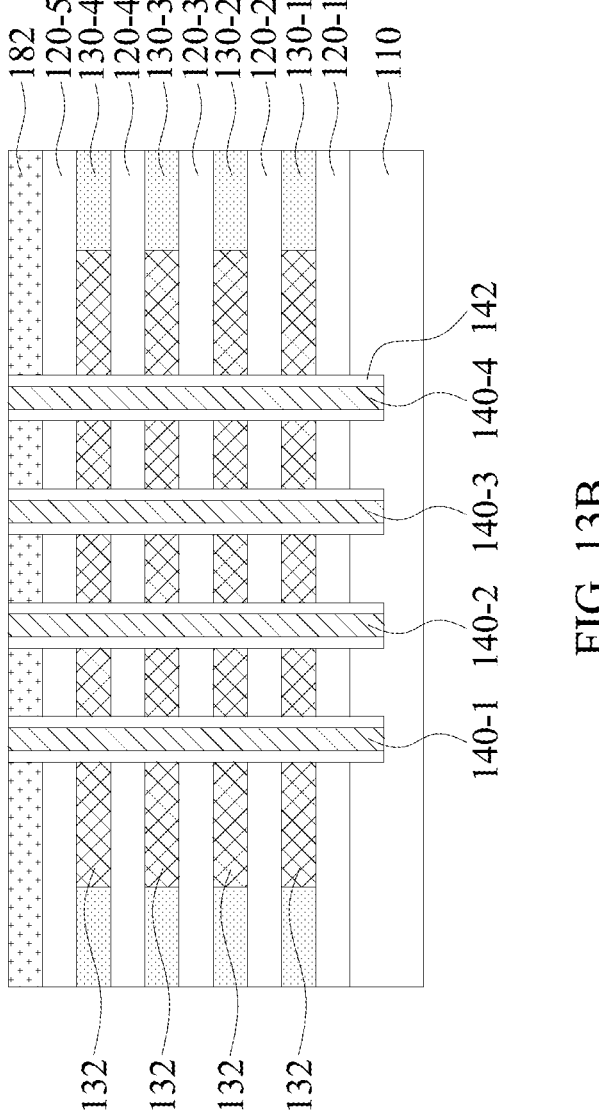

Referring to FIG. 13A and FIG. 13B, word lines 140-1, 140-2, 140-3, and 140-4 may be formed within the openings 140r. The word lines 140-1, 140-2, 140-3, and 140-4 may be formed by PVD, CVD, ALD, LPCVD, PECVD, or other suitable processes.

Figure 14A:
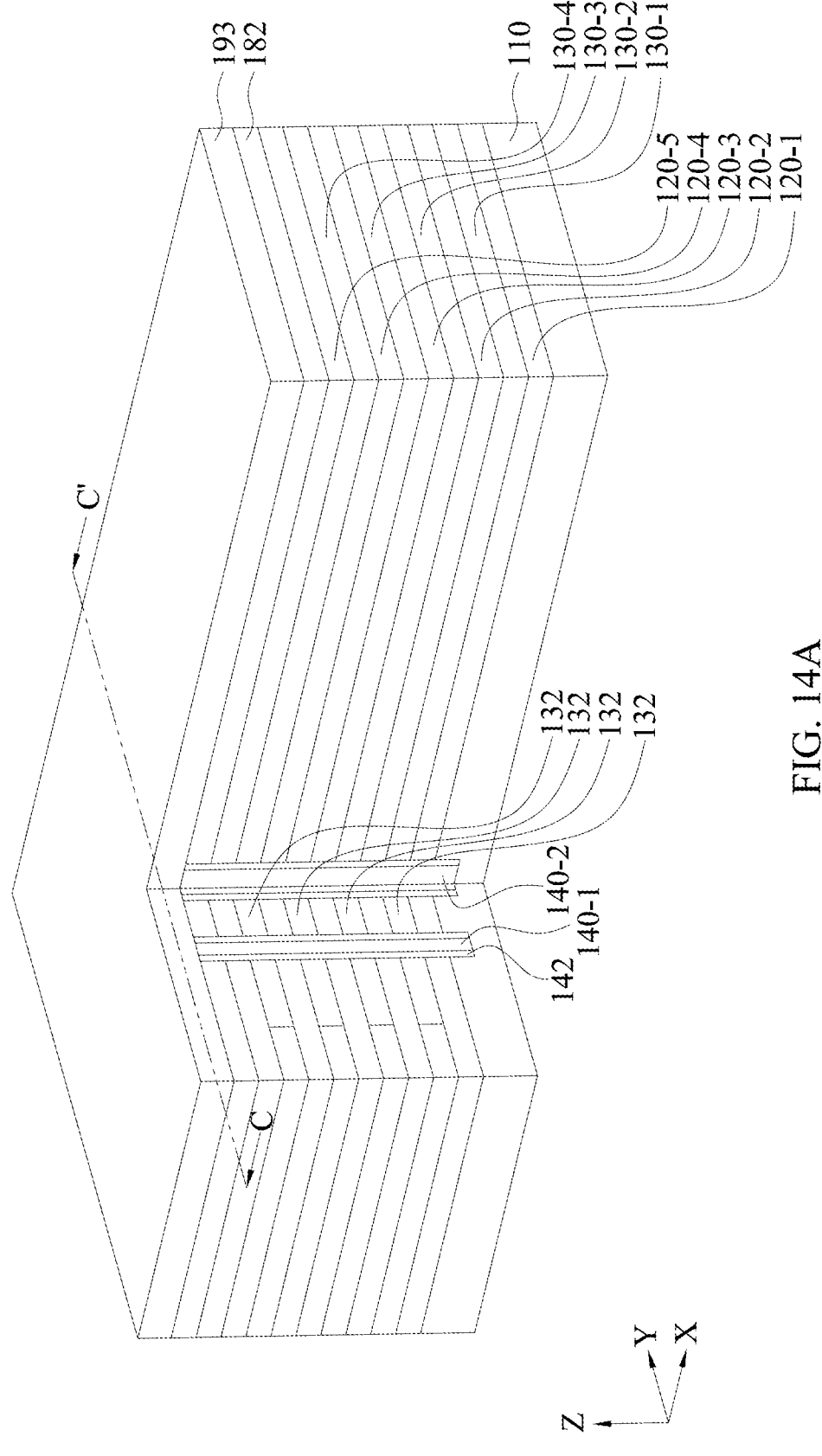

Referring to FIG. 14A and FIG. 14B, a photoresist layer 193 may be formed to cover the dielectric layer 182. The photoresist layer 193 may include a negative-tone photoresist or a positive-tone photoresist.

Figure 15A:
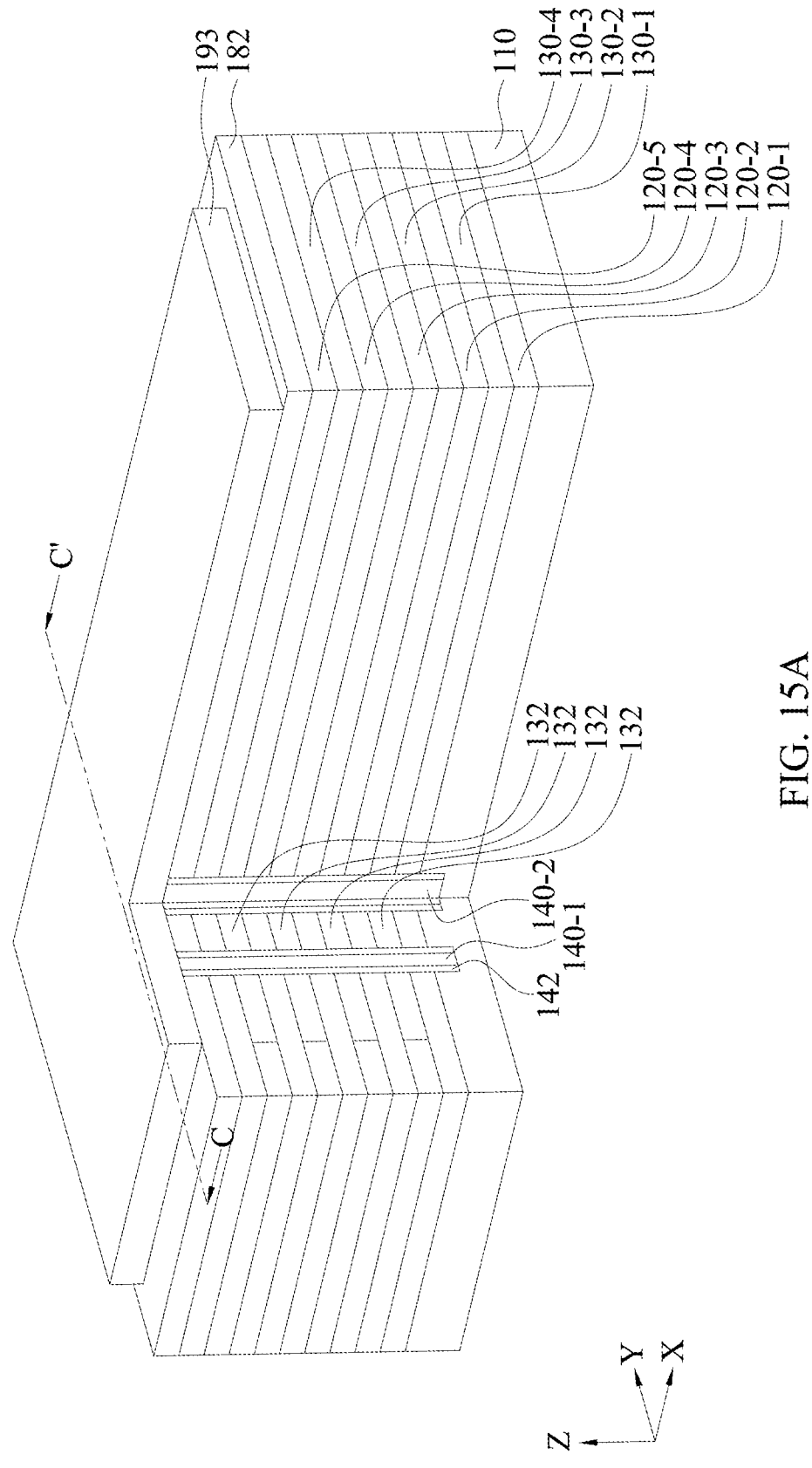
FIG. 15A and FIG. 15B illustrate one or more stages of an exemplary method for manufacturing a semiconductor device according to some embodiments of the present disclosure.
Figure 15B:
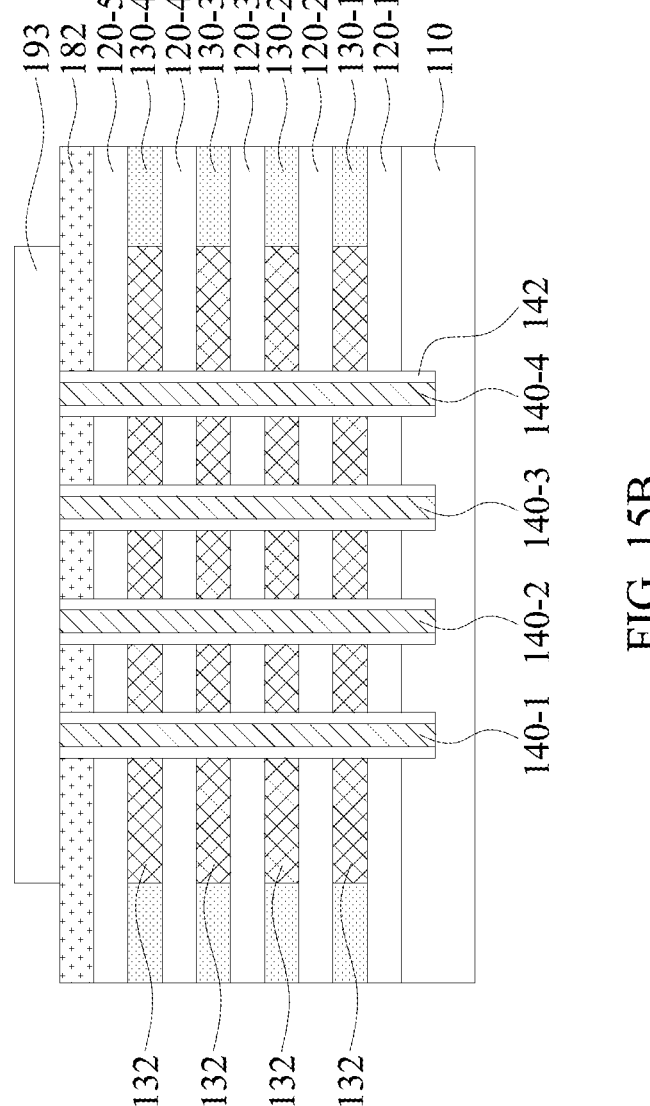

Referring to FIG. 15A and FIG. 15B, a portion of the photoresist layer 193 may be removed. The remaining photoresist layer 193 may define an array region (not annotated) of a memory device. A portion of the dielectric layer 182 may be exposed from the photoresist layer 193.

Figure 16A:
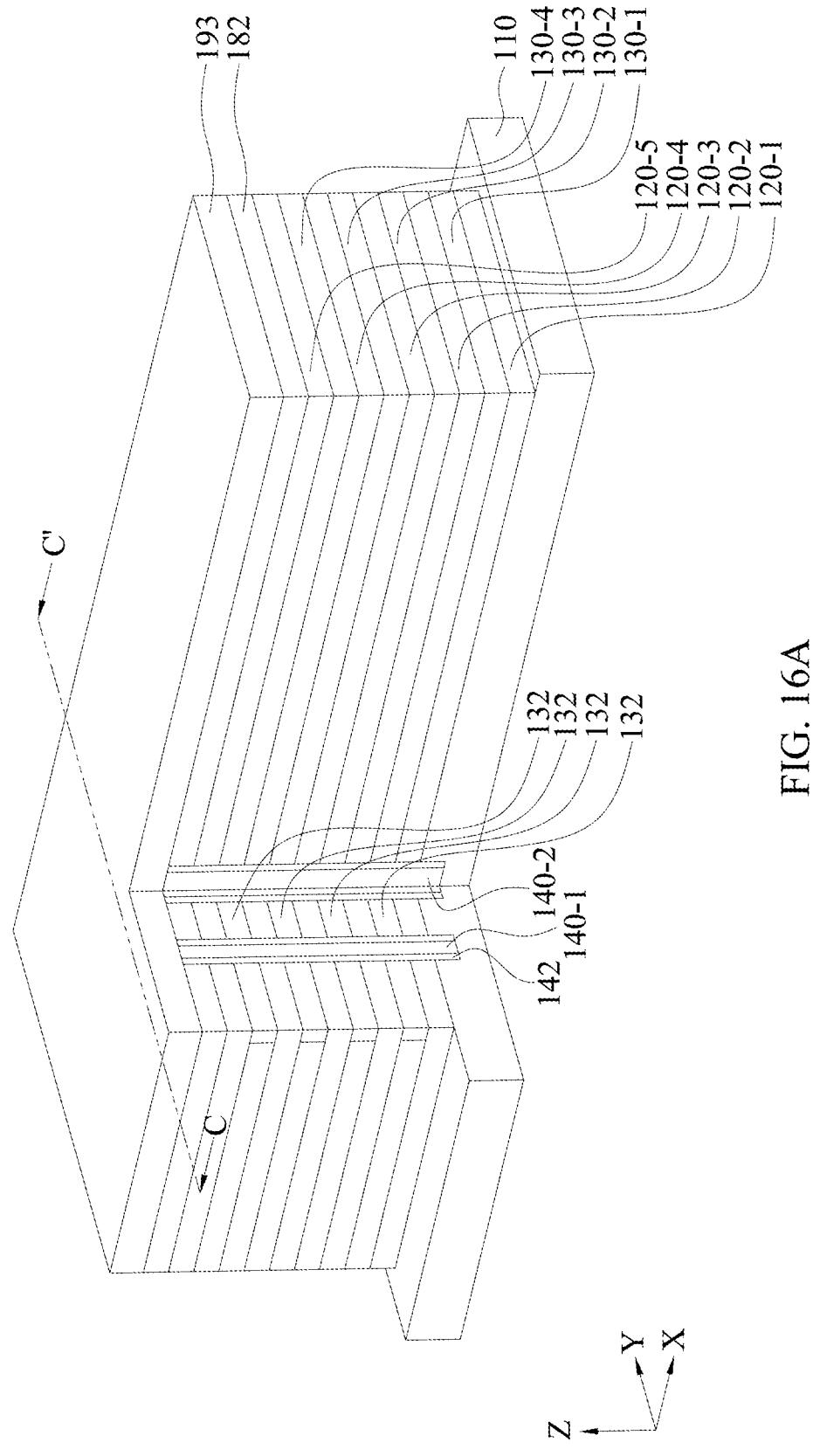

Referring to FIG. 16A and FIG. 16B, portions of the isolation layers 120-1, 120-2, 120-3, 120-4, and 120-5, portions of the semiconductor layers 130-1, 130-2, 130-3, and 130-4, as well as a portion of the dielectric layer 182, not covered by the photoresist layer 193, may be removed. Lateral surfaces of the isolation layers 120-1, 120-2, 120-3, 120-4, and 120-5 as well as the semiconductor layers 130-1, 130-2, 130-3, and 130-4 may be exposed.

Figure 17A:
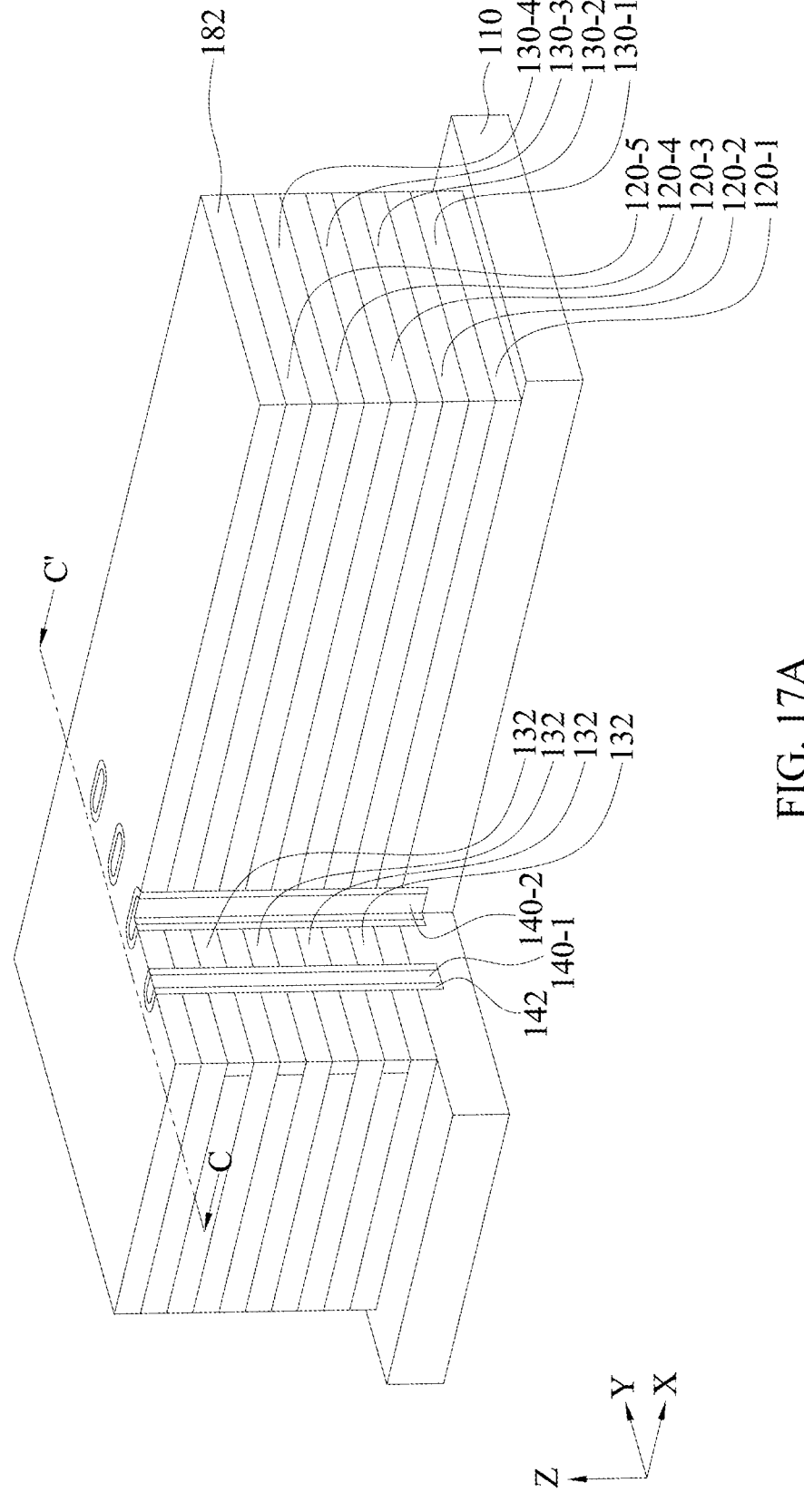
FIG. 17A and FIG. 17B illustrate one or more stages of an exemplary method for manufacturing a semiconductor device according to some embodiments of the present disclosure.
Figure 17B:
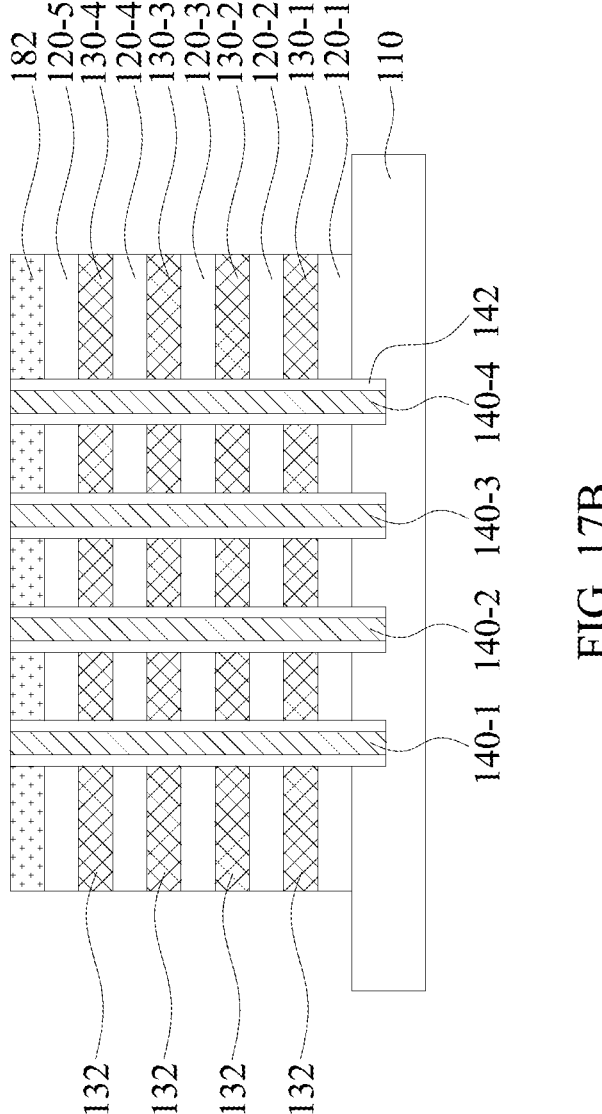

Referring to FIG. 17A and FIG. 17B, the photoresist layer 193 may be removed.

Figure 18A:
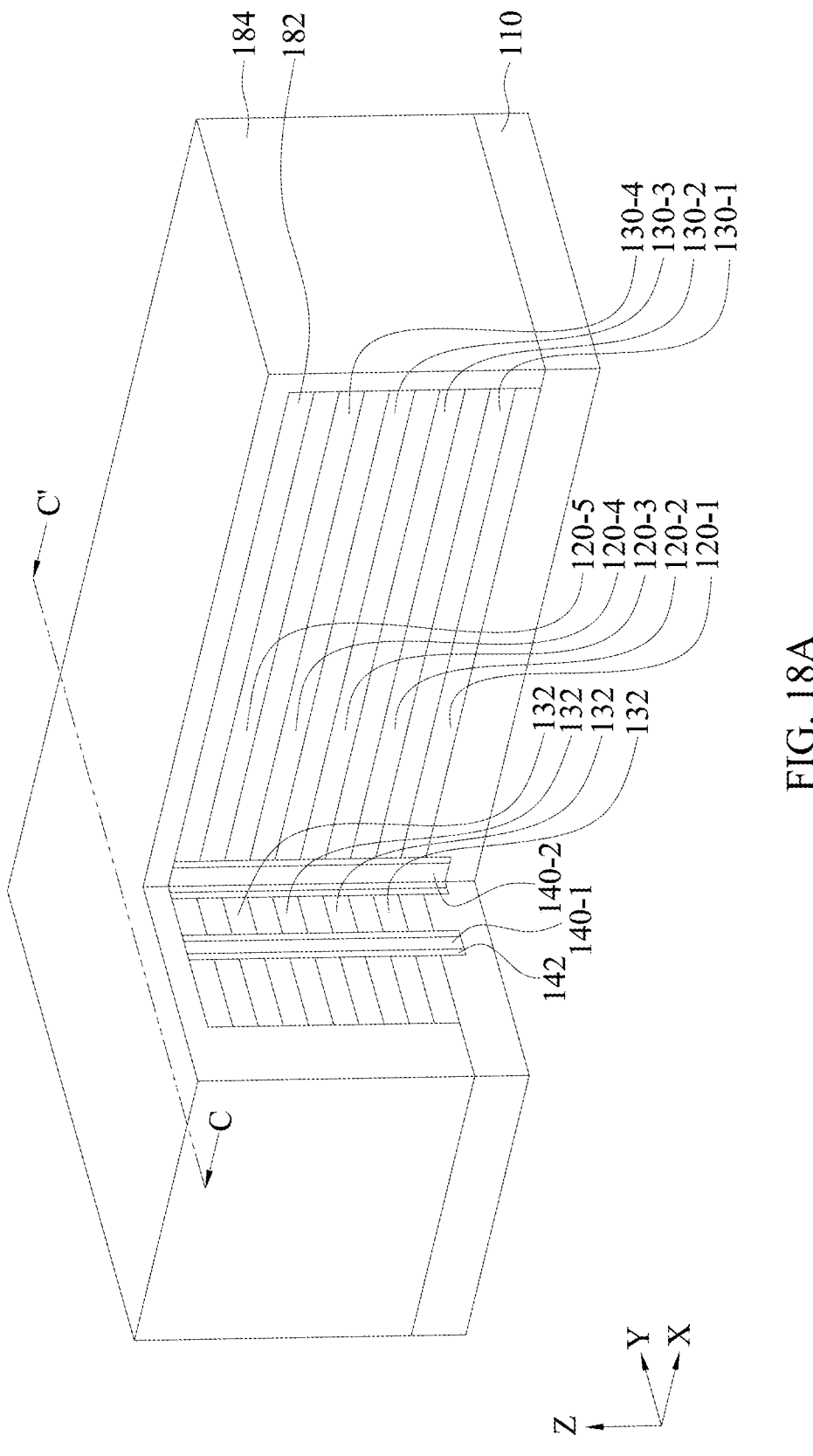

Referring to FIG. 18A and FIG. 18B, a dielectric layer 184 may be formed. The dielectric layer 184 may be formed on the substrate 110. The dielectric layer 184 may cover the dielectric layer 182. The dielectric layer 184 may cover the lateral surfaces of the isolation layers 120-1, 120-2, 120-3, 120-4, and 120-5, as well as the semiconductor layers 130-1, 130-2, 130-3, and 130-4. The dielectric layer 184 may include a dielectric material, such as silicon oxide. The dielectric layer 184 may be formed by CVD, PVD, ALD, LPCVD, PECVD, or other suitable processes.

Figure 19A:
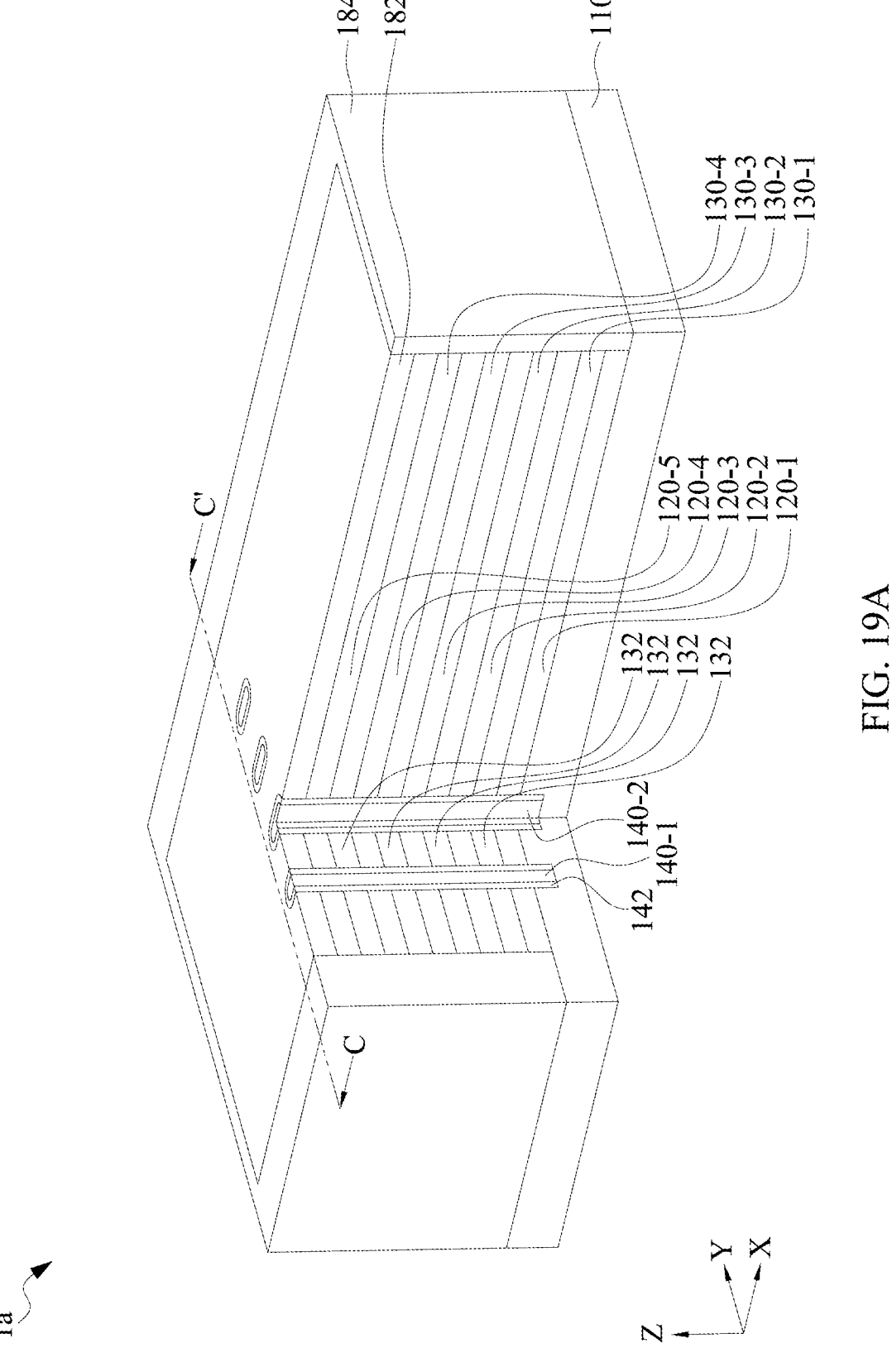
FIG. 19A and FIG. 19B illustrate one or more stages of an exemplary method for manufacturing a semiconductor device according to some embodiments of the present disclosure.
Figure 19B:
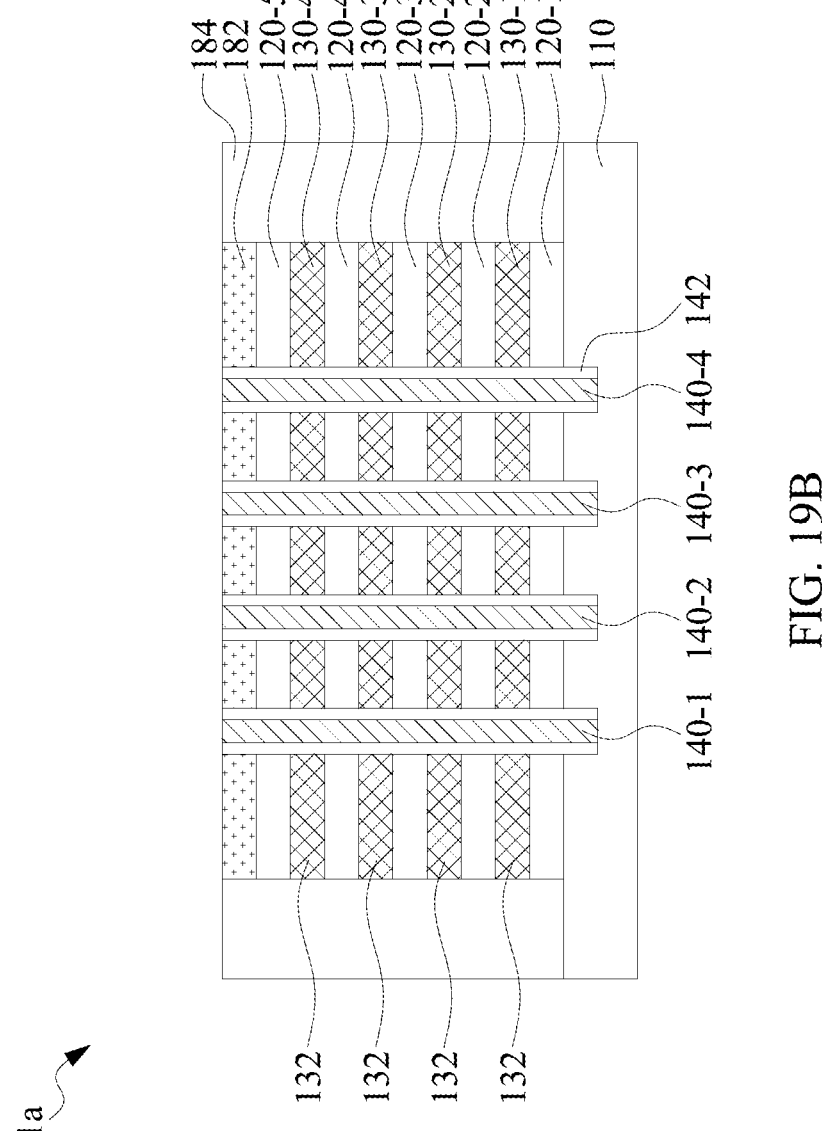

Referring to FIG. 19A and FIG. 19B, a grinding technique may be performed to remove a portion of the dielectric layer 184. The grinding technique may include a chemical mechanical polishing (CMP) technique. The upper surface of the dielectric layer 184 may be substantially coplanar with the upper surface of the dielectric layer 182. The upper surface of the dielectric layer 184 may be substantially coplanar with upper surfaces of the word lines 140-1, 140-2, 140-3, and 140-4. As a result, the semiconductor device 1a may be produced.

Figure 20A:
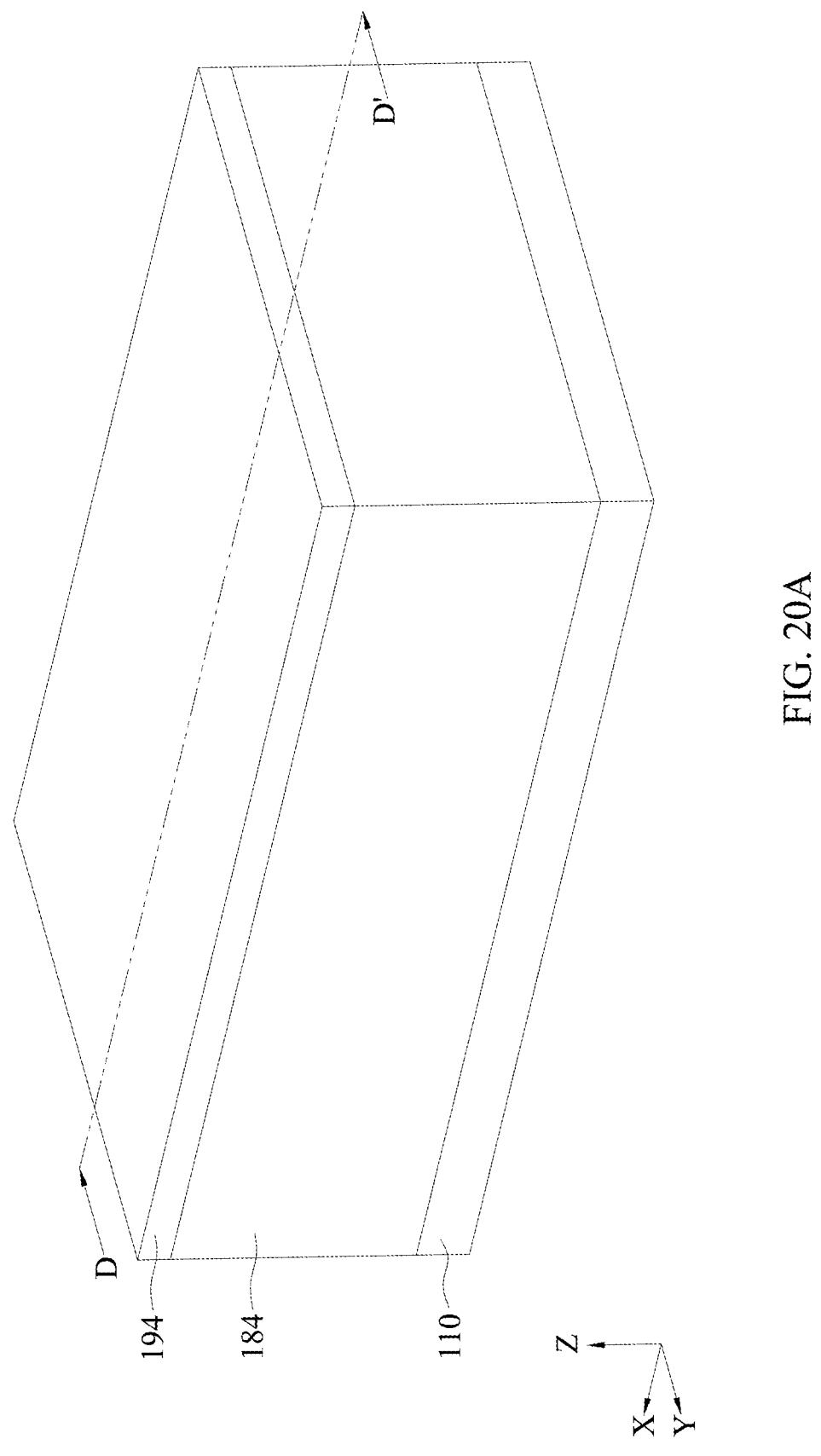
FIG. 20A and FIG. 20B illustrate one or more stages of an exemplary method for manufacturing a semiconductor device according to some embodiments of the present disclosure.

FIG. 20A to FIG. 25A illustrate one or more stages of an exemplary method for manufacturing a semiconductor device 1b according to some embodiments of the present disclosure. FIG. 20B to FIG. 25B are cross-sectional views along line D-D' of FIG. 20A to FIG. 25A, respectively. It should be noted that the angle of vision shown in FIG. 20A to FIG. 25A is rotated 180° along the Z direction from the angle of vision shown in FIG. 19. FIG. 20A depicts a stage subsequent to that depicted in FIG. 19A.

Figure 20B:
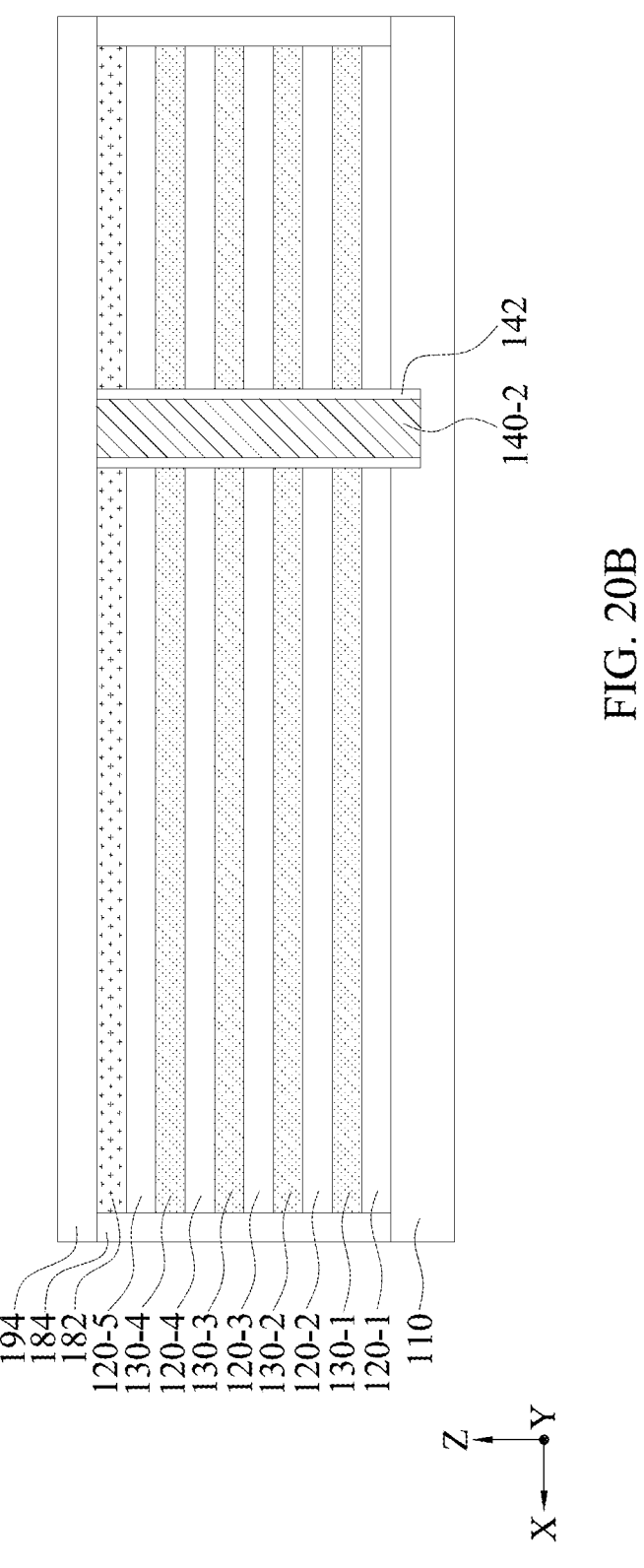

Referring to FIG. 20A and FIG. 20B, a photoresist layer 194 may be formed to cover the dielectric layer 184. The photoresist layer 194 may include a negative-tone photoresist or a positive-tone photoresist.

Figure 21A:
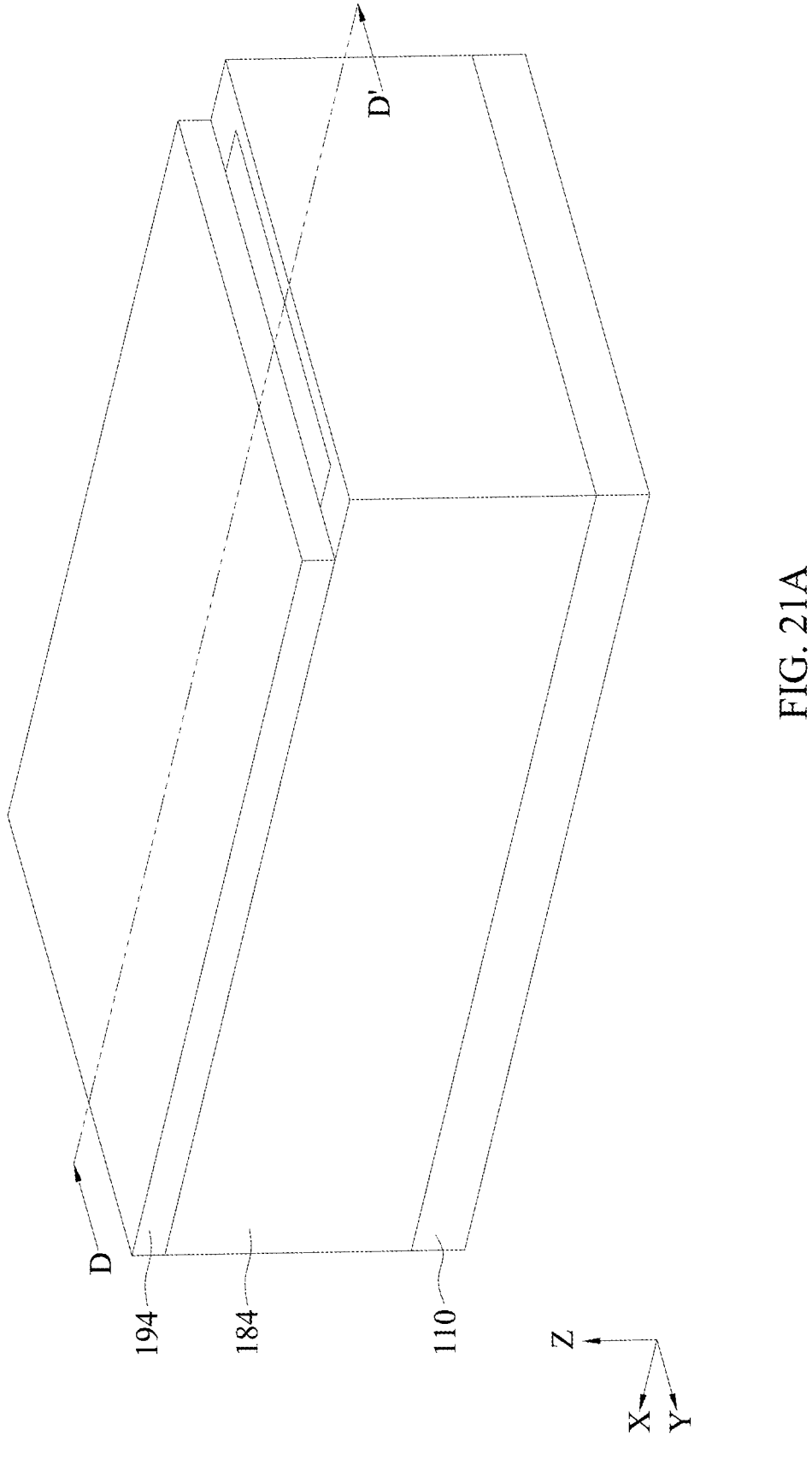
FIG. 21A and FIG. 21B illustrate one or more stages of an exemplary method for manufacturing a semiconductor device according to some embodiments of the present disclosure.
Figure 21B:
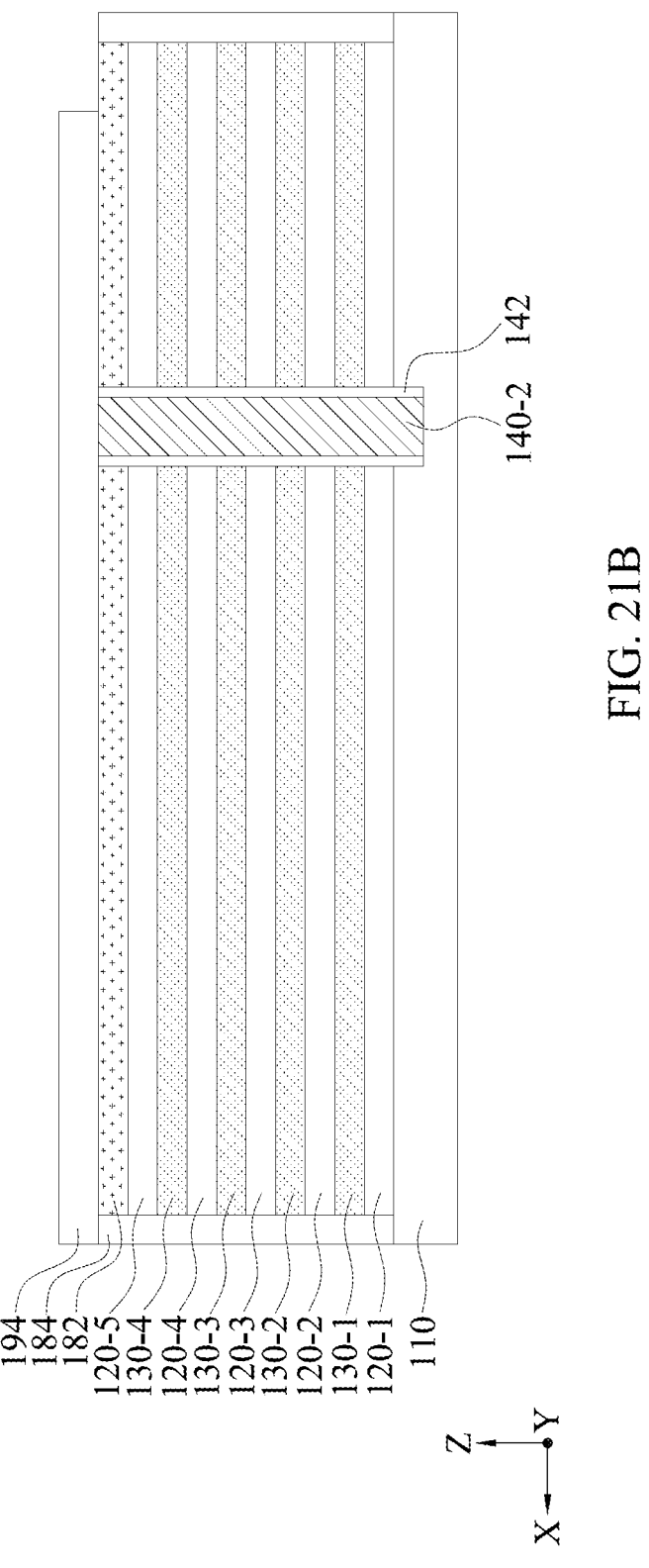

Referring to FIG. 21A and FIG. 21B, a stair etching technique may be performed. In some embodiments, a reactive ion etching (RIE) technique may be performed. A portion of the photoresist layer 194 may be removed. A portion of the dielectric layer 184 may be exposed. A portion of the dielectric layer 182 may be exposed from the photoresist layer 194.

Figure 22A:
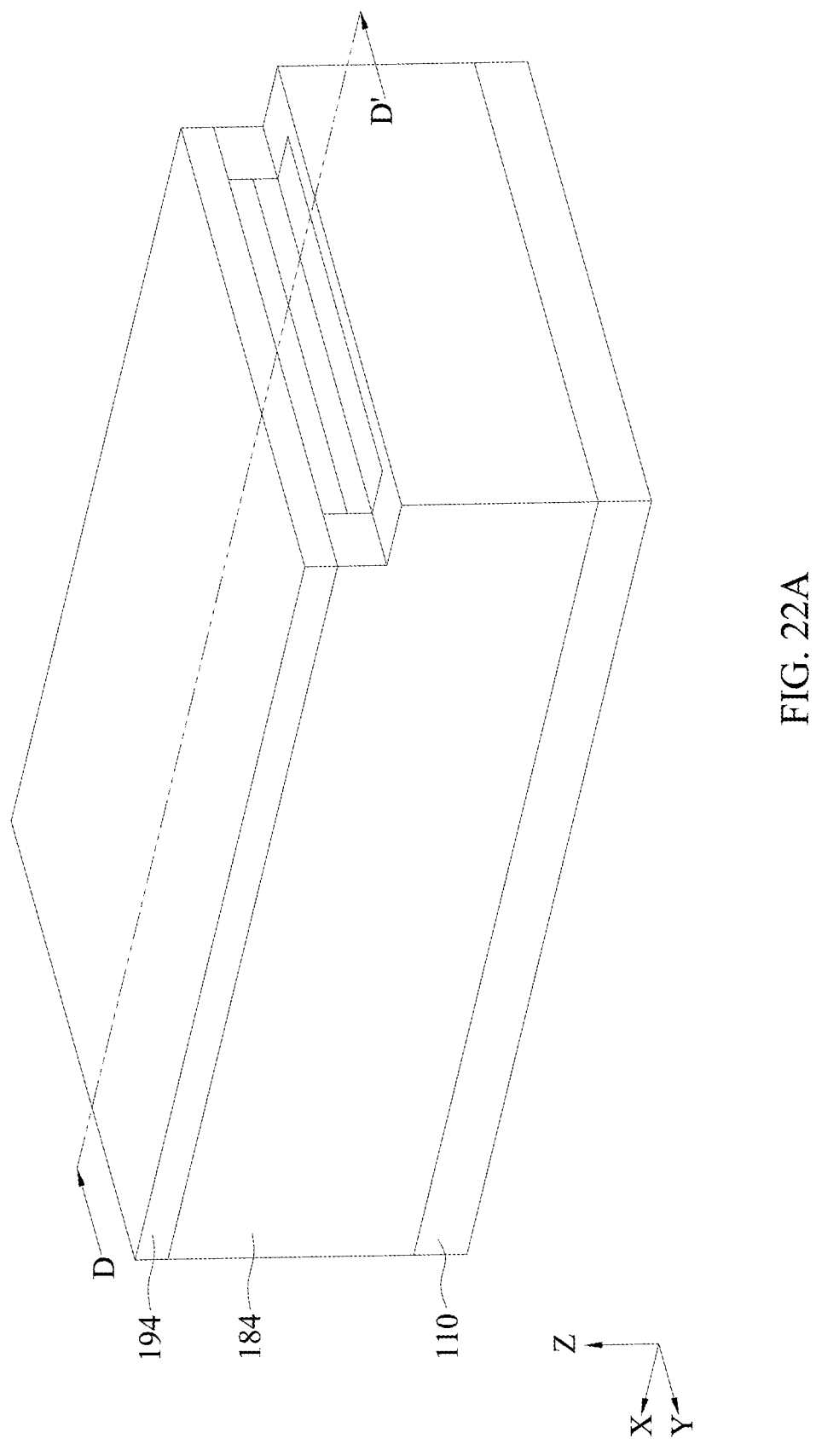
FIG. 22A and FIG. 22B illustrate one or more stages of an exemplary method for manufacturing a semiconductor device according to some embodiments of the present disclosure.
Figure 22B:
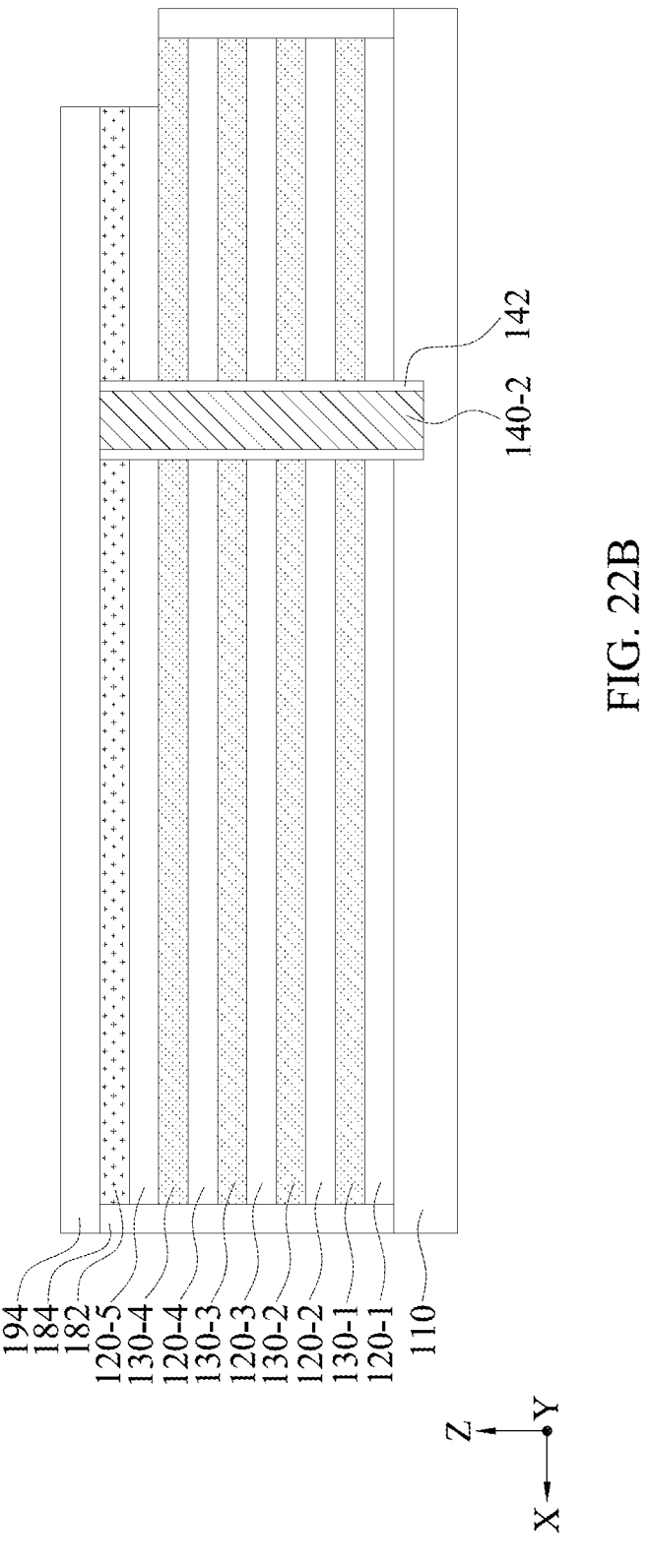

Referring to FIG. 22A and FIG. 22B, a portion of the dielectric layer 182 may be removed. A portion of the dielectric layer 184 may be removed. A portion of the isolation layer 120-5 may be removed. A portion of the semiconductor layer 130-4 may be exposed from the isolation layer 120-5.

Figure 23A:
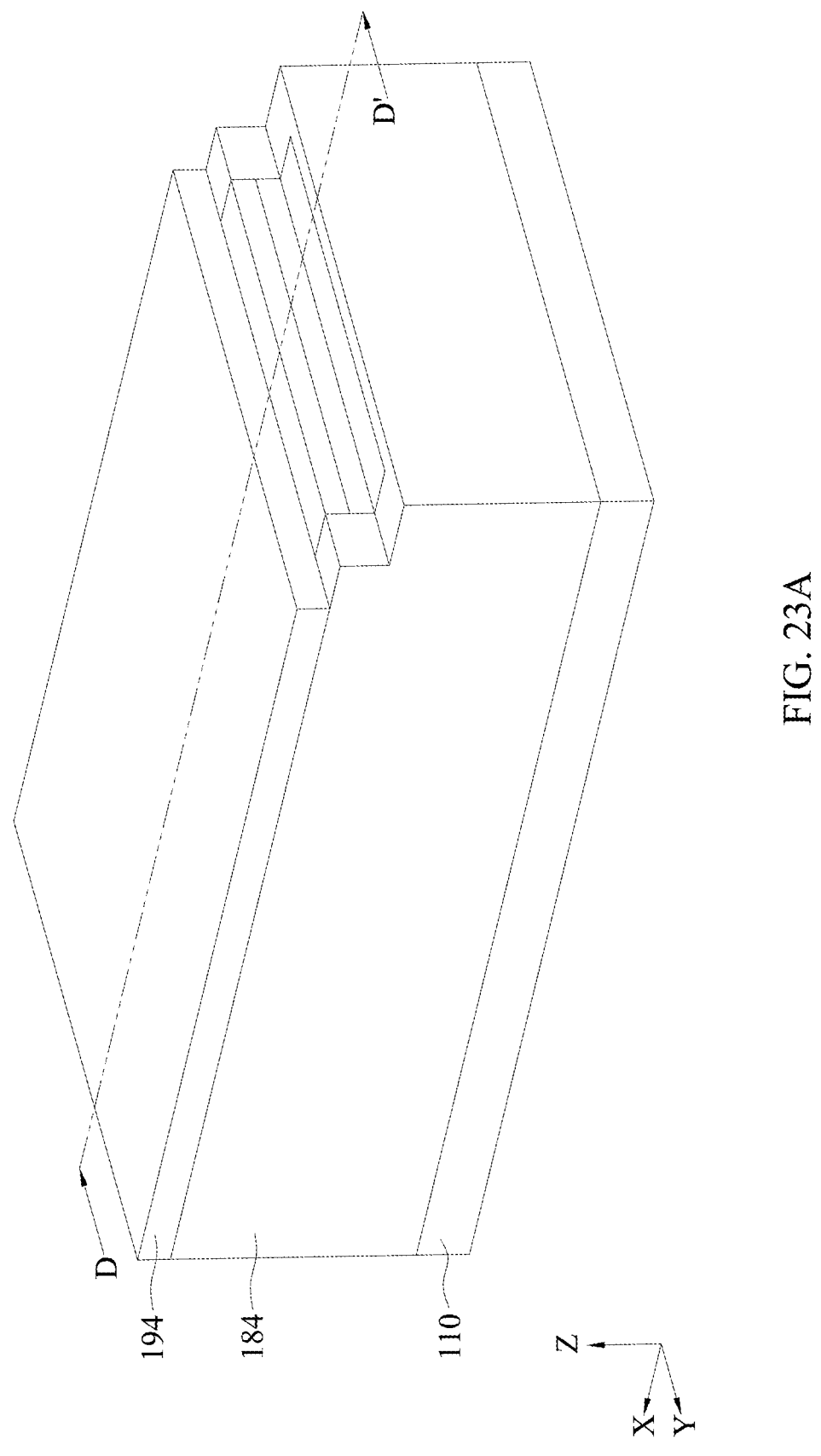
FIG. 23A and FIG. 23B illustrate one or more stages of an exemplary method for manufacturing a semiconductor device according to some embodiments of the present disclosure.
Figure 23B:
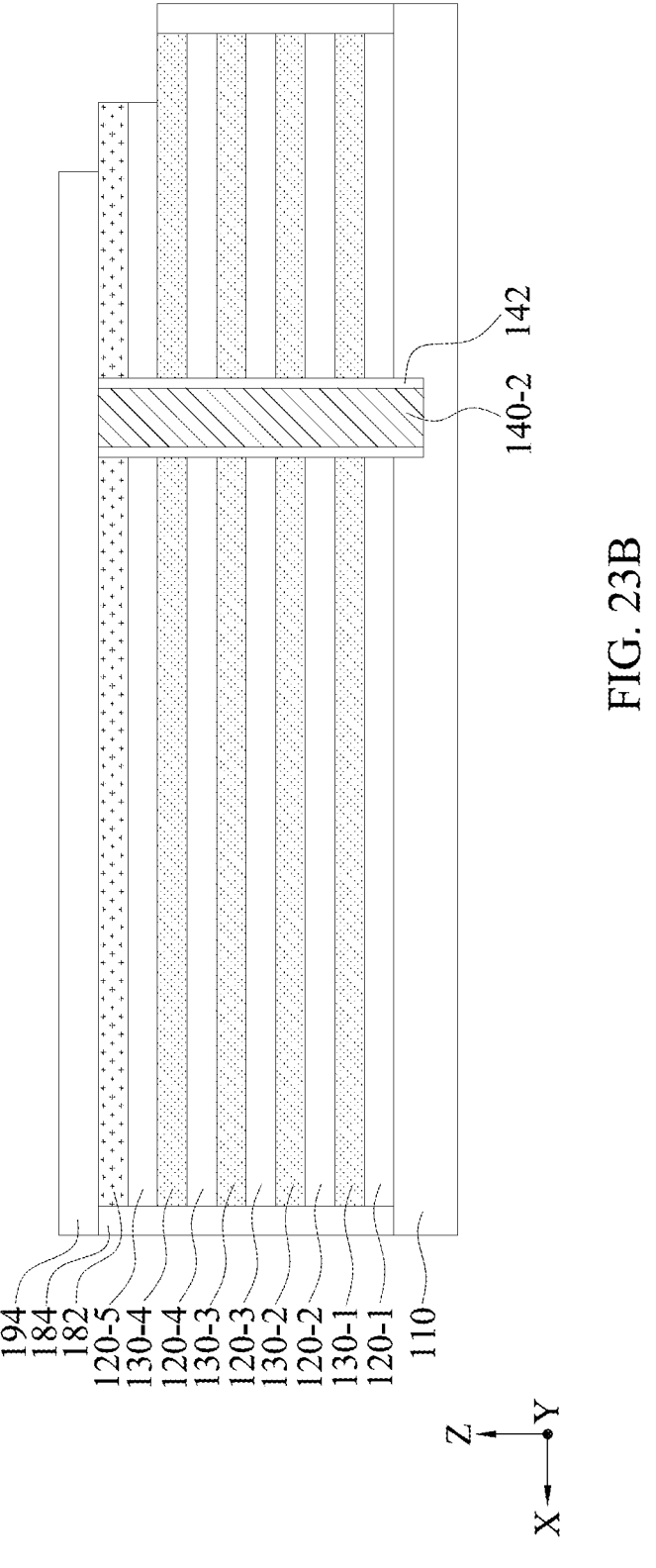

Referring to FIG. 23A and FIG. 23B, a portion of the photoresist layer 194 may be removed. A portion of the dielectric layer 182 may be exposed from the photoresist layer 194. A portion of the isolation layer 120-5 may be exposed from the photoresist layer 194.

Figure 24A:
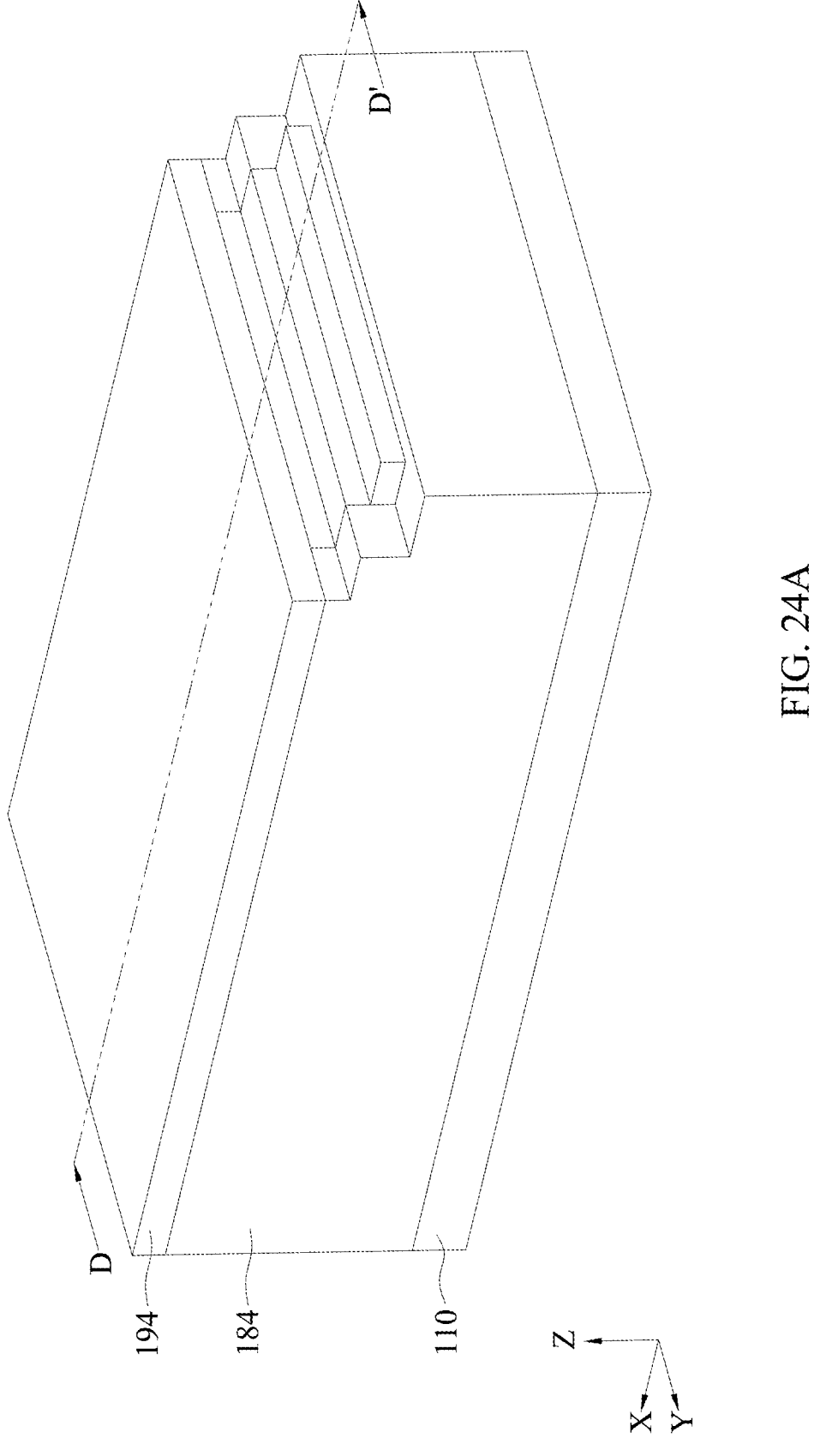
FIG. 24A and FIG. 24B illustrate one or more stages of an exemplary method for manufacturing a semiconductor device according to some embodiments of the present disclosure.
Figure 24B:
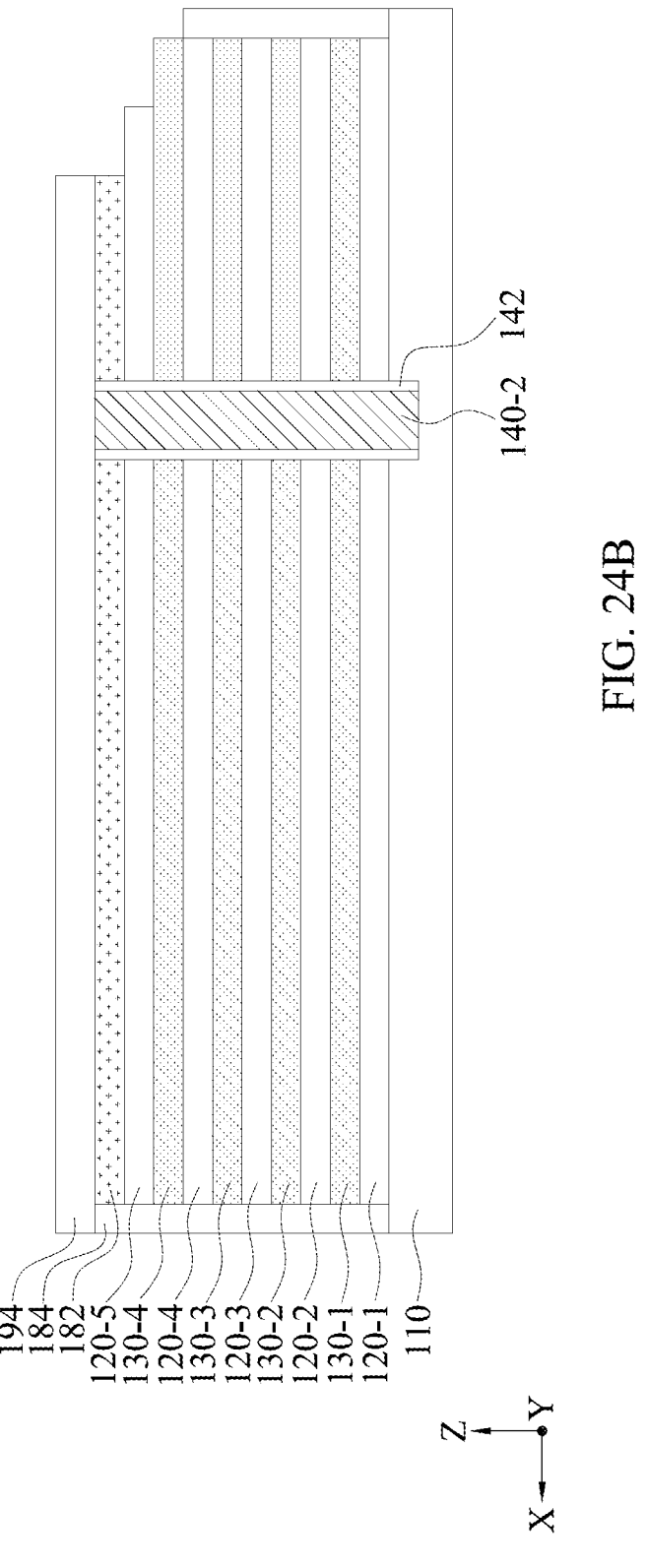

Referring to FIG. 24A and FIG. 24B, a portion of the dielectric layer 182 may be removed. A portion of the dielectric layer 184 may be removed. A portion of the isolation layer 120-5 may be exposed from the dielectric layer 182.

Figure 25A:
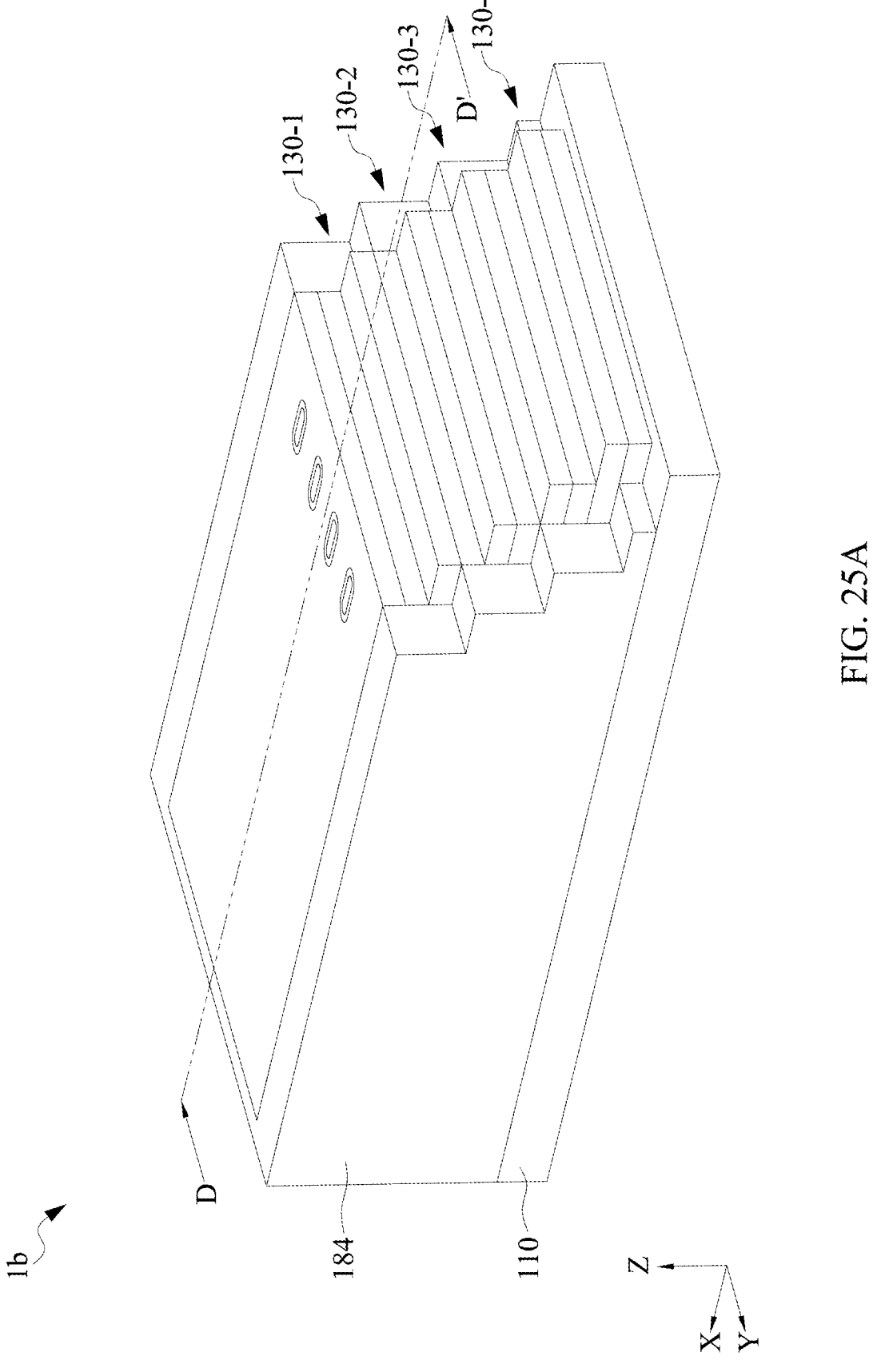
FIG. 25A and FIG. 25B illustrate one or more stages of an exemplary method for manufacturing a semiconductor device according to some embodiments of the present disclosure.
Figure 25B:
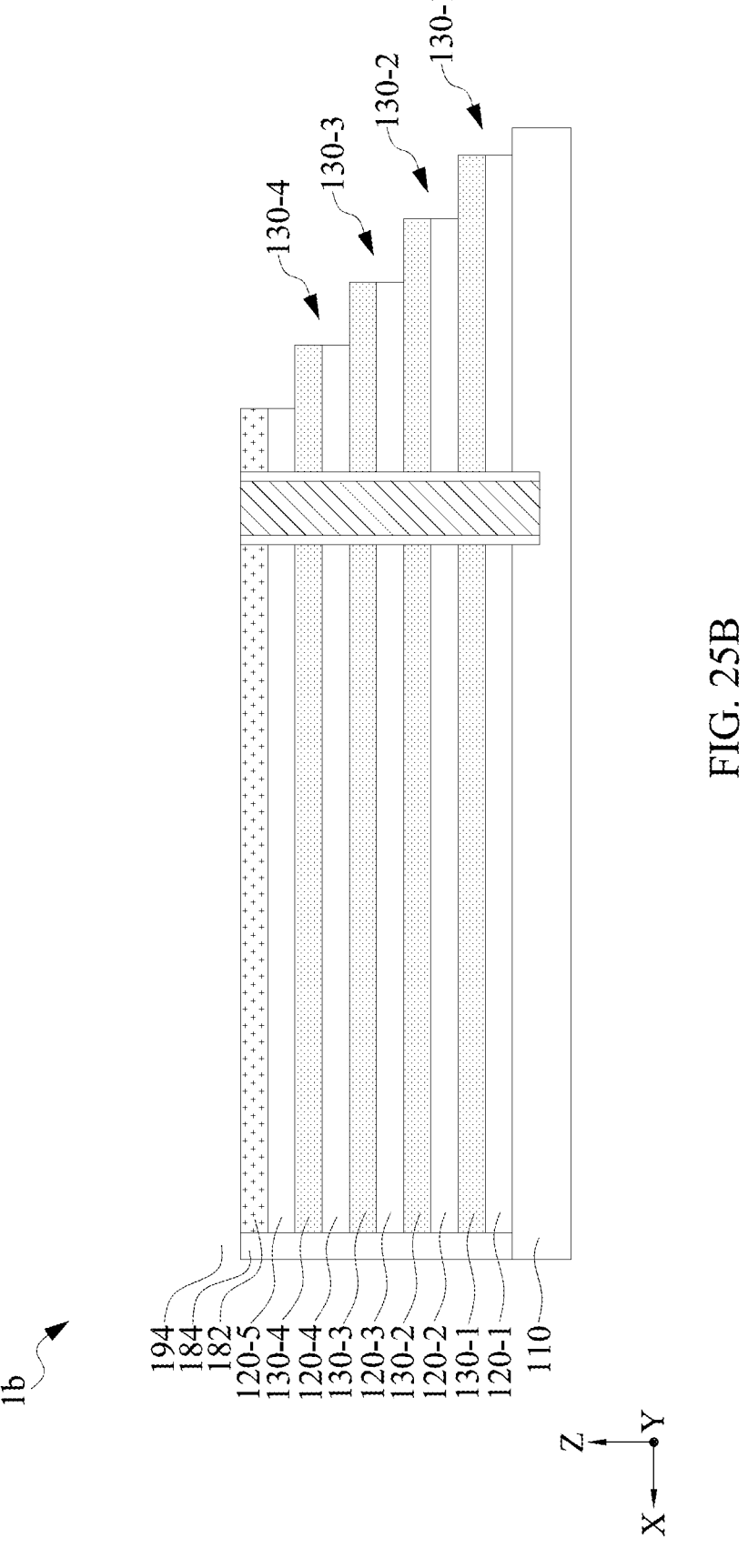

Referring to FIG. 25A and FIG. 25B, the stages shown in FIG. 20A to FIG. 24A may be repeated to form a plurality of stepped structures (not annotated) shown in FIG. 25A and FIG. 25B. The stepped structures may be defined by the semiconductor layers 130-1, 130-2, 130-3, 130-4 and/or the isolation layers 120-1, 120-2, 120-3, 120-4, and 120-5. A portion of the semiconductor layer 130-1 may be exposed from the semiconductor layer 130-2. A portion of the semiconductor layer 130-2 may be exposed from the semiconductor layer 130-3. A portion of the semiconductor layer 130-3 may be exposed from the semiconductor layer 130-4. A portion of the semiconductor layer 130-4 may be exposed from the isolation layer 120-5. The photoresist layer 194 may be removed. A semiconductor device 1b may be produced.

Figure 26A:
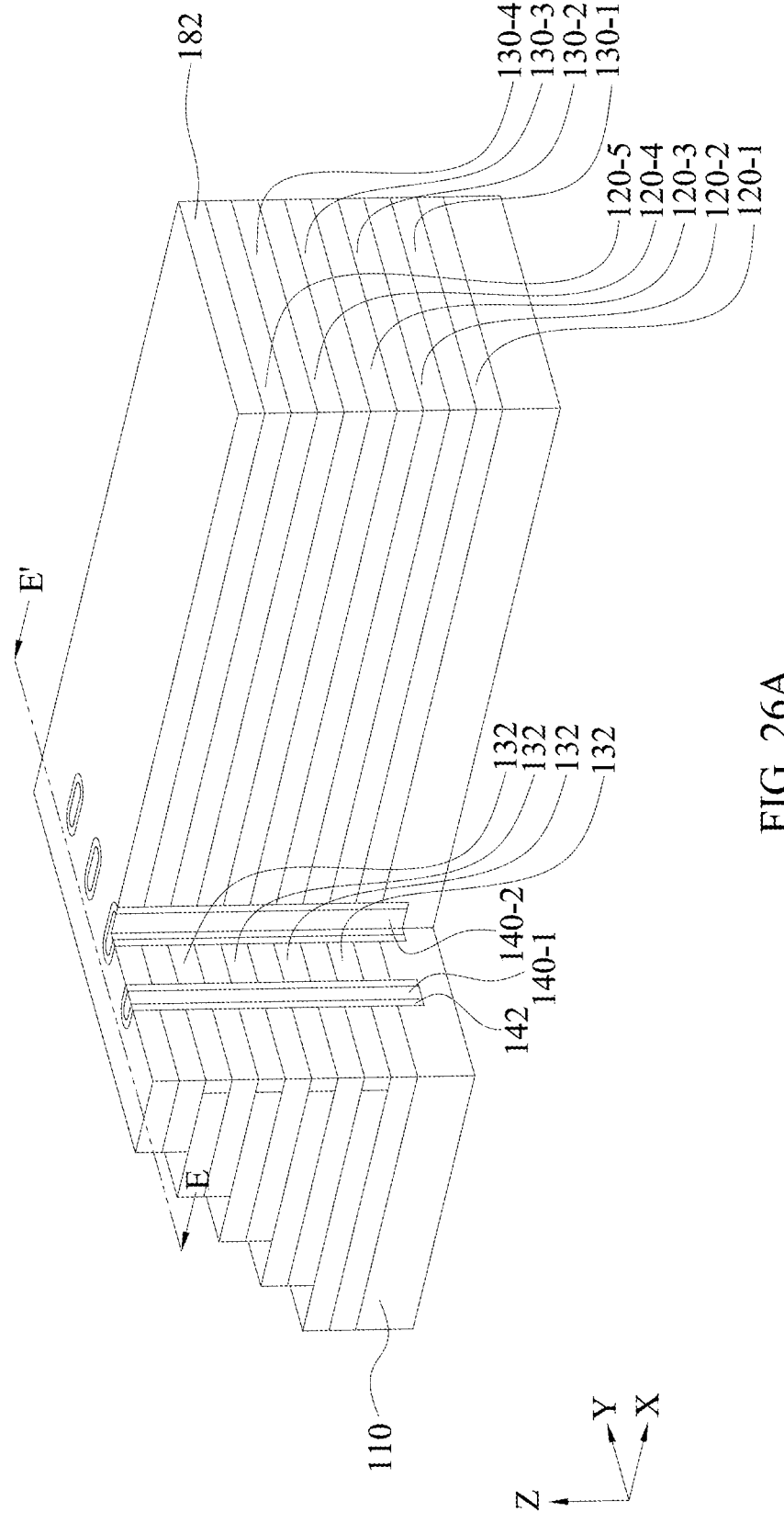
FIG. 26A and FIG. 26B illustrate one or more stages of an exemplary method for manufacturing a semiconductor device according to some embodiments of the present disclosure.

FIG. 26A to FIG. 29A illustrate one or more stages of an exemplary method for manufacturing a semiconductor device 1c according to some embodiments of the present disclosure. FIG. 26B to FIG. 29B are cross-sectional views along line E-E' of FIG. 26A to FIG. 29A, respectively. It should be noted that the angle of vision shown in FIG. 26A to FIG. 29A is rotated 180° along the Z direction from the angle of vision shown in FIG. 25. FIG. 26A depicts a stage subsequent to that depicted in FIG. 25A.

Figure 26B:
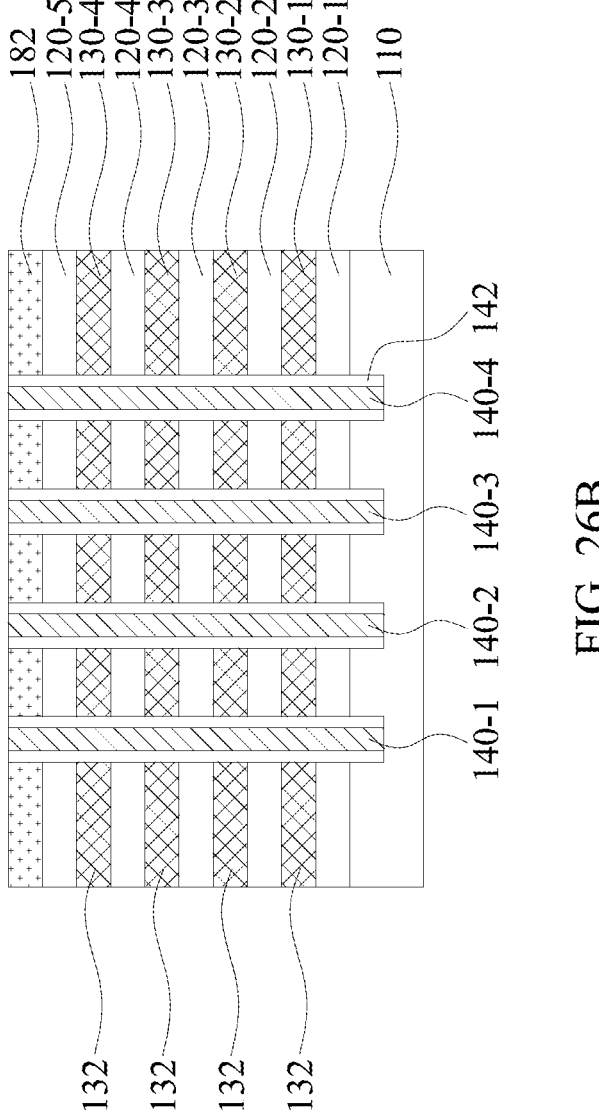

Referring to FIG. 26A and FIG. 26B, the dielectric layer 184 may be removed. The lateral surface of the dielectric layer 182 may be exposed.

Figure 27A:
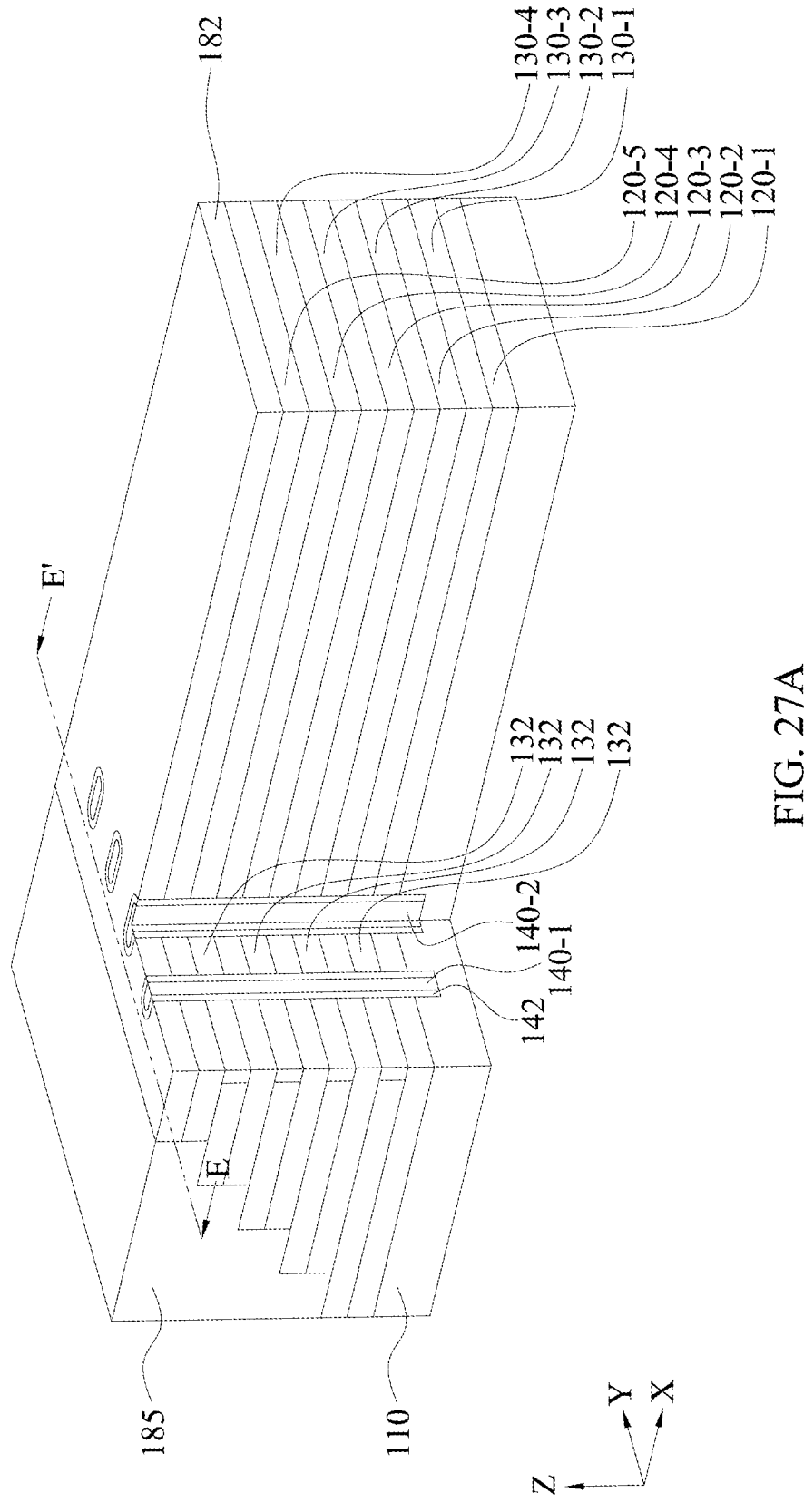
FIG. 27A and FIG. 27B illustrate one or more stages of an exemplary method for manufacturing a semiconductor device according to some embodiments of the present disclosure.
Figure 27B:
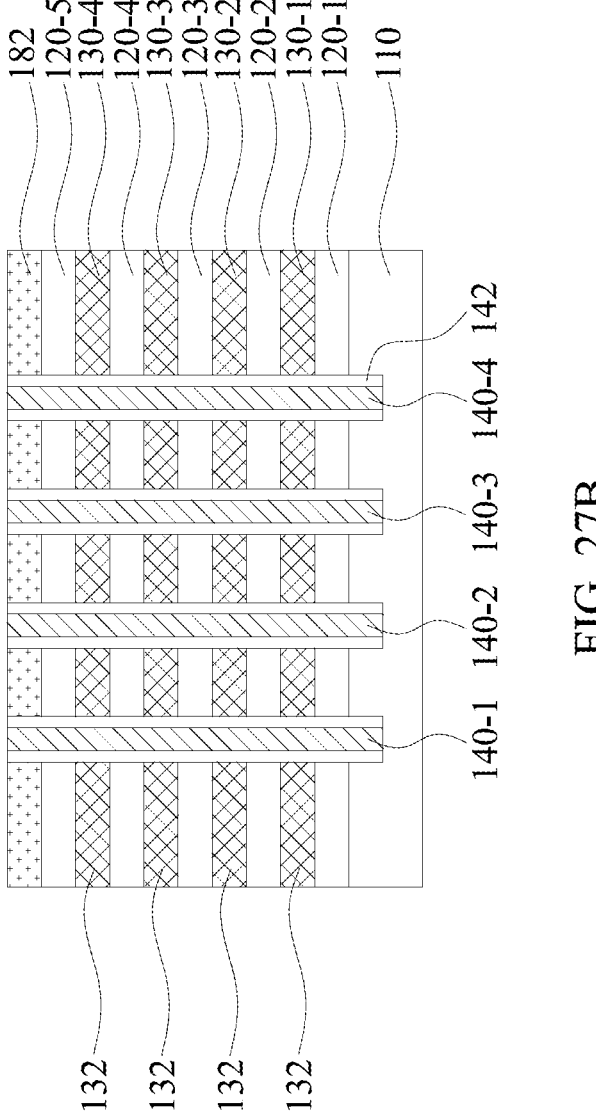

Referring to FIG. 27A and FIG. 27B, a dielectric layer 185 may be formed to cover the stepped structures defined by the semiconductor layers 130-1, 130-2, 130-3, and 130-4. The dielectric layer 185 may include a dielectric material, such as silicon oxide. The dielectric layer 185 may be formed by CVD, PVD, ALD, LPCVD, PECVD, or other suitable processes.

Figure 28A:
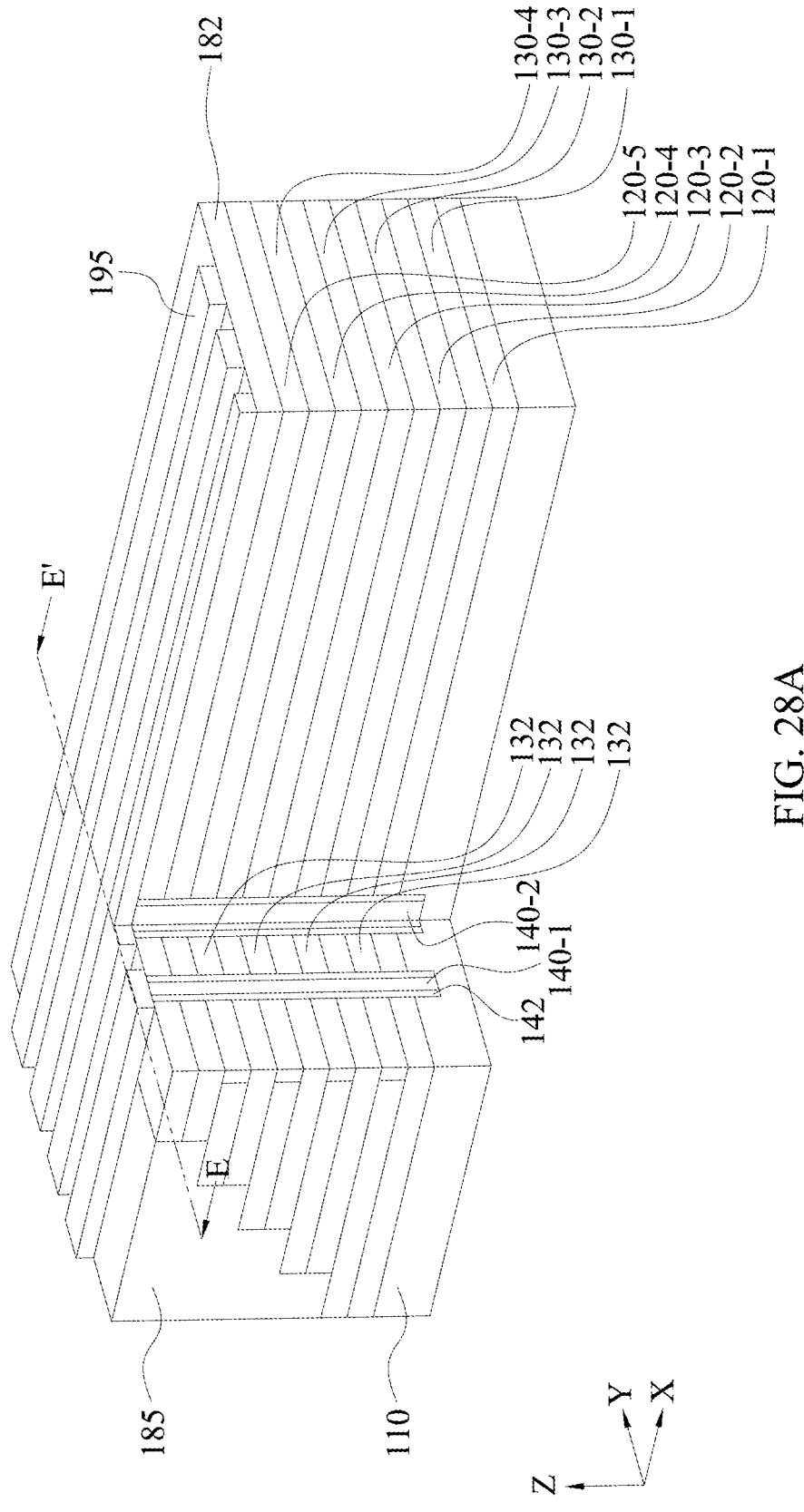

Referring to FIG. 28A and FIG. 28B, a photoresist layer 195 may be formed. The photoresist layer 195 may include a negative-tone photoresist or a positive-tone photoresist. The photoresist layer 195 may cover the word lines 140-1, 140-2, 140-3, and 140-4. The photoresist layer 195 may cover a portion of the dielectric layer 185. The photoresist layer 195 may cover a portion of the dielectric layer 182.

Figure 29A:
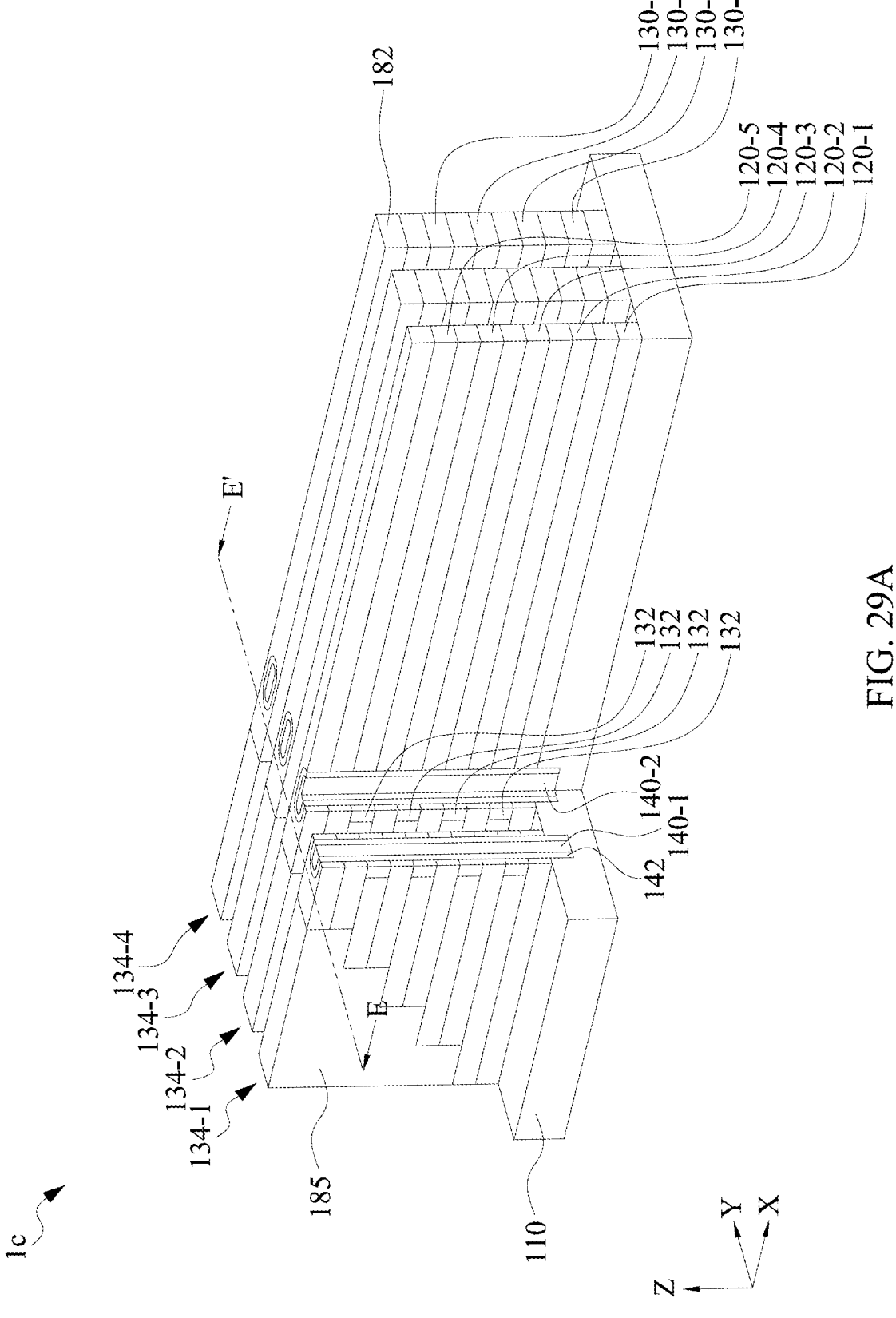
FIG. 29A and FIG. 29B illustrate one or more stages of an exemplary method for manufacturing a semiconductor device according to some embodiments of the present disclosure.
Figure 29B:
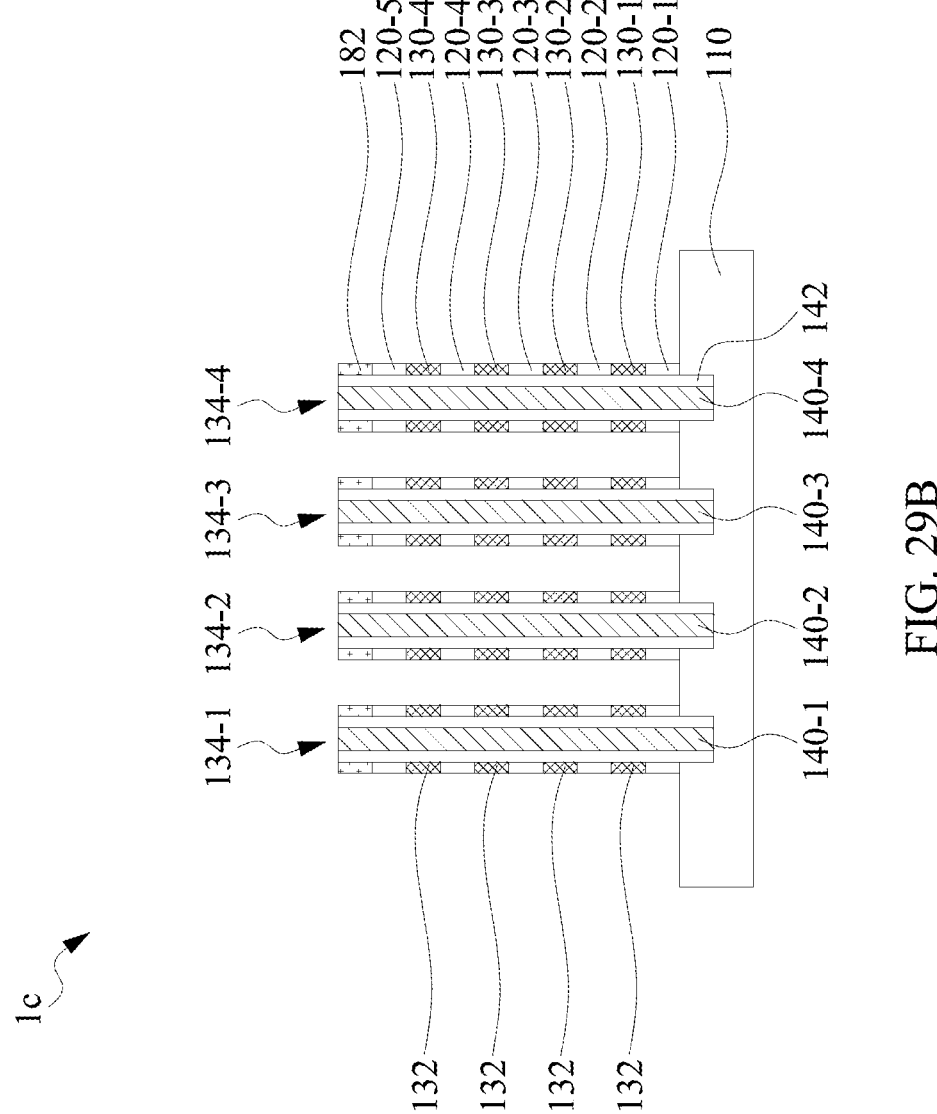

Referring to FIG. 29A and FIG. 29B, an etching technique may be performed to form island structures 134-1, 134-2, 134-3, and 134-4. A portion of the isolation layers 120-1, 120-2, 120-3, 120-4, and 120-5 may be removed. A portion of the semiconductor layers 130-1, 130-2, 130-3, and 130-4 may be removed. The photoresist layer 195 may be removed. Each of the island structures 134-1, 134-2, 134-3, and 134-4 may include the isolation layers 120-1, 120-2, 120-3, 120-4, and 120-5 as well as the semiconductor layers 130-1, 130-2, 130-3, and 130-4. Each of the island structures 134-1, 134-2, 134-3, and 134-4 may extend along the X direction. The channel layer of a transistor may be defined in this stage. The first electrode of a capacitor may be defined in this stage. A semiconductor device 1c may be produced.

Figure 30A:
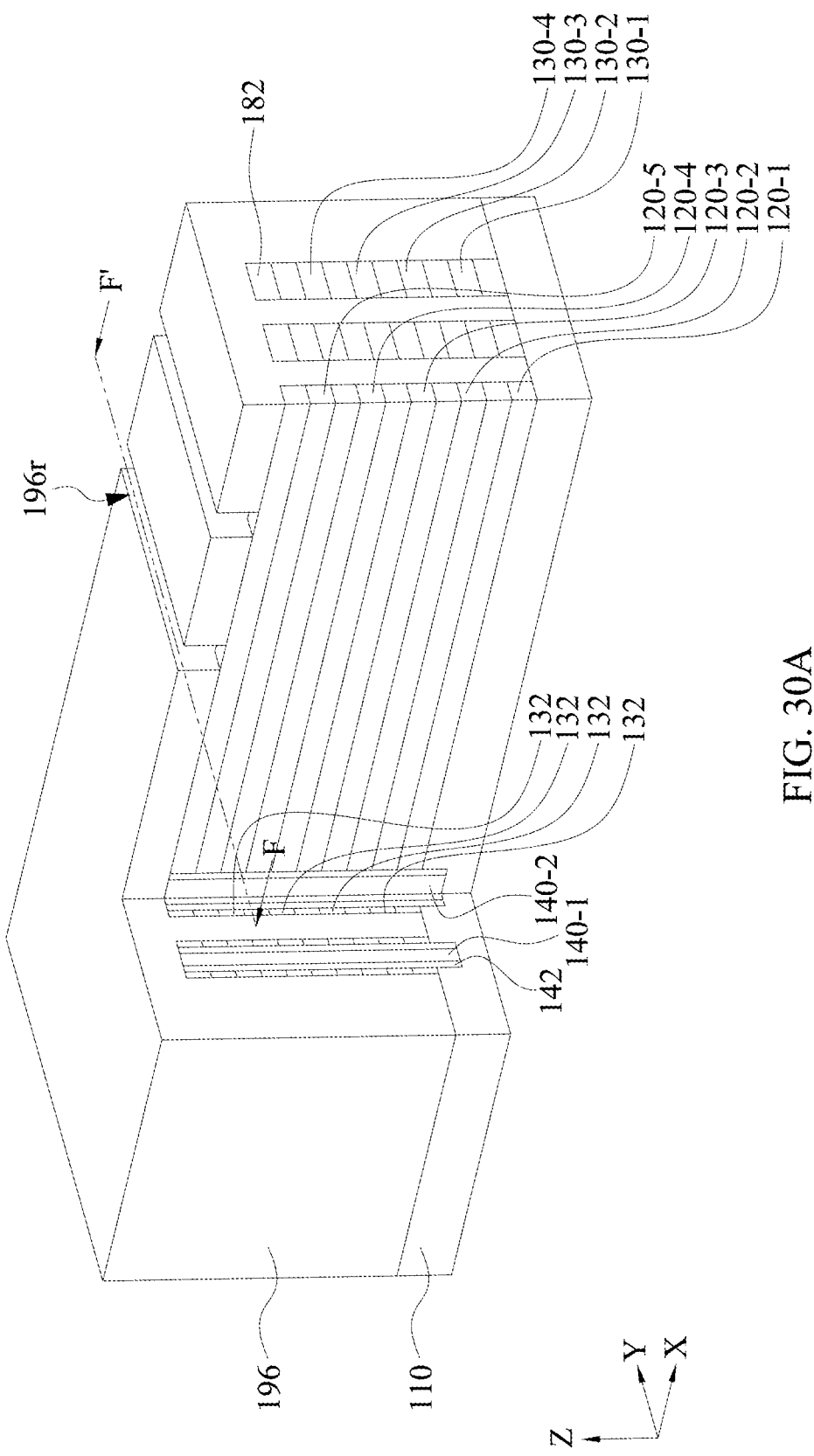

FIG. 30A to FIG. 34A illustrate one or more stages of an exemplary method for manufacturing a semiconductor device 1d according to some embodiments of the present disclosure. FIG. 30B to FIG. 34B are cross-sectional views along line F-F' of FIG. 30A to FIG. 34A, respectively. FIG. 30A depicts a stage subsequent to that depicted in FIG. 29A.

Referring to FIG. 30A and FIG. 30B, a photoresist layer 196 may be formed to cover the dielectric layer 182. The photoresist layer 196 may include a negative-tone photoresist or a positive-tone photoresist. The photoresist layer 196 may include an opening 196r exposing the dielectric layer 182. The opening 196r may extend along the Y direction.

Figure 31A:
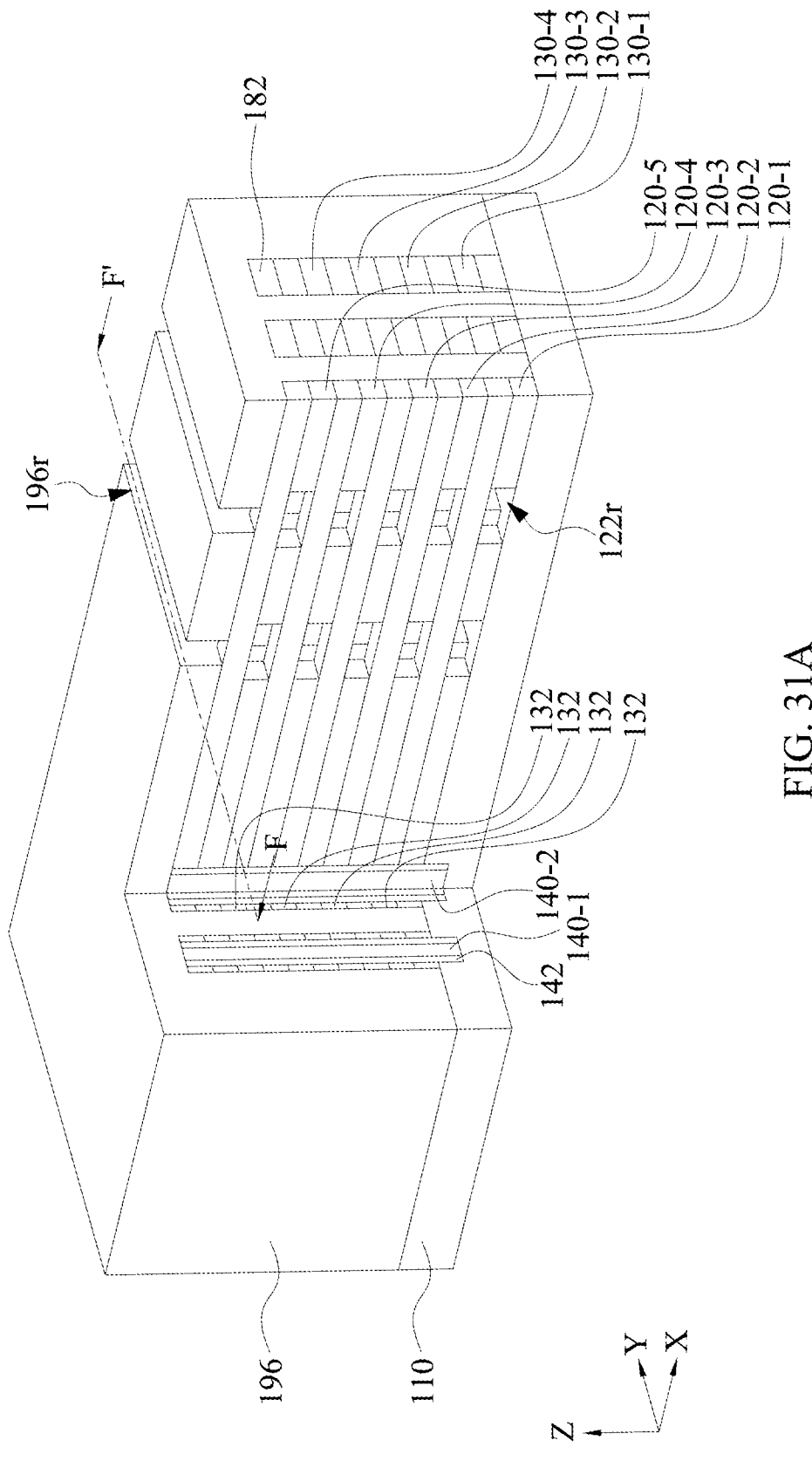
FIG. 31A and FIG. 31B illustrate one or more stages of an exemplary method for manufacturing a semiconductor device according to some embodiments of the present disclosure.
Figure 31B:
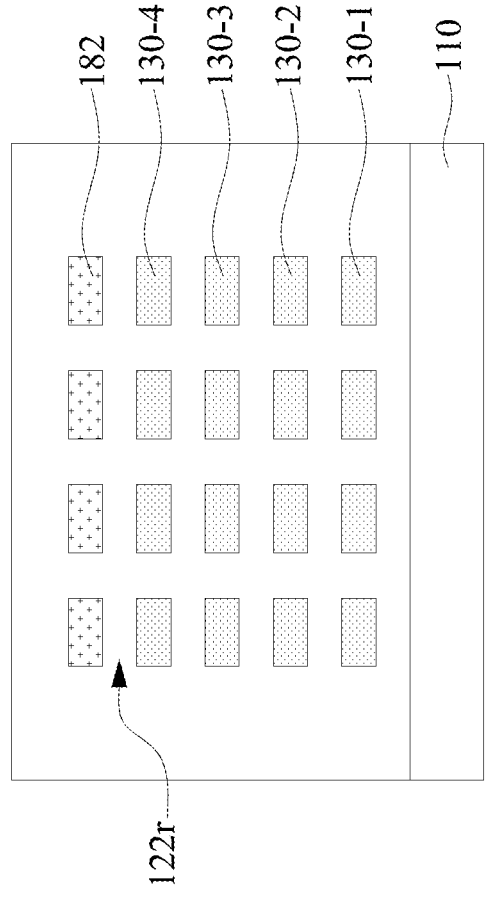
Figure 31B:
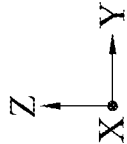

Referring to FIG. 31A and FIG. 31B, the isolation layers 120-1, 120-2, 120-3, 120-4, and 120-5, exposed by the opening 196r, may be removed. A plurality of openings 122r may be formed.

Figure 32A:
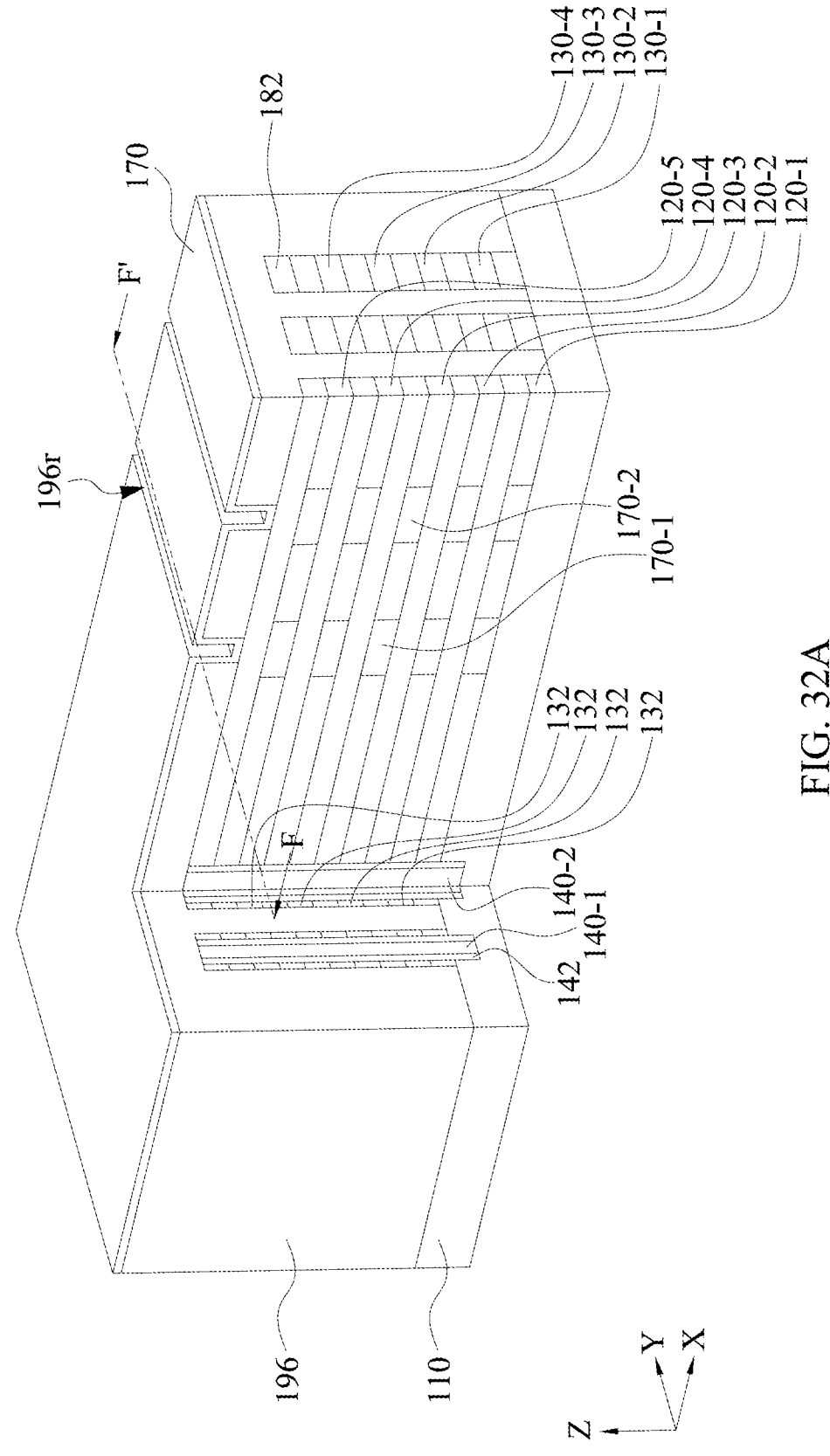
FIG. 32A and FIG. 32B illustrate one or more stages of an exemplary method for manufacturing a semiconductor device according to some embodiments of the present disclosure.
Figure 32B:
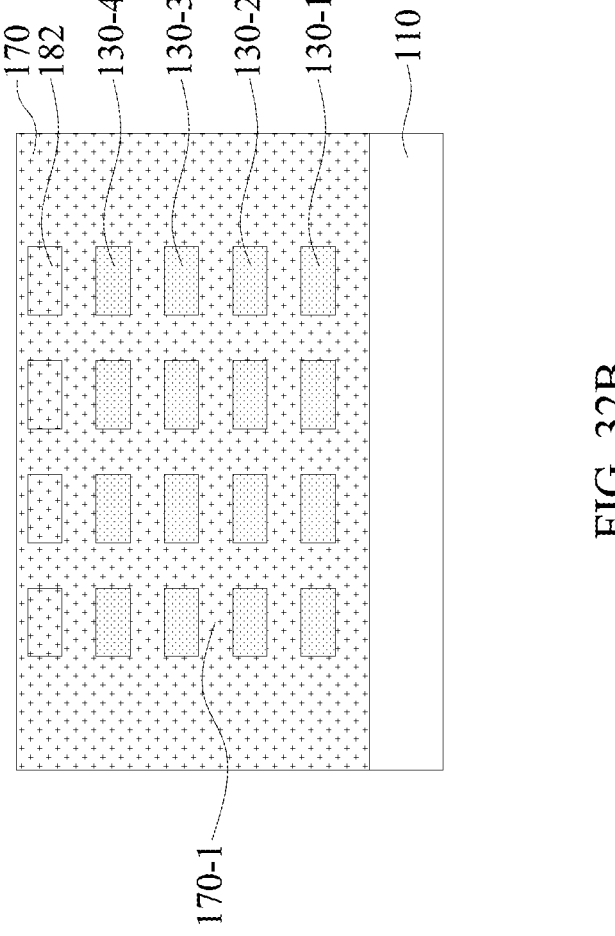
Figure 32B:
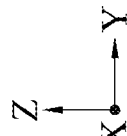

Referring to FIG. 32A and FIG. 32B, a dielectric layer 170 may be formed on the dielectric layer 182 and fill the openings 122r. Supporting layers 170-1 and 170-2 may be formed. The supporting layer 170-1 may extend along the Y direction. In some embodiments, the supporting layer 170-1 may surround the semiconductor layers 130-1, 130-2, 130-3, and 130-4. In some embodiments, the supporting layers 170-1 and 170-2 may be inserted between, for example, the external surface (not annotated) of the semiconductor layer 130-1 and the word line 140-2. In some embodiments, the supporting layers 170-1 and 170-2 may enforce the framework of the intermediate structure shown in FIG. 32A to FIG. 39A. In some embodiments, the dielectric layer 170 may include a dielectric material, such as silicon nitride. The dielectric layer 170 may be formed by, CVD, PVD, ALD, LPCVD, PECVD, or other suitable processes.

Figure 33A:
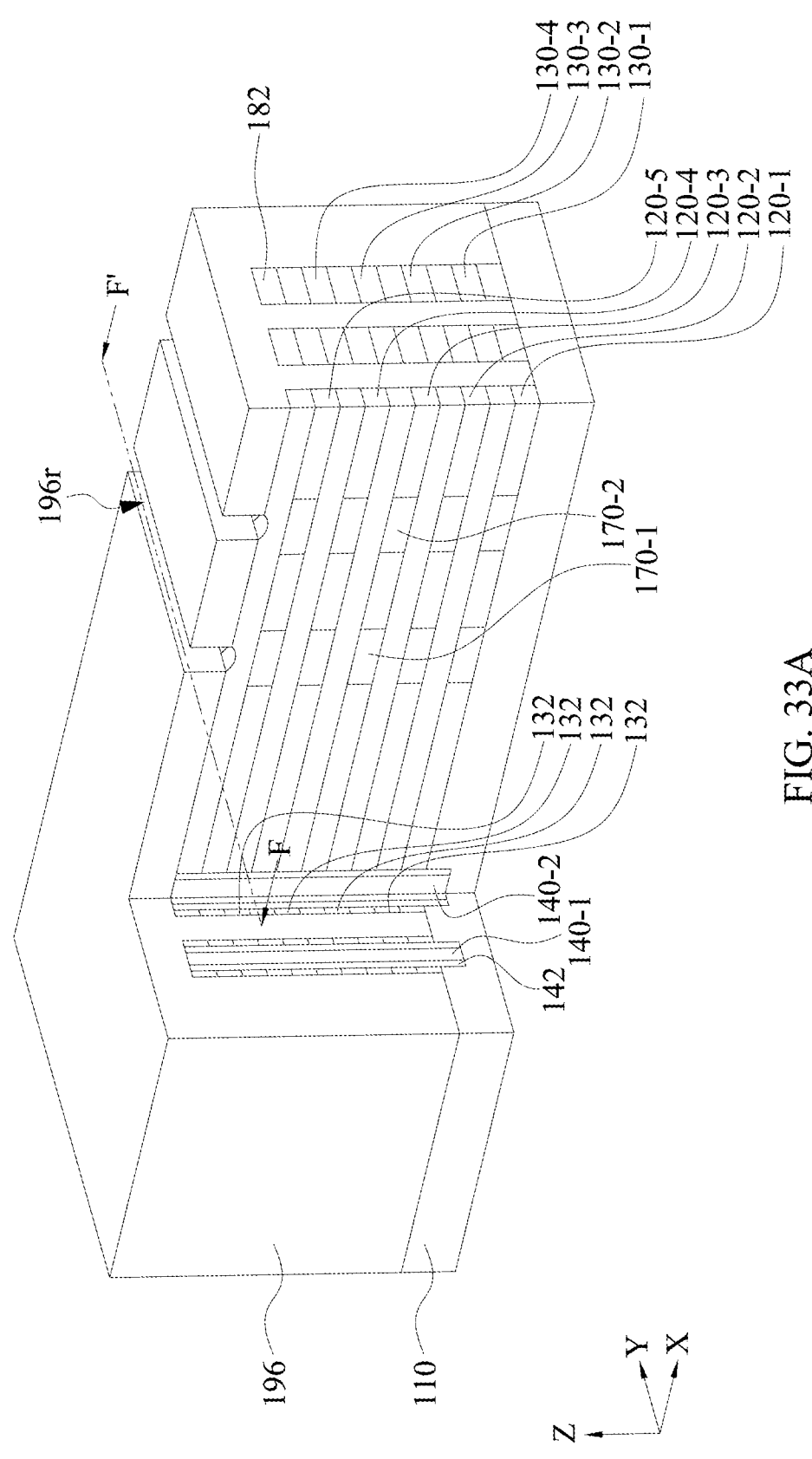
FIG. 33A and FIG. 33B illustrate one or more stages of an exemplary method for manufacturing a semiconductor device according to some embodiments of the present disclosure.
Figure 33B:
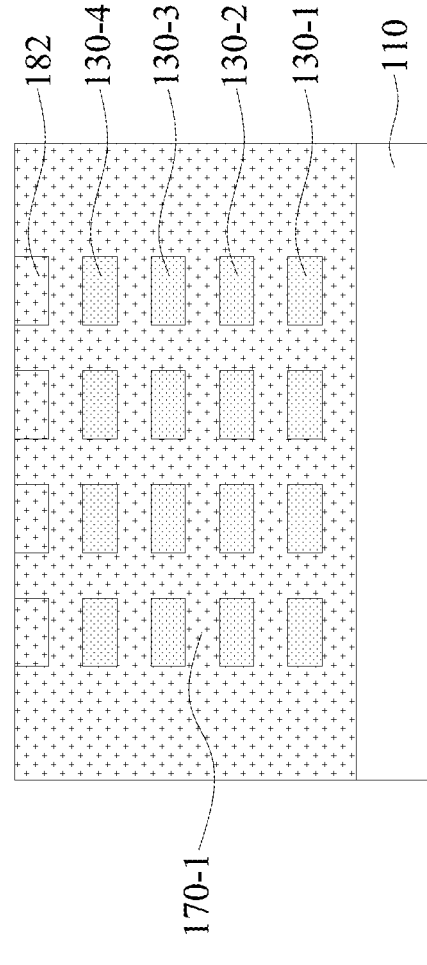
Figure 33B:
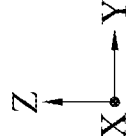

Referring to FIG. 33A and FIG. 33B, a portion of the dielectric layer 170 may be removed to expose the dielectric layer 182. The dielectric layer 170 may be removed by, for example, a wet etching technique.

Figure 34A:
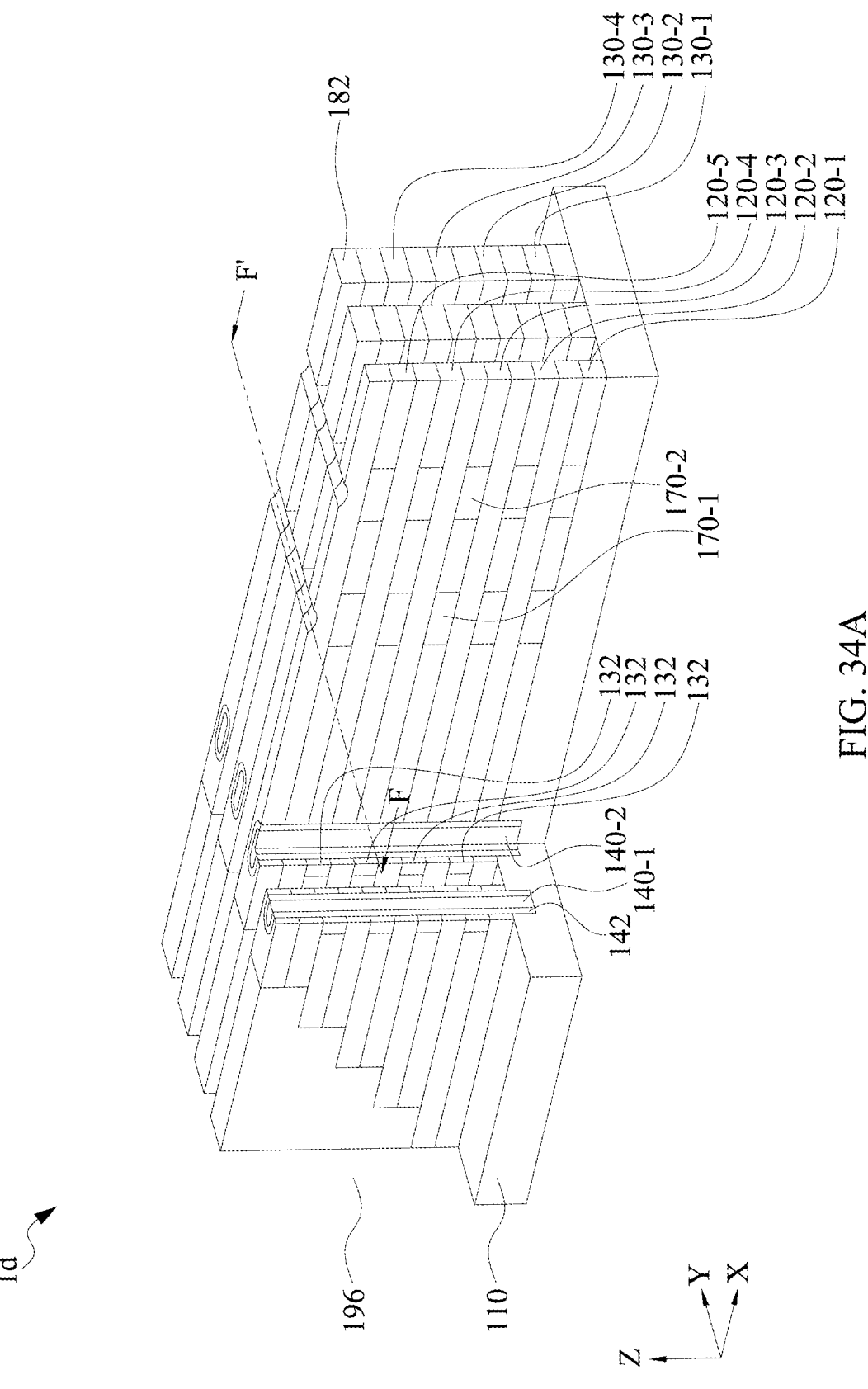

Referring to FIG. 34A and FIG. 34B, the photoresist layer 196 may be removed. The semiconductor device 1d may be produced.

Figure 35A:
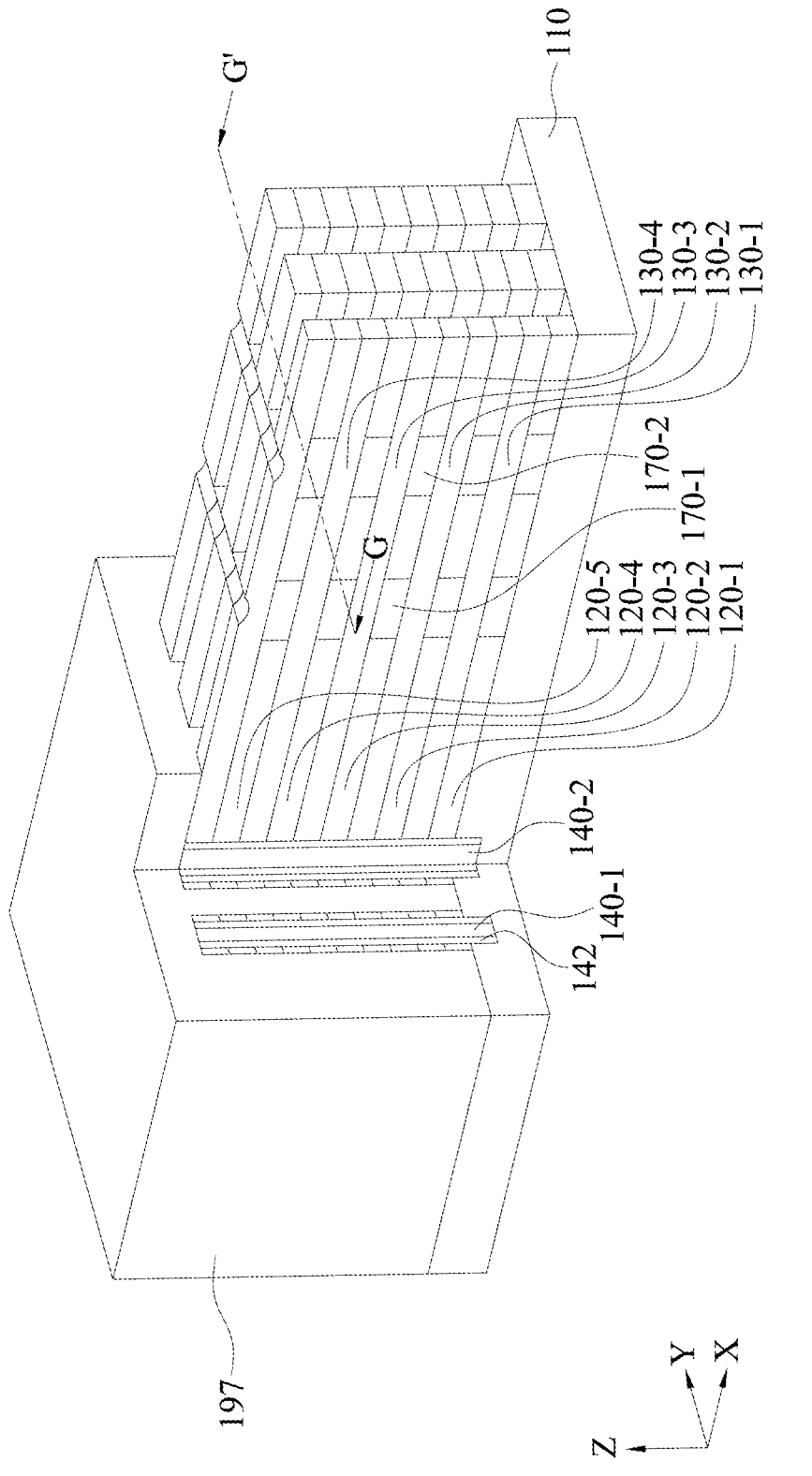

FIG. 35A to FIG. 39A illustrate one or more stages of an exemplary method for manufacturing a semiconductor device 1e according to some embodiments of the present disclosure. FIG. 35B to FIG. 39B are cross-sectional views along line G-G' of FIG. 35A to FIG. 39A, respectively. FIG. 35A depicts a stage subsequent to that depicted in FIG. 34A.

Referring to FIG. 35A and FIG. 35B, a photoresist layer 197 may be formed to cover the stepped structures defined by the isolation layers 120-1, 120-2, 120-3, 120-4, and 120-5 as well as the semiconductor layers 130-1, 130-2, 130-3, and 130-4. The photoresist layer 197 may include a negative-tone photoresist or a positive-tone photoresist.

Figure 36A:
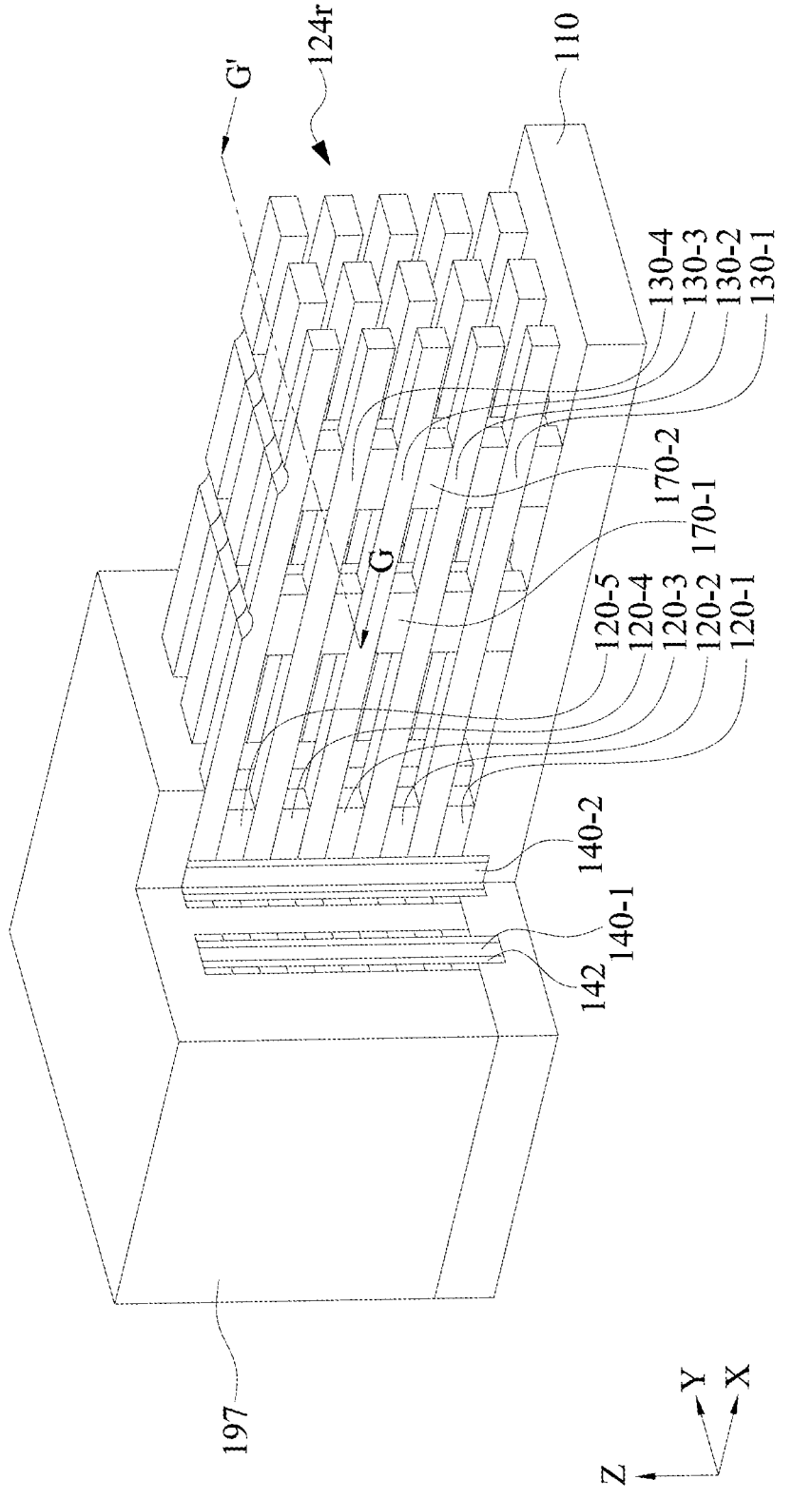
FIG. 36A and FIG. 36B illustrate one or more stages of an exemplary method for manufacturing a semiconductor device according to some embodiments of the present disclosure.
Figure 36B:
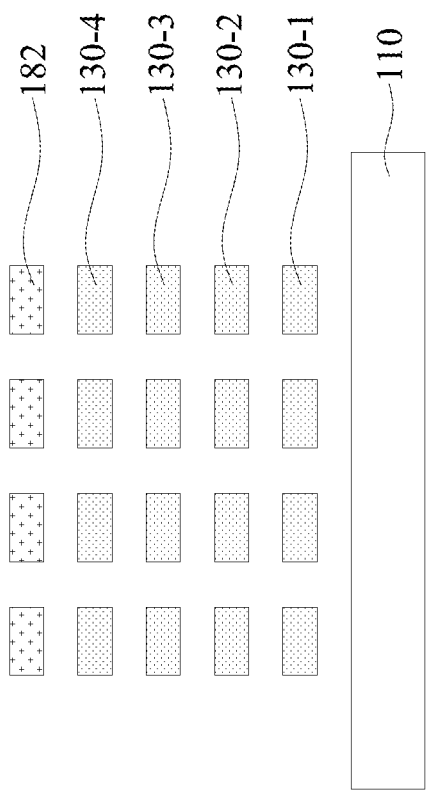
Figure 36B:
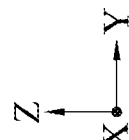

Referring to FIG. 36A and FIG. 36B, an etching technique may be performed. The isolation layers 120-1, 120-2, 120-3, 120-4, and 120-5 exposed from the photoresist layer 197 may be removed. The isolation layers 120-1, 120-2, 120-3, 120-4, and 120-5 may be removed by, for example, a wet etching technique. An opening 124r may be defined. The supporting layers 170-1 and 170-2 may be configured to support the semiconductor layers 130-1, 130-2, 130-3, and 130-4, which prevents the semiconductor layers 130-1, 130-2, 130-3, and 130-4 from collapsing.

Figure 37A:
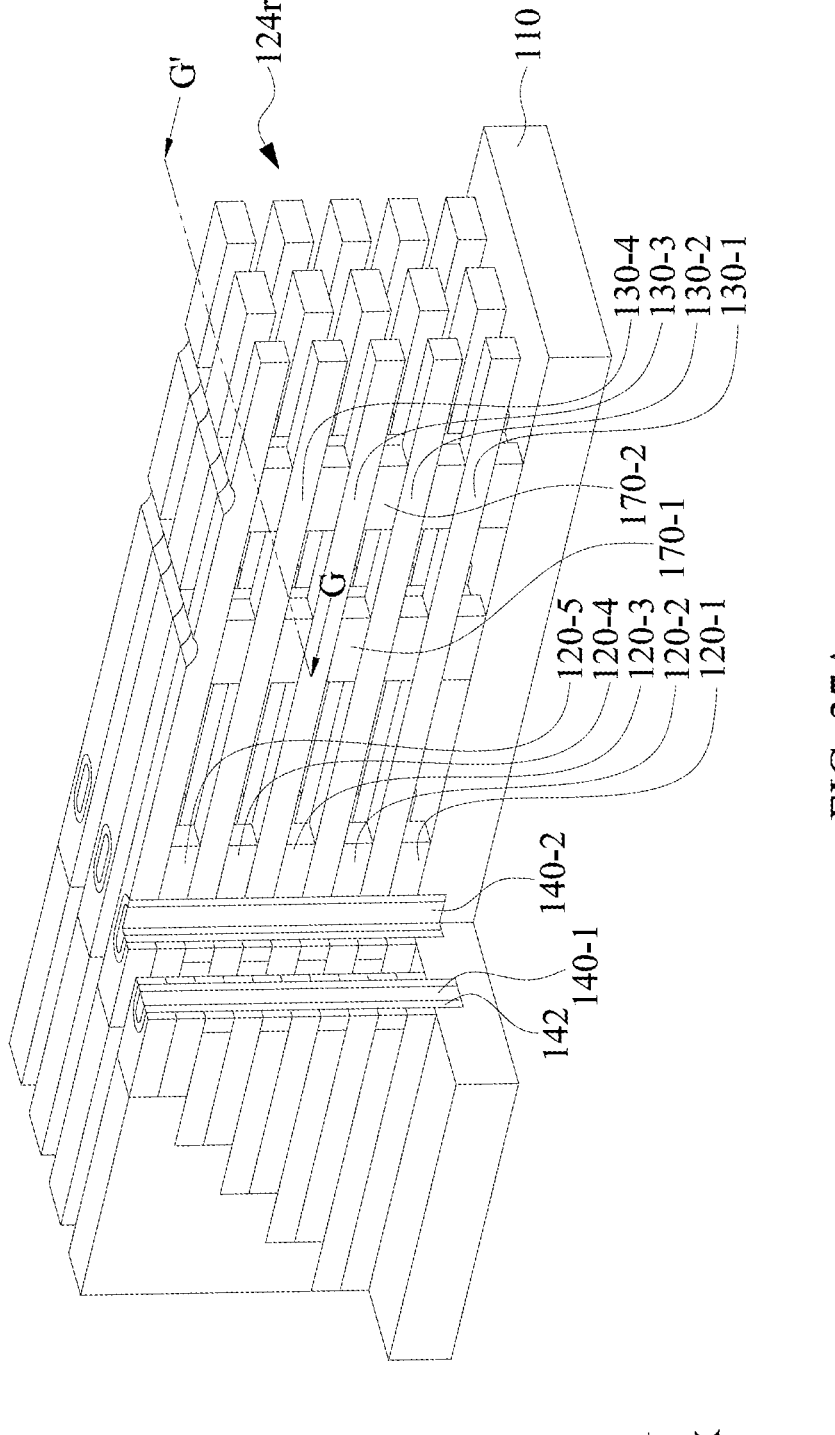

Referring to FIG. 37A and FIG. 37B, the photoresist layer 197 may be removed.

Figure 38A:
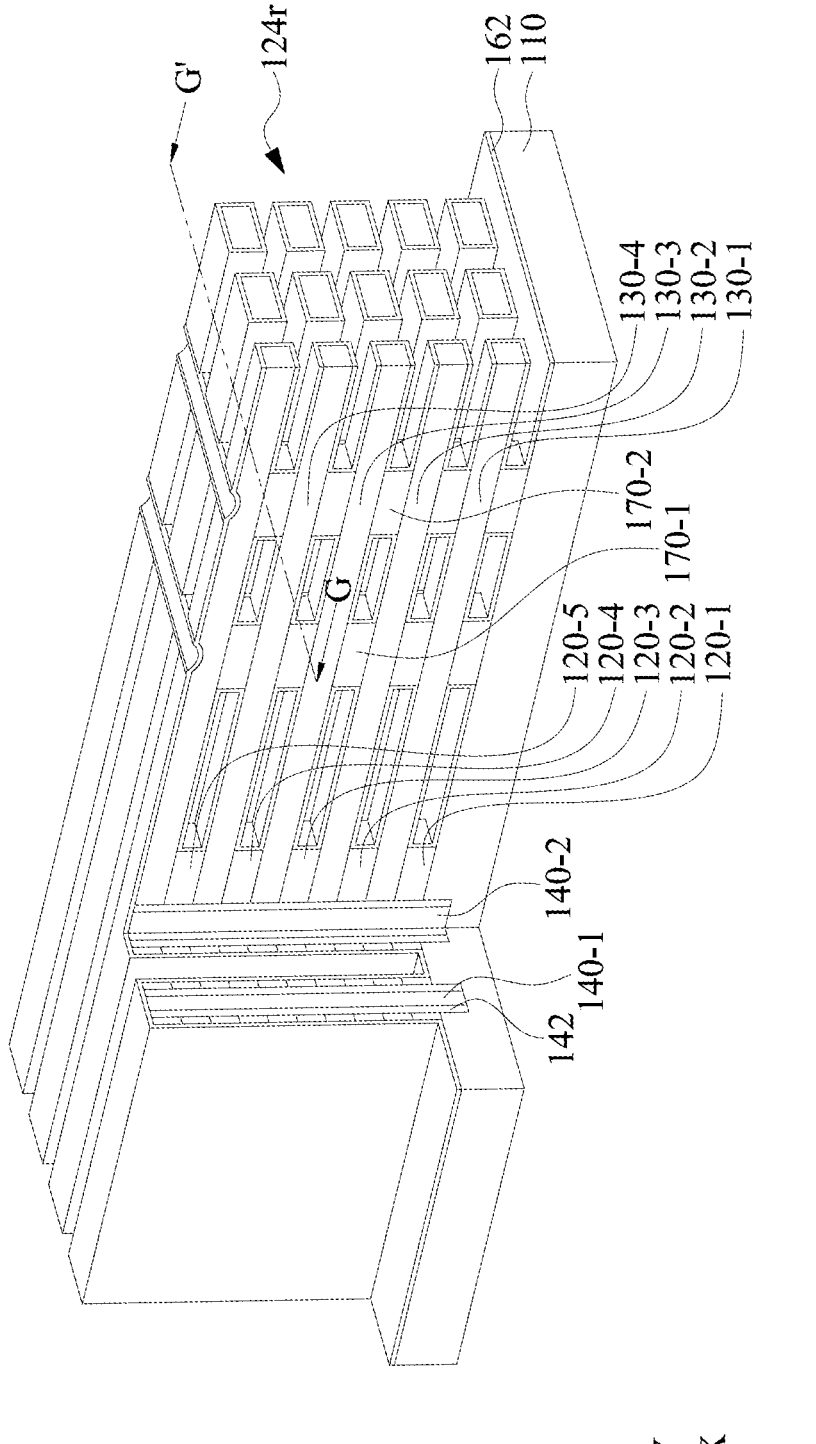

Referring to FIG. 38A and FIG. 38B, a capacitor dielectric 162 may be formed within the opening 124r. In some embodiments, the capacitor dielectric 162 may be conformally formed on the semiconductor layers 130-1, 130-2, 130-3, and 130-4. The capacitor dielectric 162 may be formed on the word lines 140-1, 140-2, 140-3, and 140-4. The capacitor dielectric 162 may be formed by, for example, ALD, CVD, PVD, LPCVD, PECVD, or other suitable processes. In some embodiments, the capacitor dielectric 162 may include a high-k material.

Figure 39A:
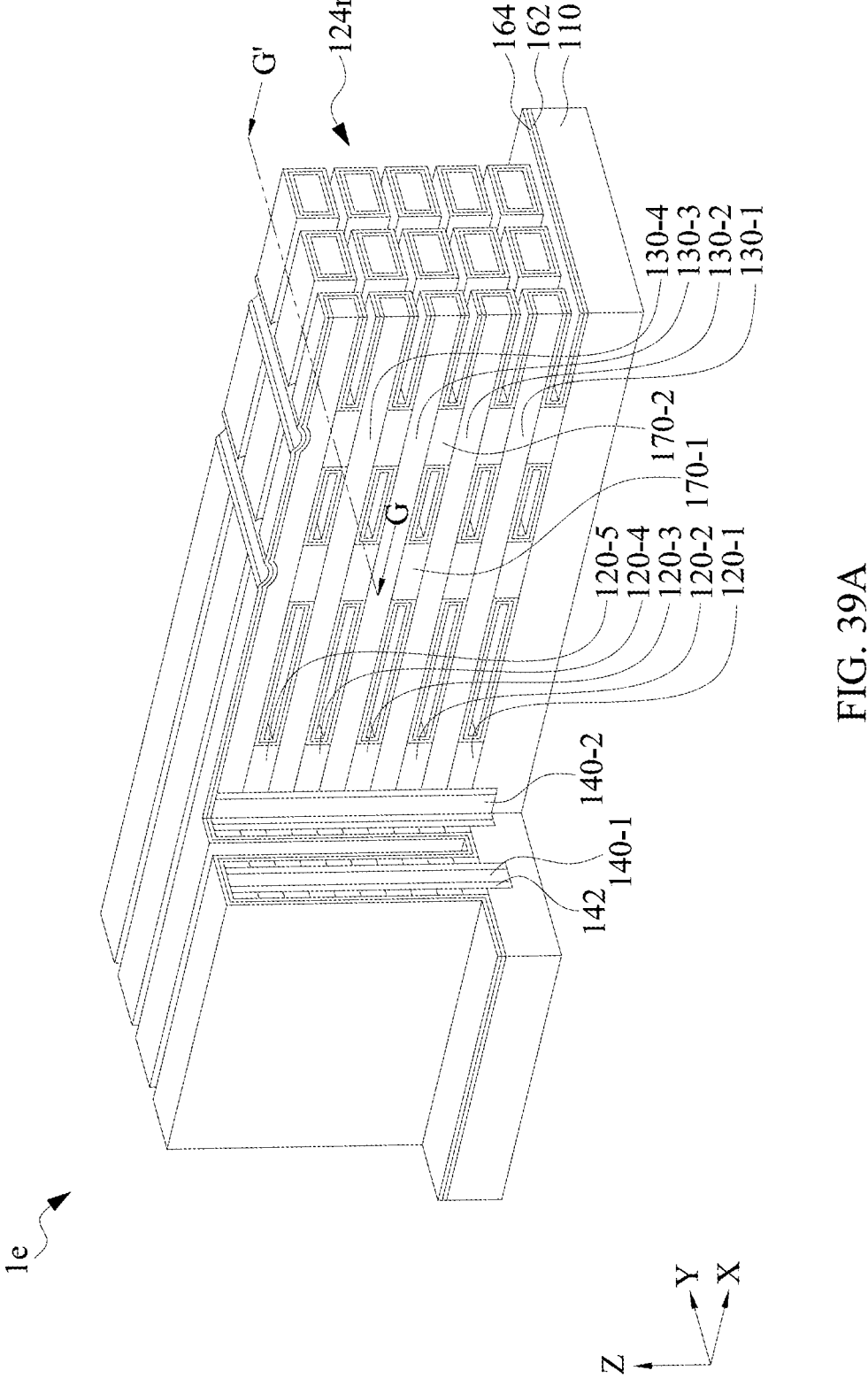
FIG. 39A and FIG. 39B illustrate one or more stages of an exemplary method for manufacturing a semiconductor device according to some embodiments of the present disclosure.
Figure 39B:
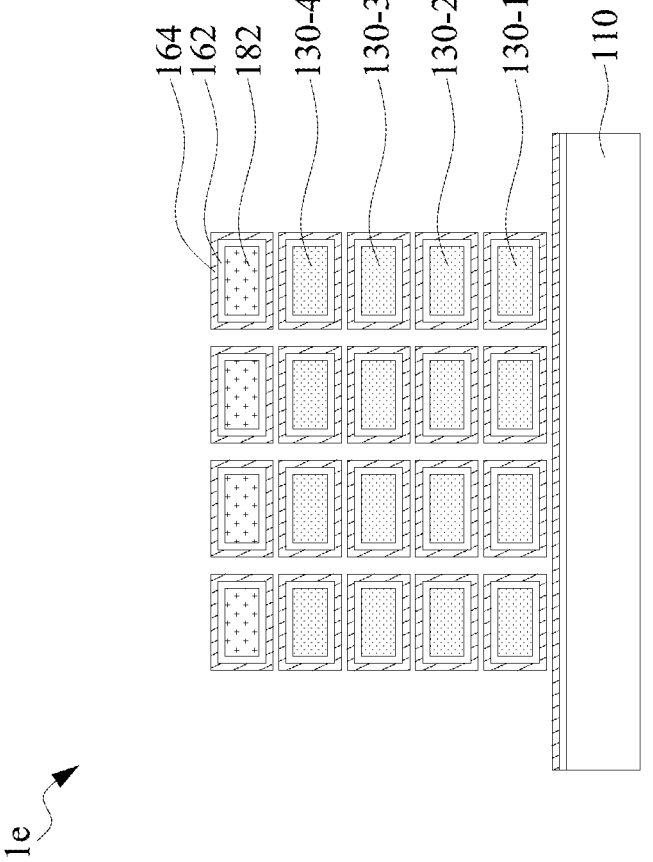
Figure 39B:
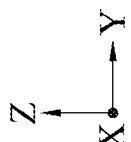

Referring to FIG. 39A and FIG. 39B, a conductive layer 164 may be conformally formed on the capacitor dielectric 162. Capacitors 160-1, 160-2, 160-3, 160-4, 160-5, 160-6, 160-7, and 160-8 may be formed. The conductive layer 164 may be formed on the word lines 140-1, 140-2, 140-3, and 140-4. The semiconductor device 1e may be produced. The conductive layer 164 may be formed by, for example, ALD, CVD, PVD, LPCVD, PECVD, or other suitable processes. In some embodiments, the conductive layer 164 may include a conductive material, such as titanium nitride.

Figure 40A:
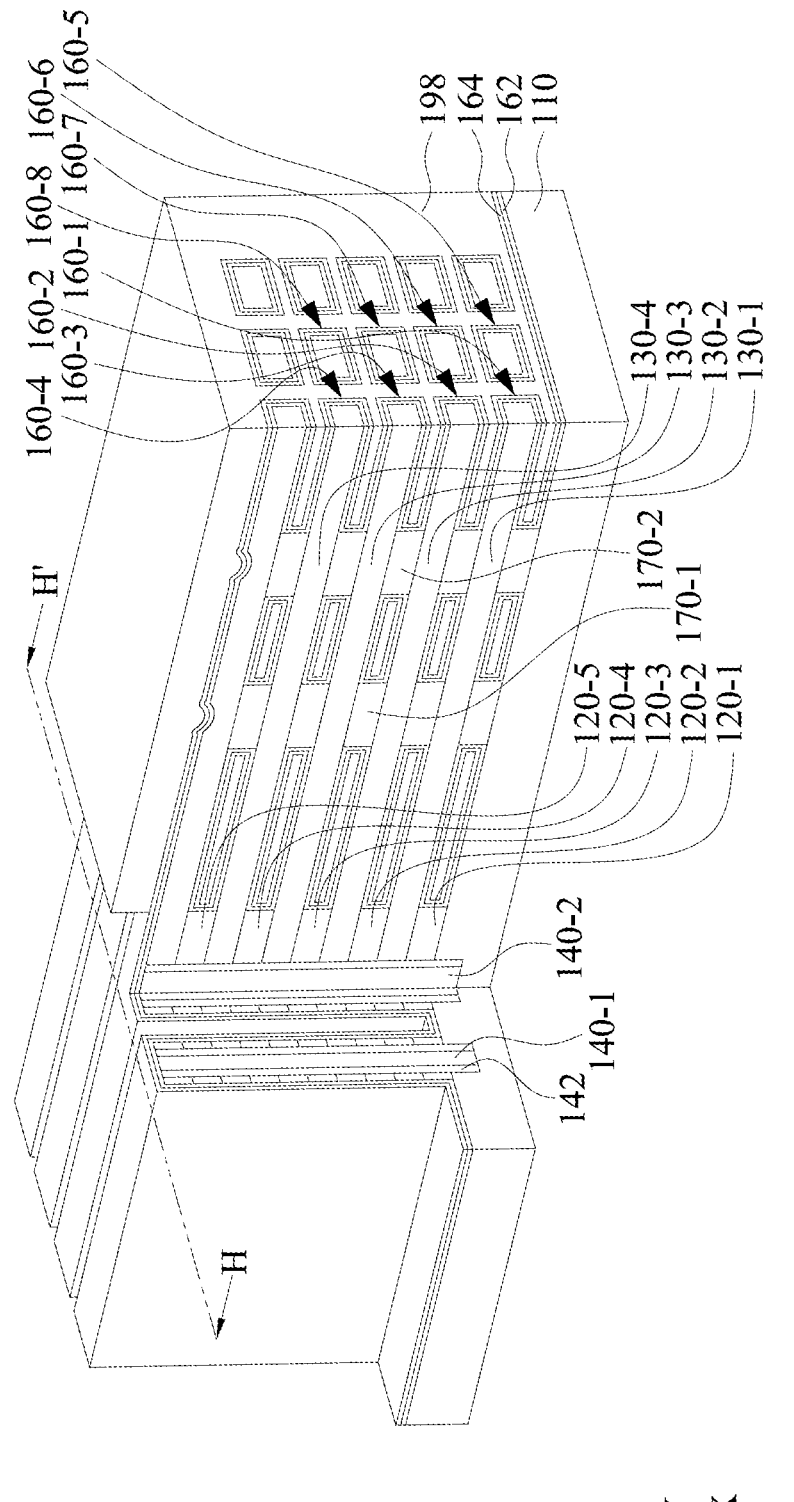

FIG. 40A to FIG. 43A illustrate one or more stages of an exemplary method for manufacturing a semiconductor device if according to some embodiments of the present disclosure. FIG. 40B to FIG. 43B are cross-sectional views along line H-H' of FIG. 40A to FIG. 43A, respectively. FIG. 40A depicts a stage subsequent to that depicted in FIG. 39A.

Referring to FIG. 40A and FIG. 40B, a photoresist layer 198 may be formed to cover the capacitors 160-1, 160-2, 160-3, 160-4, 160-5, 160-6, 160-7, and 160-8. The word lines 140-1, 140-2, 140-3, and 140-4 may be exposed from the photoresist layer 198. The photoresist layer 198 may include a negative-tone photoresist or a positive-tone photoresist.

Figure 41A:
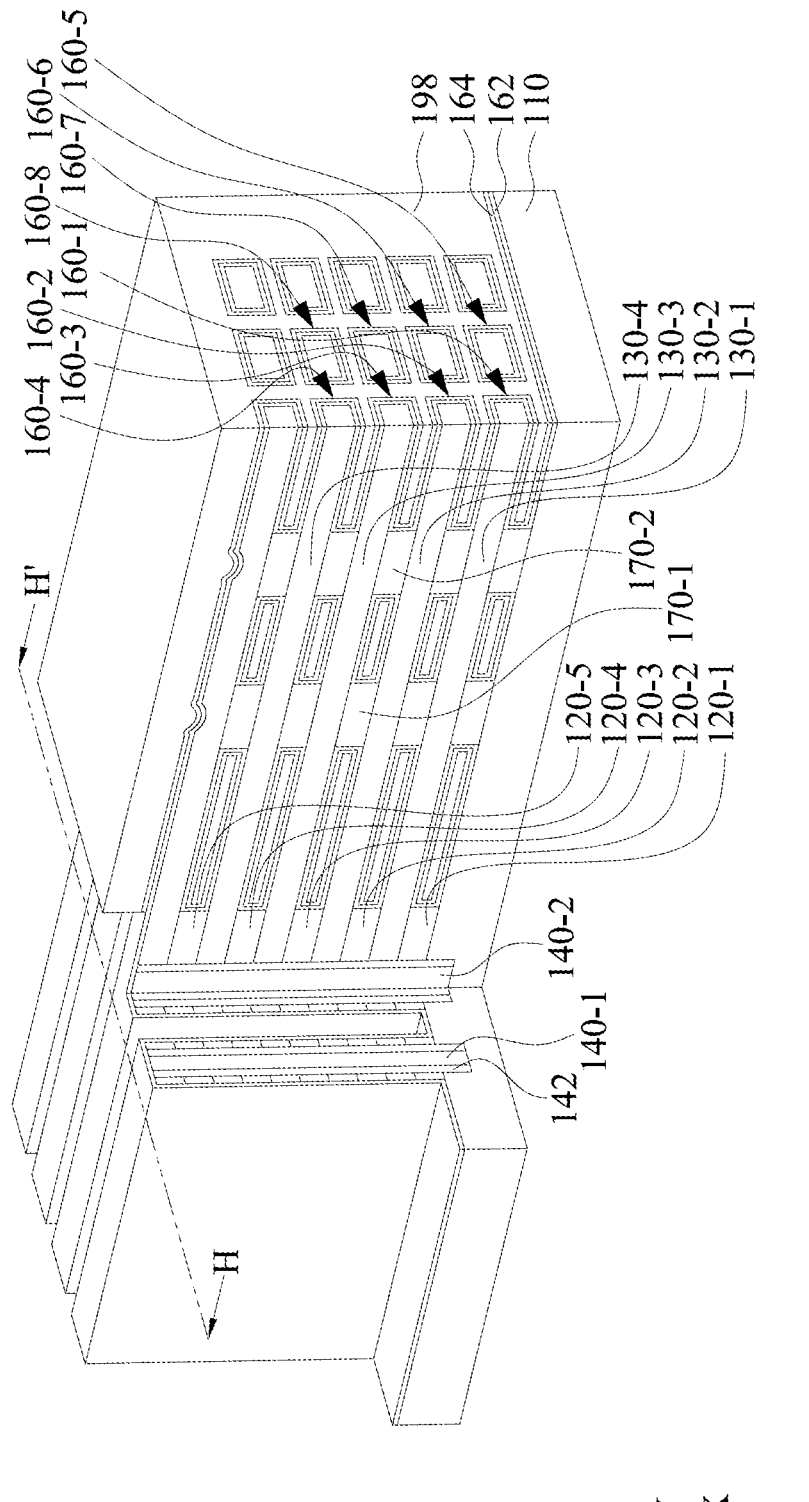

Referring to FIG. 41A and FIG. 41B, the conductive layer 164 covering the word lines 140-1, 140-2, 140-3, and 140-4 may be removed. The conductive layer 164 may be removed by, for example, a wet etching technique.

Figure 42A:
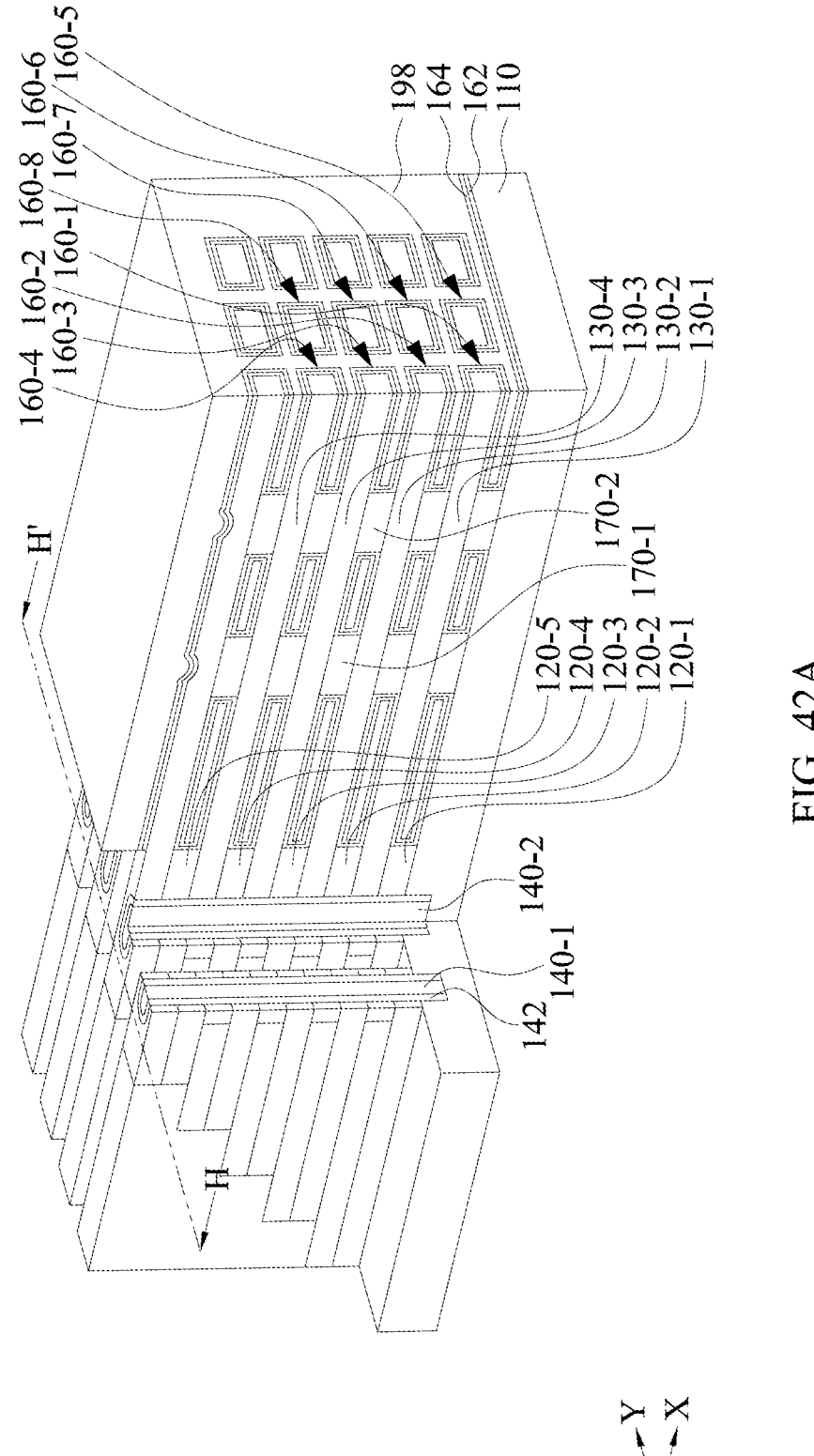
FIG. 42A and FIG. 42B illustrate one or more stages of an exemplary method for manufacturing a semiconductor device according to some embodiments of the present disclosure.
Figure 42B:
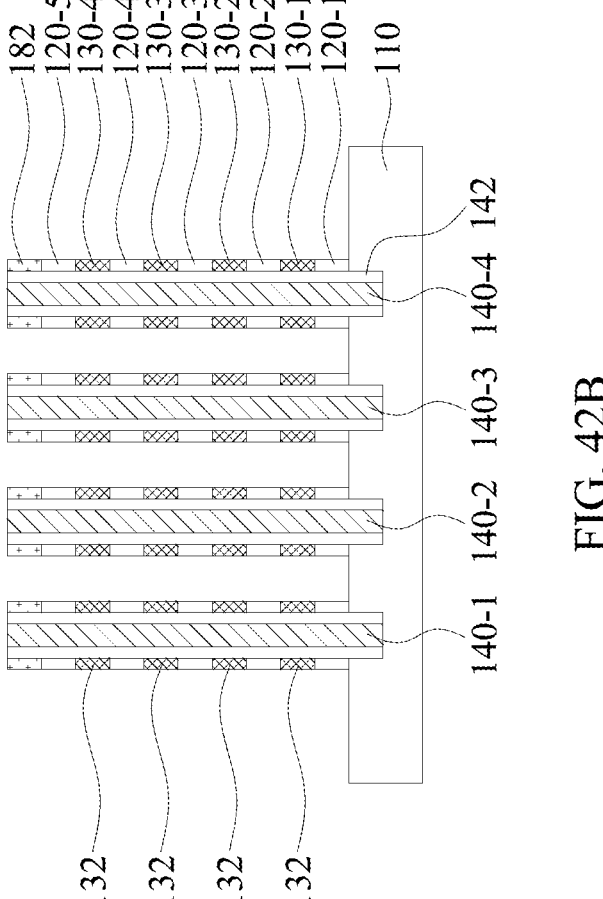
Figure 42B:
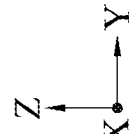

Referring to FIG. 42A and FIG. 42B, the capacitor dielectric 162 covering the word lines 140-1, 140-2, 140-3, and 140-4 may be removed. The capacitor dielectric 162 may be removed by, for example, a wet etching technique. The word lines 140-1, 140-2, 140-3, and 140-4 may be exposed.

Figure 43A:
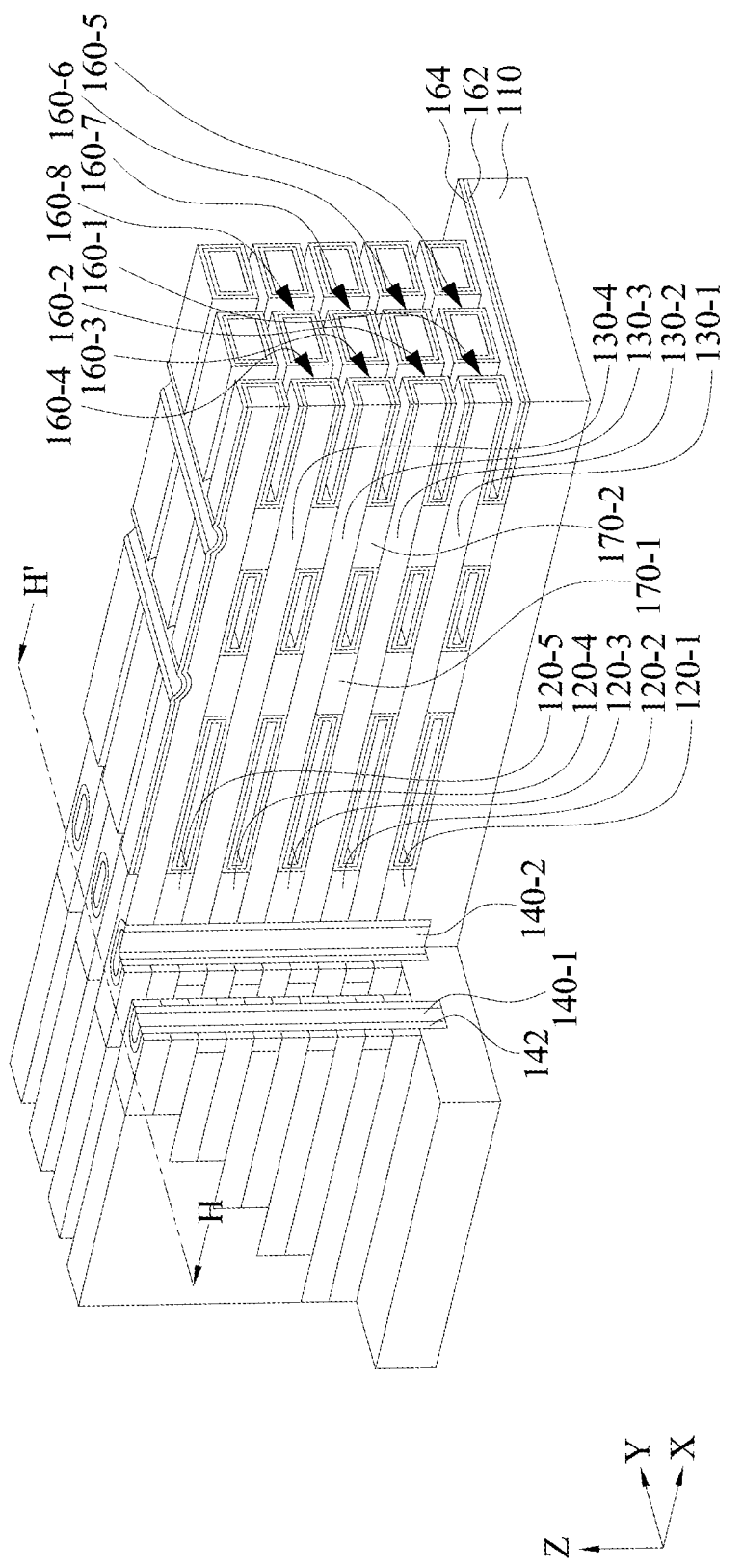
FIG. 43A and FIG. 43B illustrate one or more stages of an exemplary method for manufacturing a semiconductor device according to some embodiments of the present disclosure.
Figure 43B:
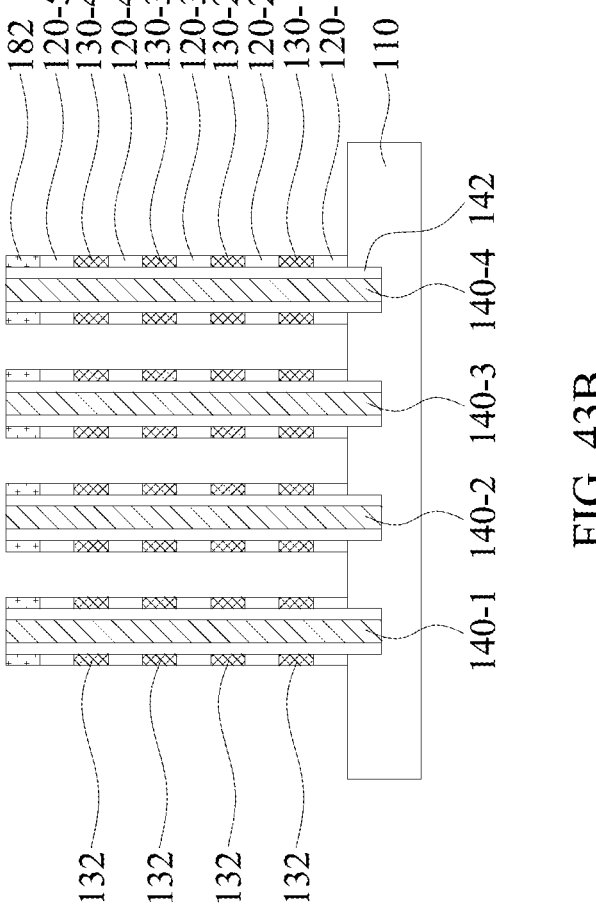
Figure 43B:
Figure 43B:
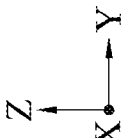

Referring to FIG. 43A and FIG. 43B, the photoresist layer 198 may be removed to expose the capacitors 160-1, 160-2, 160-3, 160-4, 160-5, 160-6, 160-7, and 160-8. The semiconductor device if may be produced.

Figure 44A:
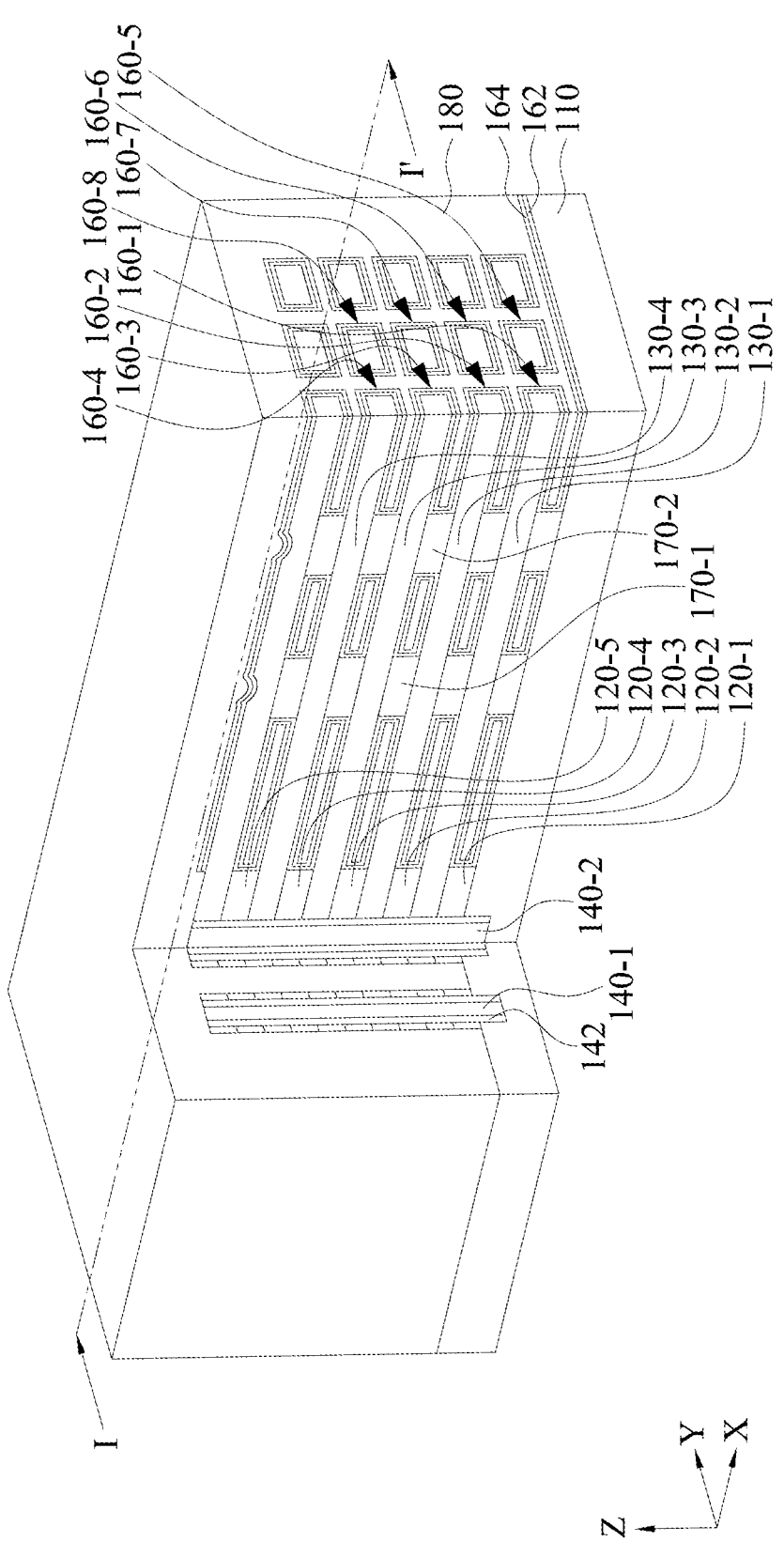
FIG. 44A and FIG. 44B illustrate one or more stages of an exemplary method for manufacturing a semiconductor device according to some embodiments of the present disclosure.

FIG. 44A to FIG. 49A illustrate one or more stages of an exemplary method for manufacturing a semiconductor device 1g according to some embodiments of the present disclosure. FIG. 44B to FIG. 49B are cross-sectional views along line I-I' of FIG. 44A to FIG. 49A, respectively. FIG. 44A depicts a stage subsequent to that depicted in FIG. 43A.

Figure 44B:
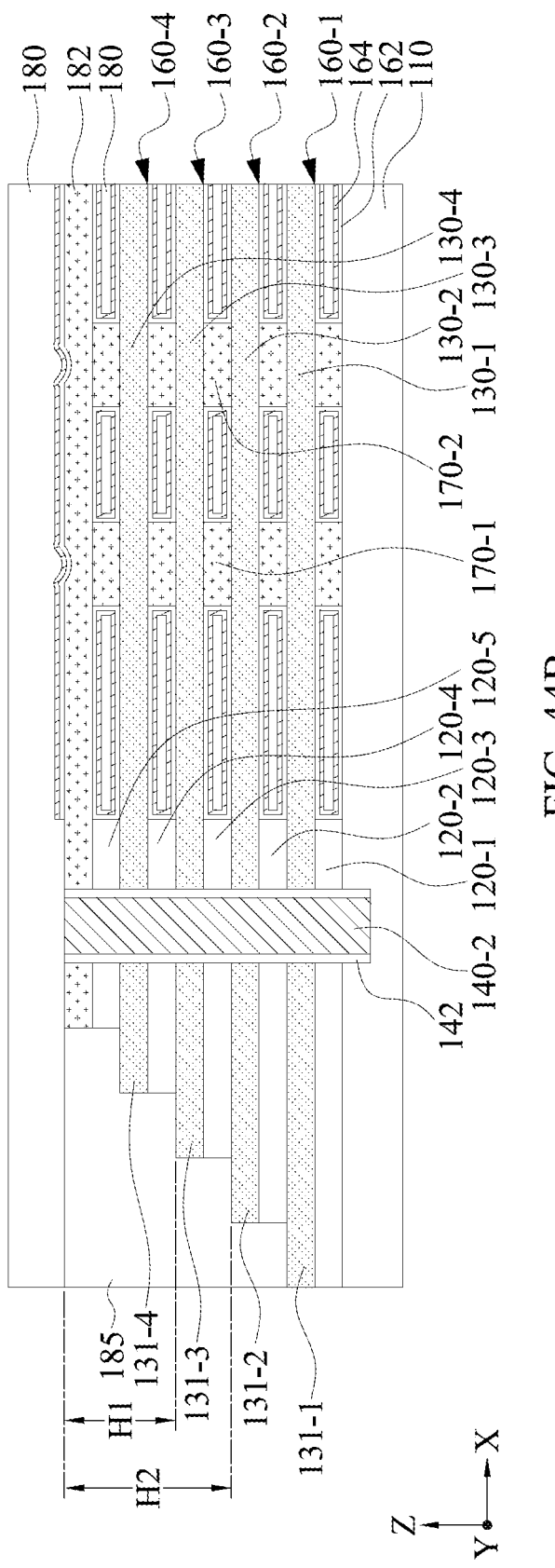

Referring to FIG. 44A and FIG. 44B, a dielectric layer 180 may be formed to cover the word lines 140-1, 140-2, 140-3, and 140-4. The capacitors 160-1, 160-2, 160-3, 160-4, 160-5, 160-6, 160-7, and 160-8 may be covered by the dielectric layer 180. The dielectric layer 180 may include a dielectric material, such as silicon oxide. The dielectric layer 180 may be formed by, for example, CVD, PVD, ALD, LPCVD, PECVD, or other suitable processes.

Figure 45A:
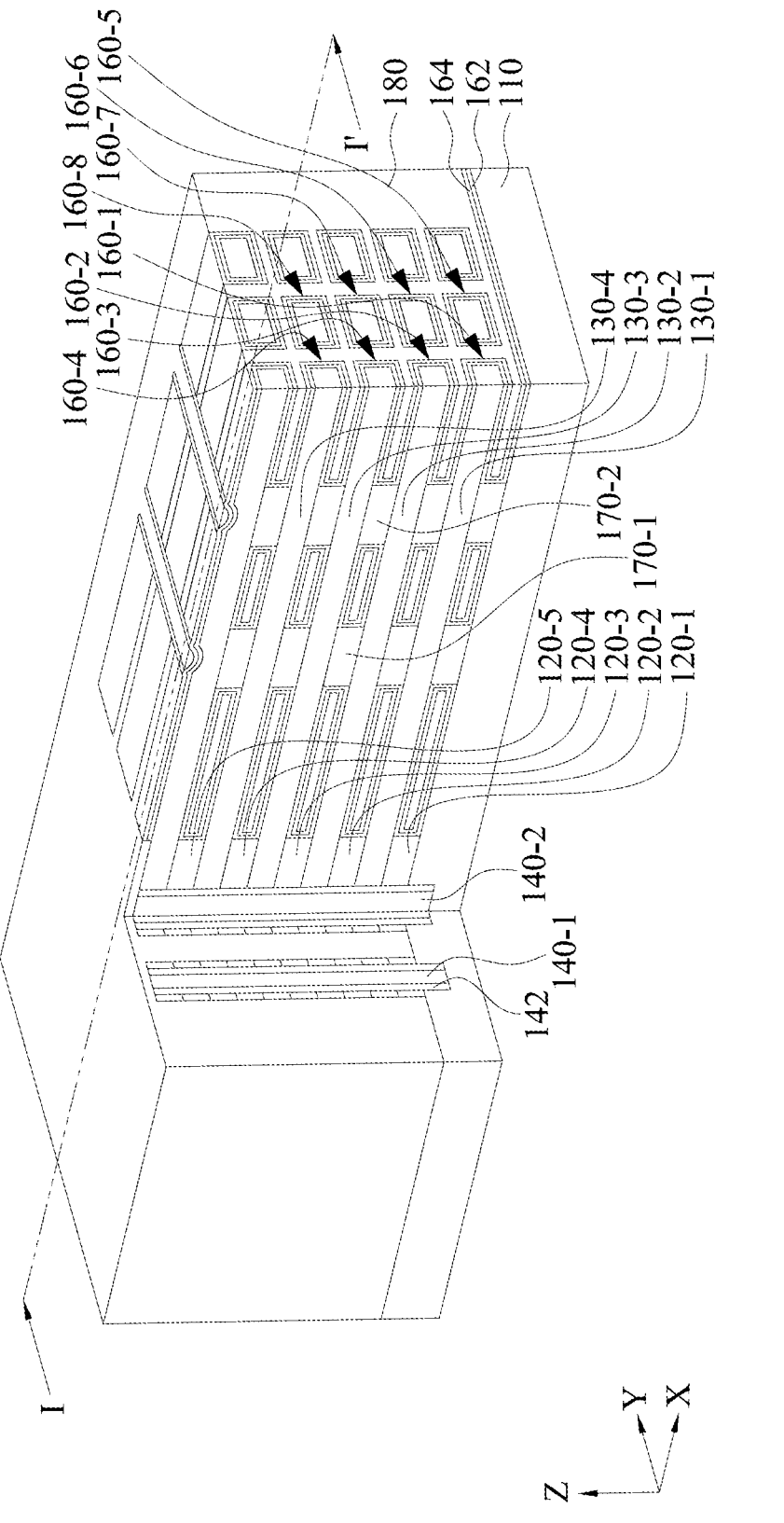
FIG. 45A and FIG. 45B illustrate one or more stages of an exemplary method for manufacturing a semiconductor device according to some embodiments of the present disclosure.
Figure 45B:
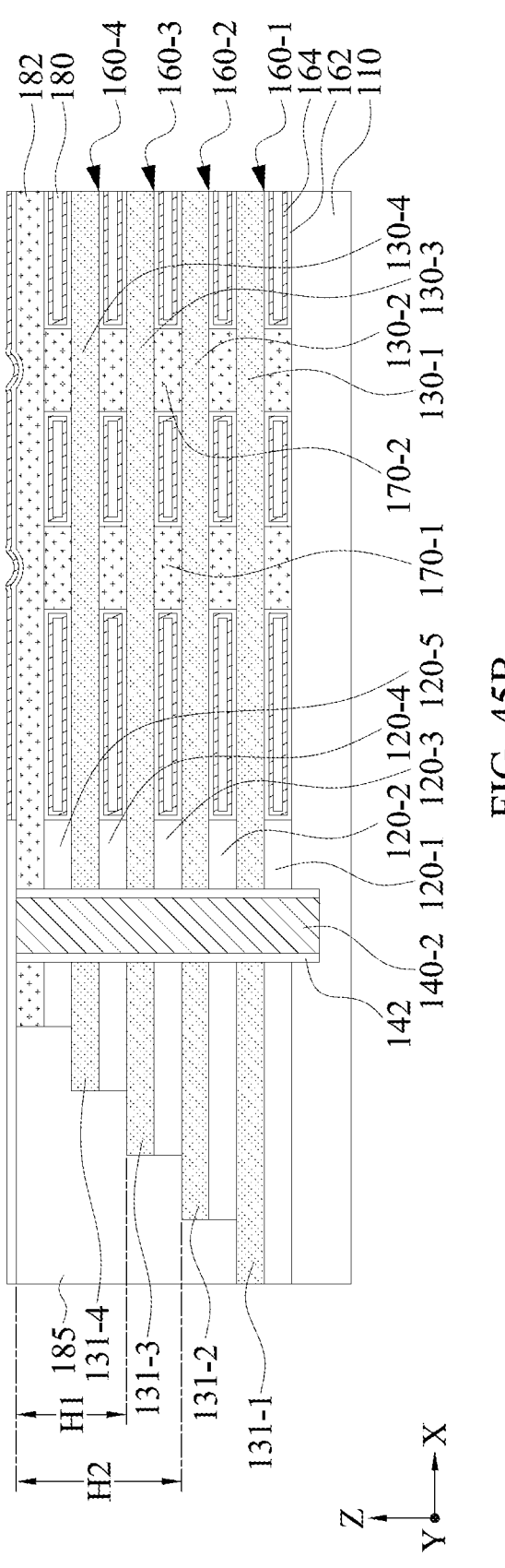

Referring to FIG. 45A and FIG. 45B, a grinding technique, such as CMP technique, may be performed to remove a portion of the dielectric layer 180.

Figure 46A:
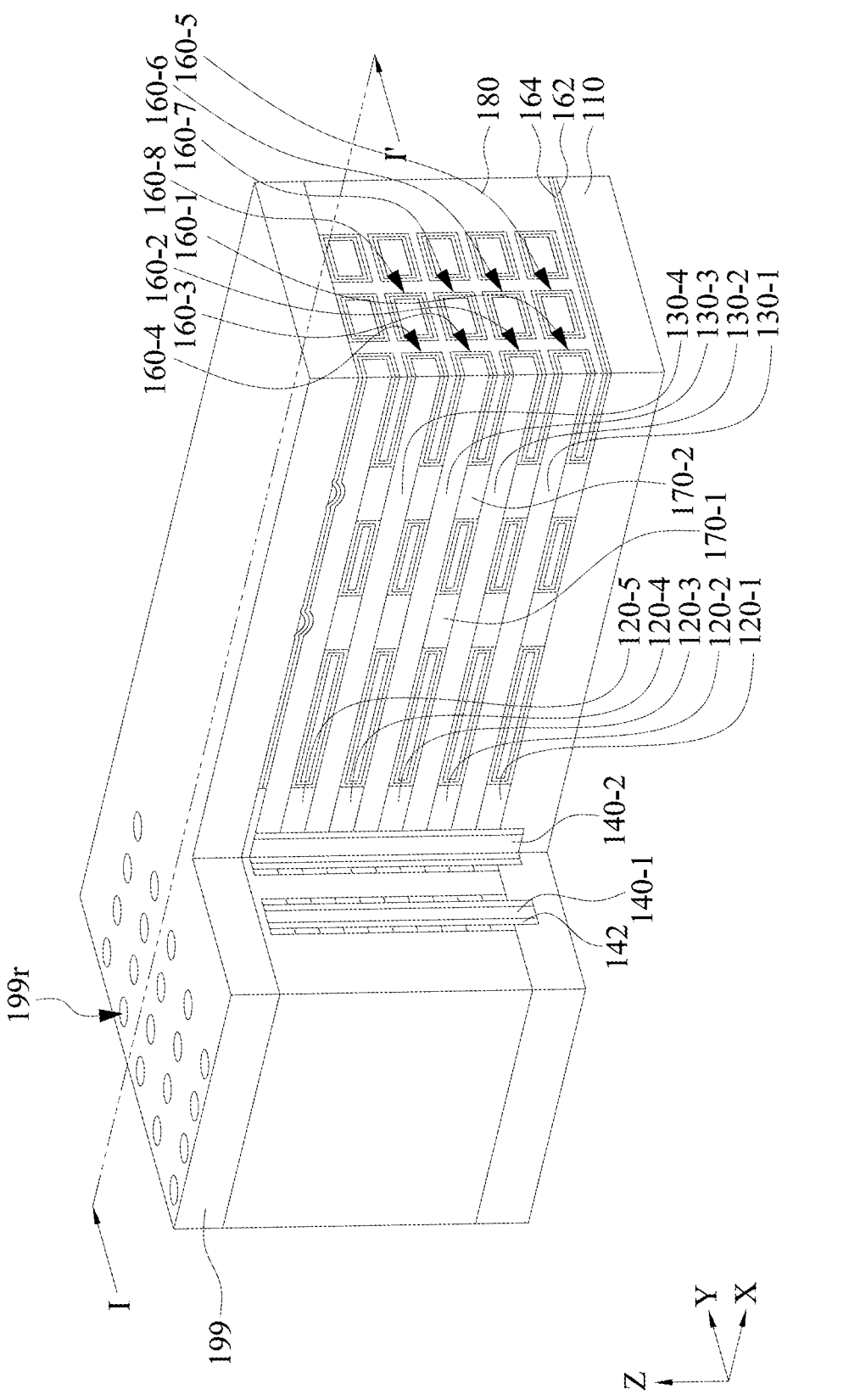
FIG. 46A and FIG. 46B illustrate one or more stages of an exemplary method for manufacturing a semiconductor device according to some embodiments of the present disclosure.
Figure 46B:
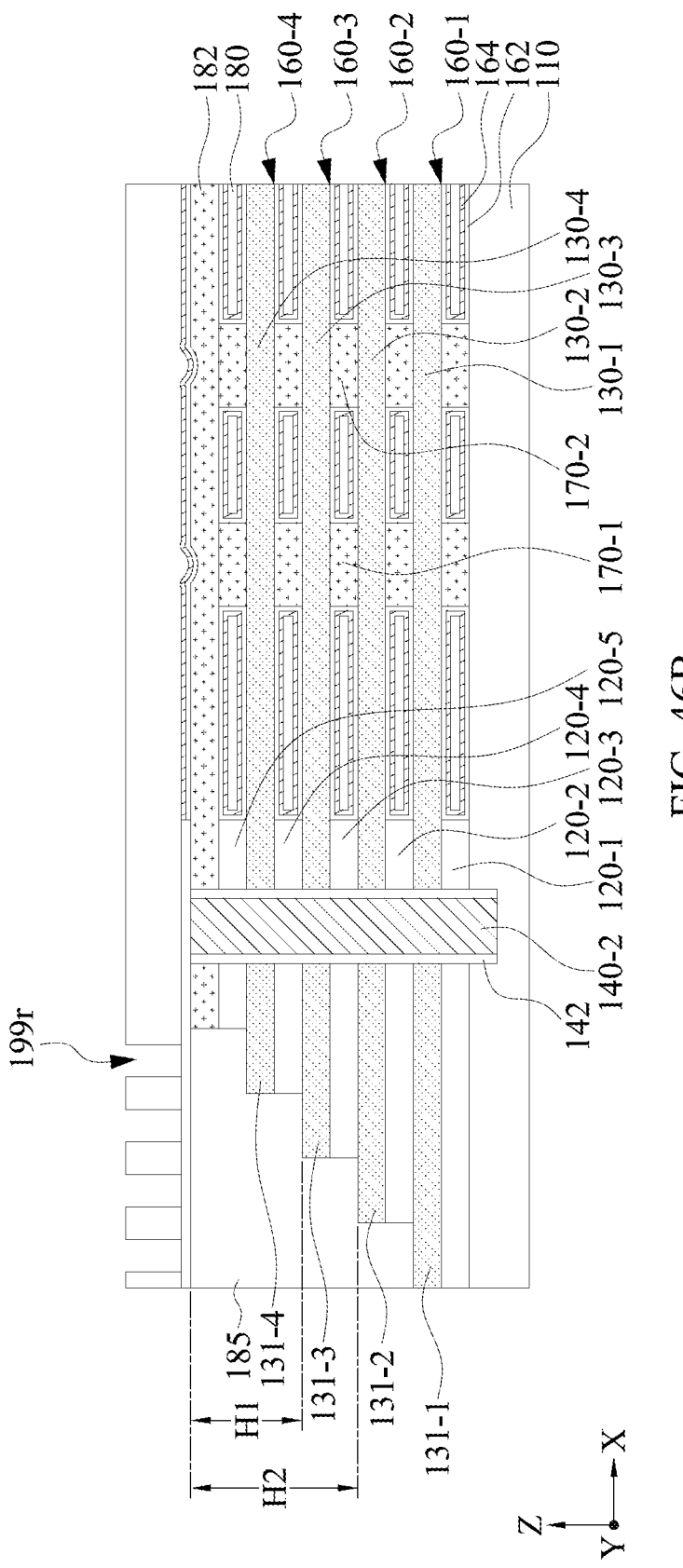

Referring to FIG. 46A and FIG. 46B, a photoresist layer 199 may be formed to cover the word lines 140-1, 140-2, 140-3, and 140-4. The capacitors 160-1, 160-2, 160-3, 160-4, 160-5, 160-6, 160-7, and 160-8 may be covered by the photoresist layer 199. The photoresist layer 199 may include a negative-tone photoresist or a positive-tone photoresist. The photoresist layer 199 may include openings 199r exposing the dielectric layer 185.

Figure 47A:
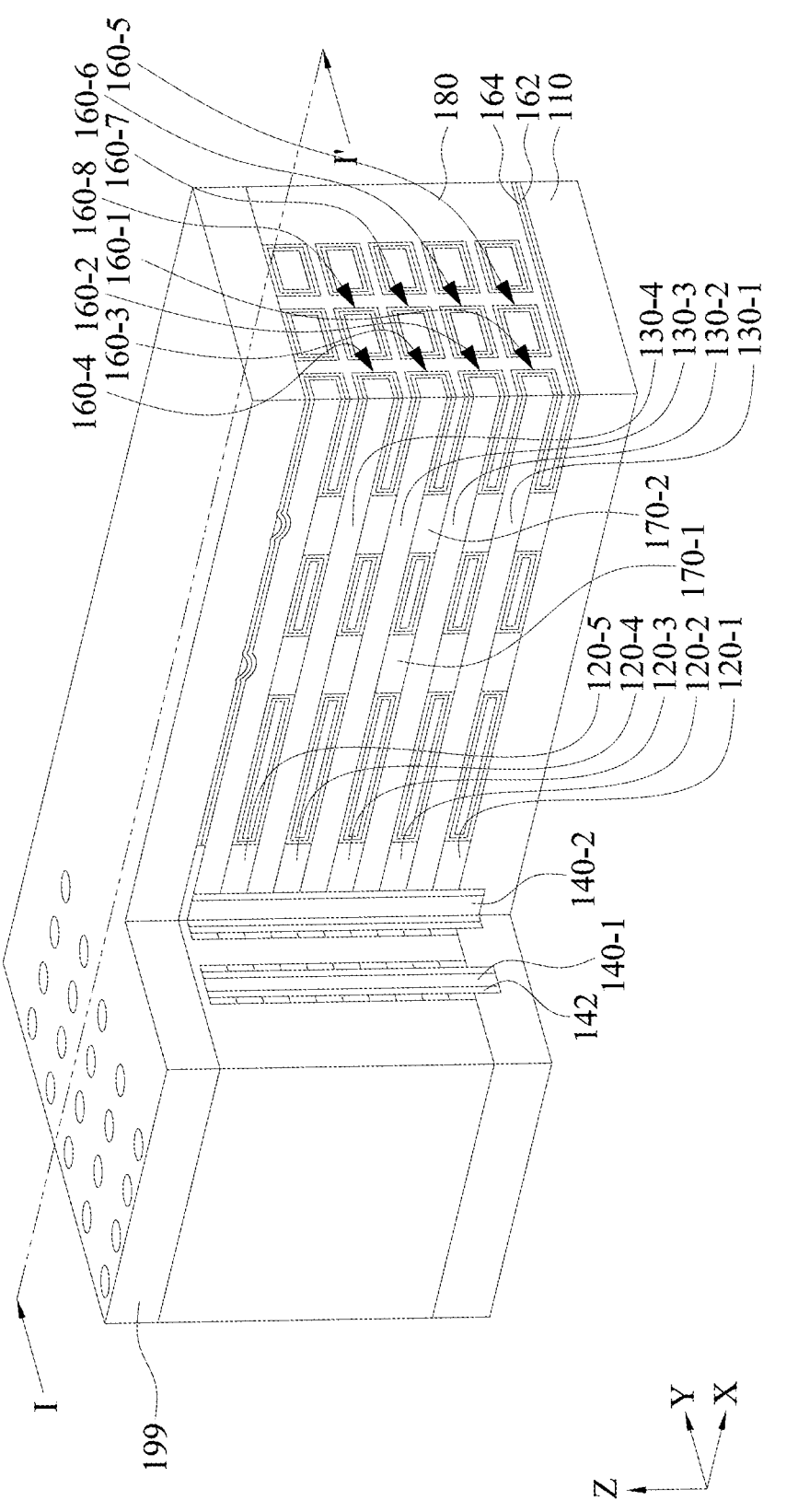
FIG. 47A and FIG. 47B illustrate one or more stages of an exemplary method for manufacturing a semiconductor device according to some embodiments of the present disclosure.
Figure 47B:
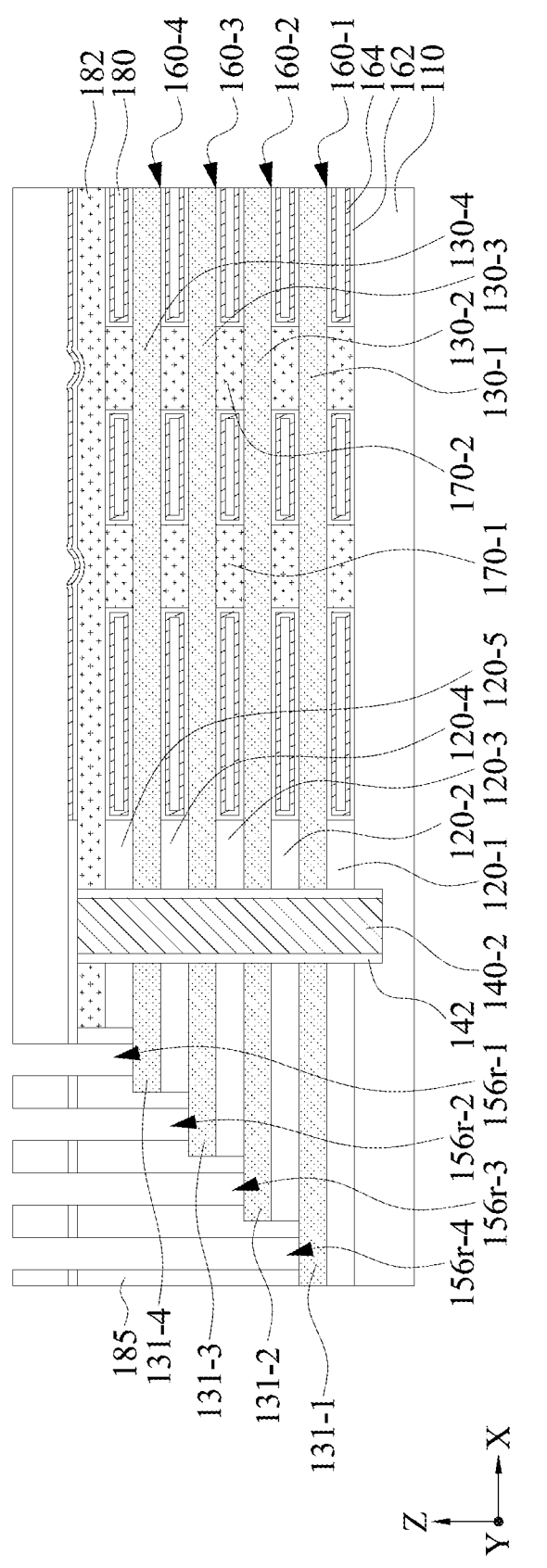

Referring to FIG. 47A and FIG. 47B, a portion of the dielectric layer 185 may be removed. Trenches 156r-1, 156r-2, 156r-3, and 156r-4 may be formed. The semiconductor layers 130-1, 130-2, 130-3, and 130-4 (or channel layers 131-1, 131-2, 131-3, and 131-4) may be exposed.

Figure 48A:
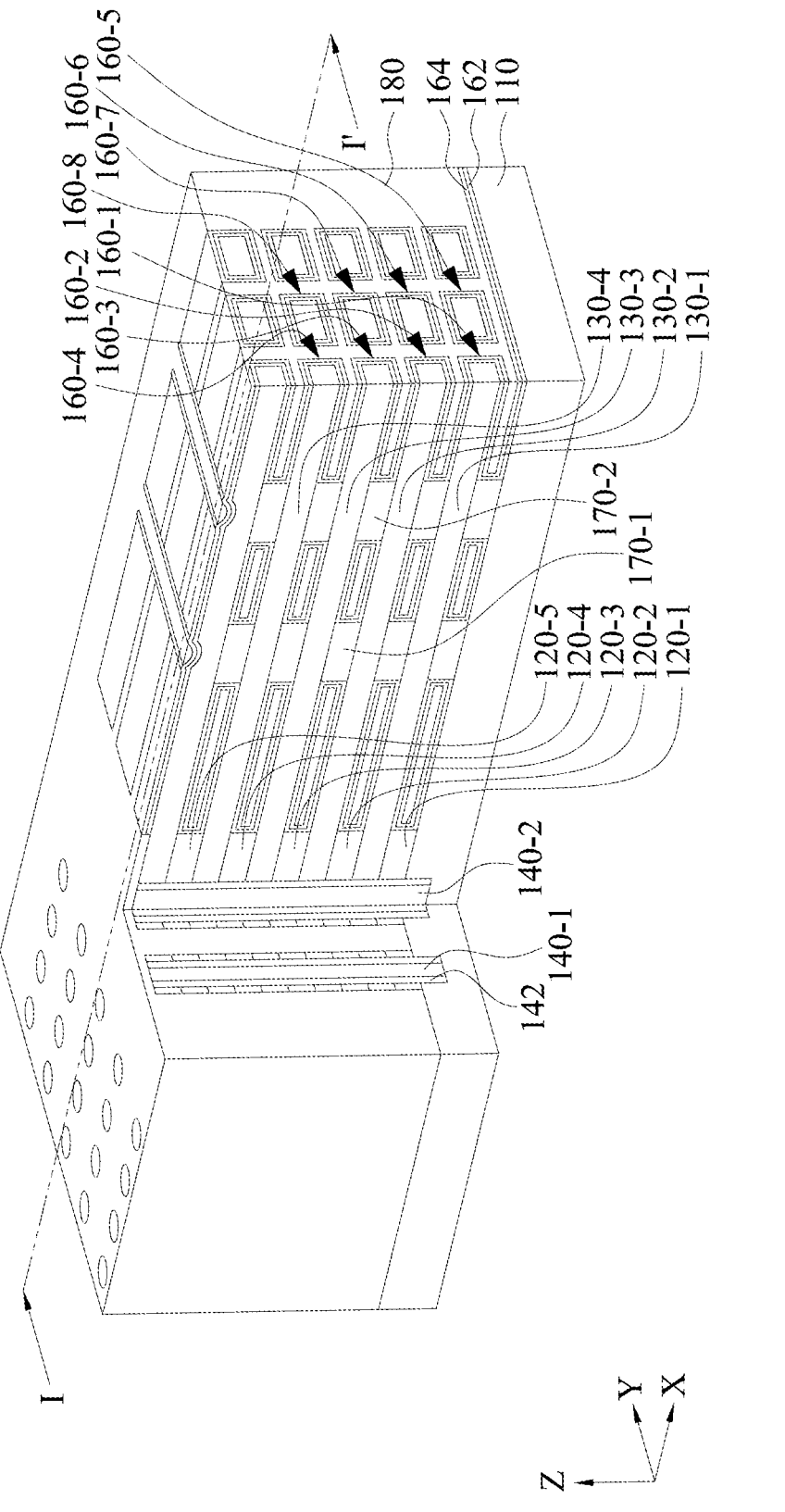
FIG. 48A and FIG. 48B illustrate one or more stages of an exemplary method for manufacturing a semiconductor device according to some embodiments of the present disclosure.
Figure 48B:
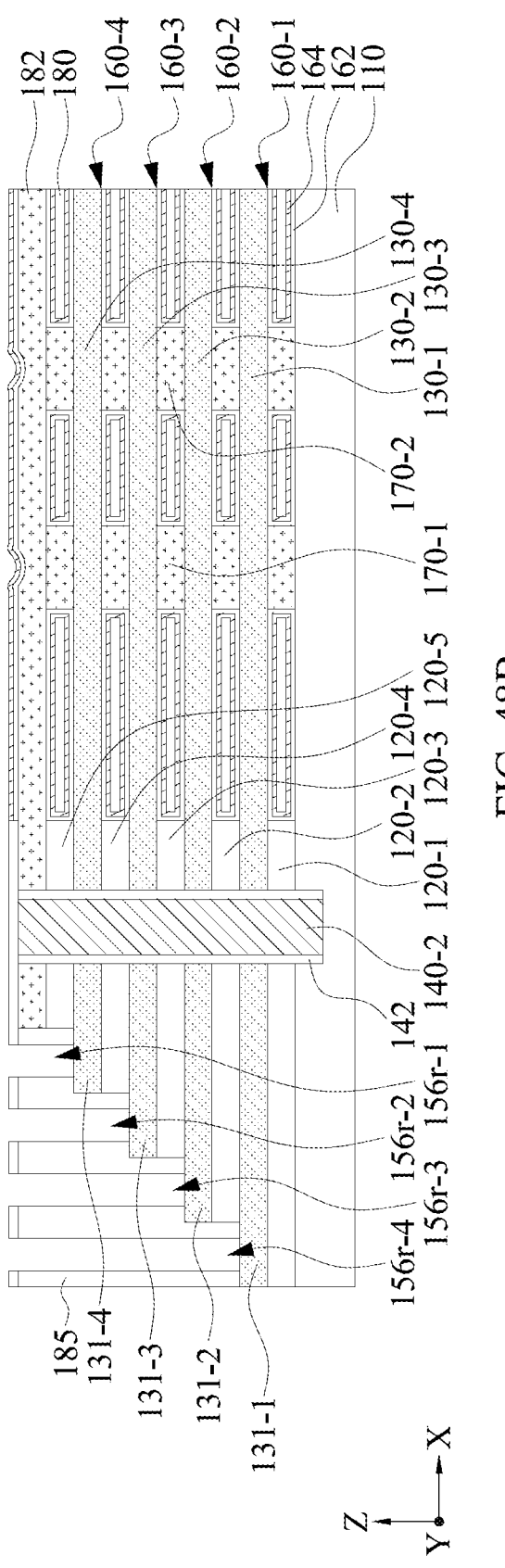

Referring to FIG. 48A and FIG. 48B, the photoresist layer 199 may be removed.

Figure 49A:
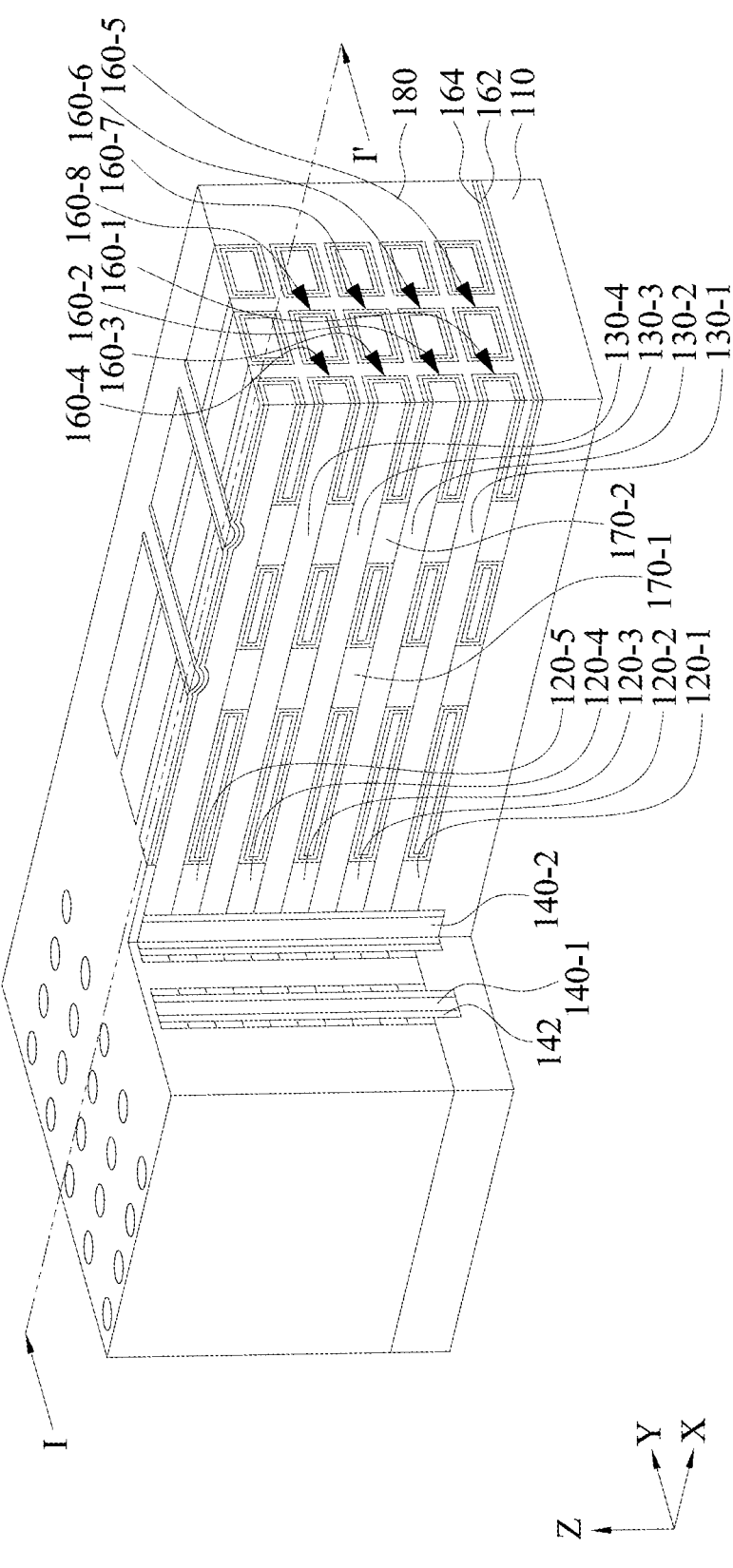
FIG. 49A and FIG. 49B illustrate one or more stages of an exemplary method for manufacturing a semiconductor device according to some embodiments of the present disclosure.
Figure 49B:
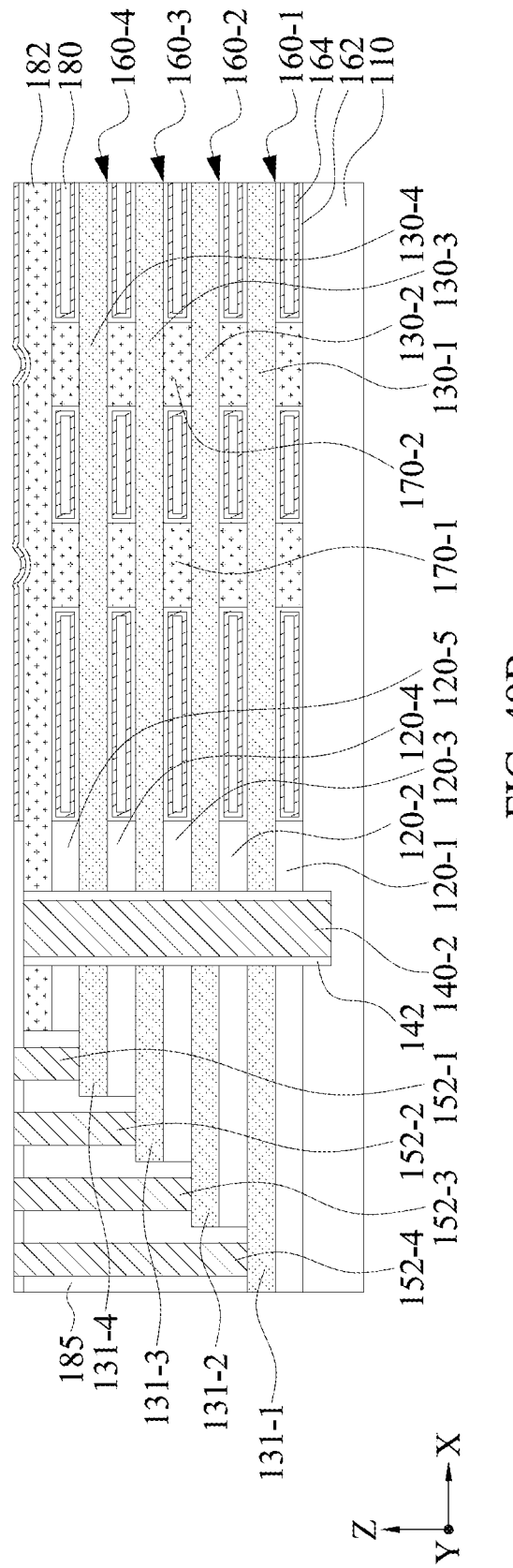

Referring to FIG. 49A and FIG. 49B, contact plugs 152-1, 152-2, 152-3, and 152-4 may be formed to fill the trenches 156r-1, 156r-2, 156r-3, and 156r-4. The conductive plugs 152-1, 152-2, 152-3, and 152-4 may include a conductive material, such as tungsten or other suitable materials. The conductive plugs 152-1, 152-2, 152-3, and 152-4 may be formed by CVD, PVD, ALD, LPCVD, PECVD, or other suitable processes. The semiconductor device 1g may be produced.

Figure 50A:
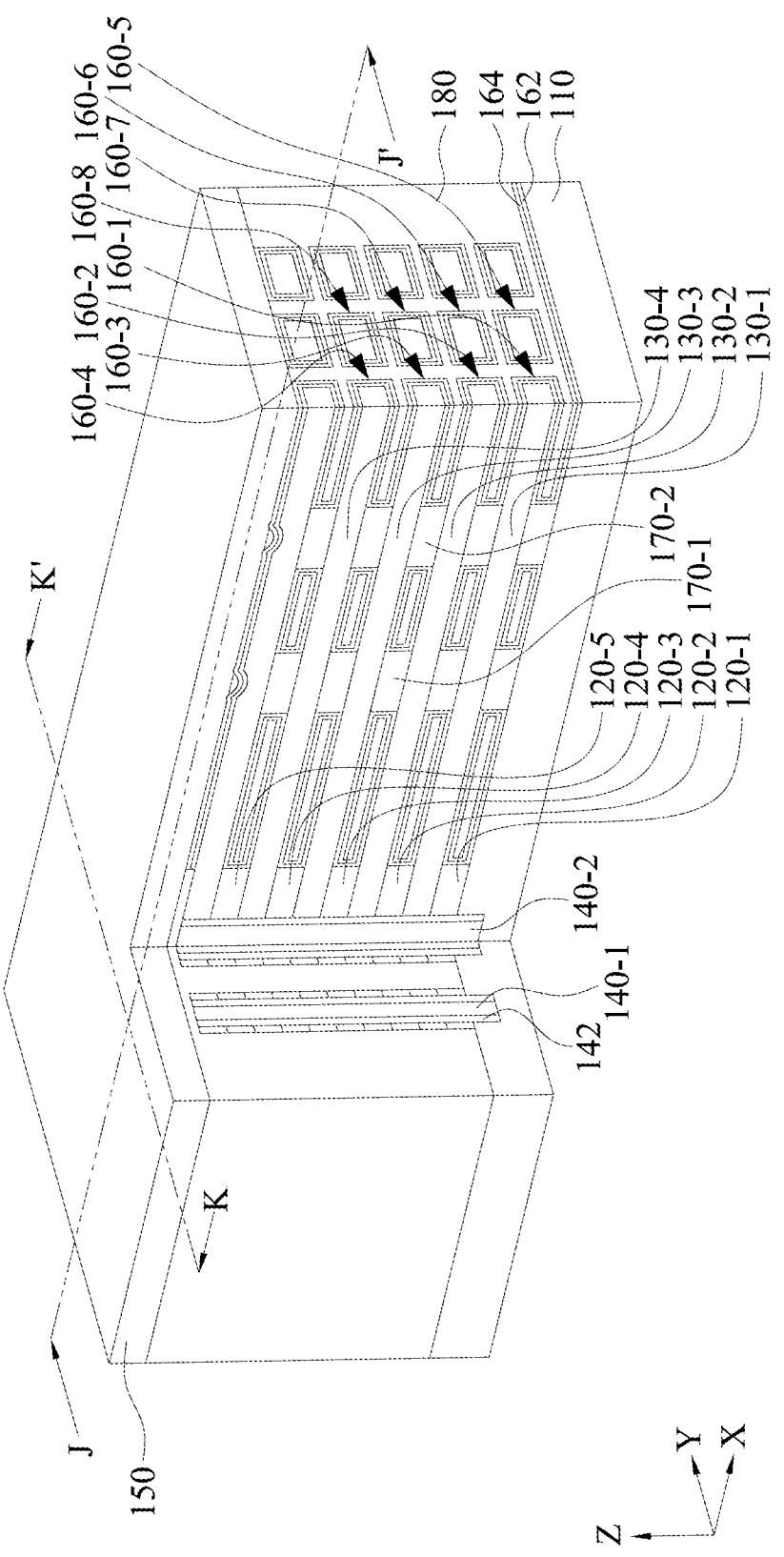

FIG. 50A to FIG. 53A illustrate one or more stages of an exemplary method for manufacturing a semiconductor device 1h according to some embodiments of the present disclosure. FIG. 50B to FIG. 53B are cross-sectional views along line J-J' of FIG. 50A to FIG. 53A, respectively. FIG. 50C to FIG. 53C are cross-sectional views along line K-K' of FIG. 50A to FIG. 53A, respectively. FIG. 50A depicts a stage subsequent to that depicted in FIG. 49A.

Figure 50B:
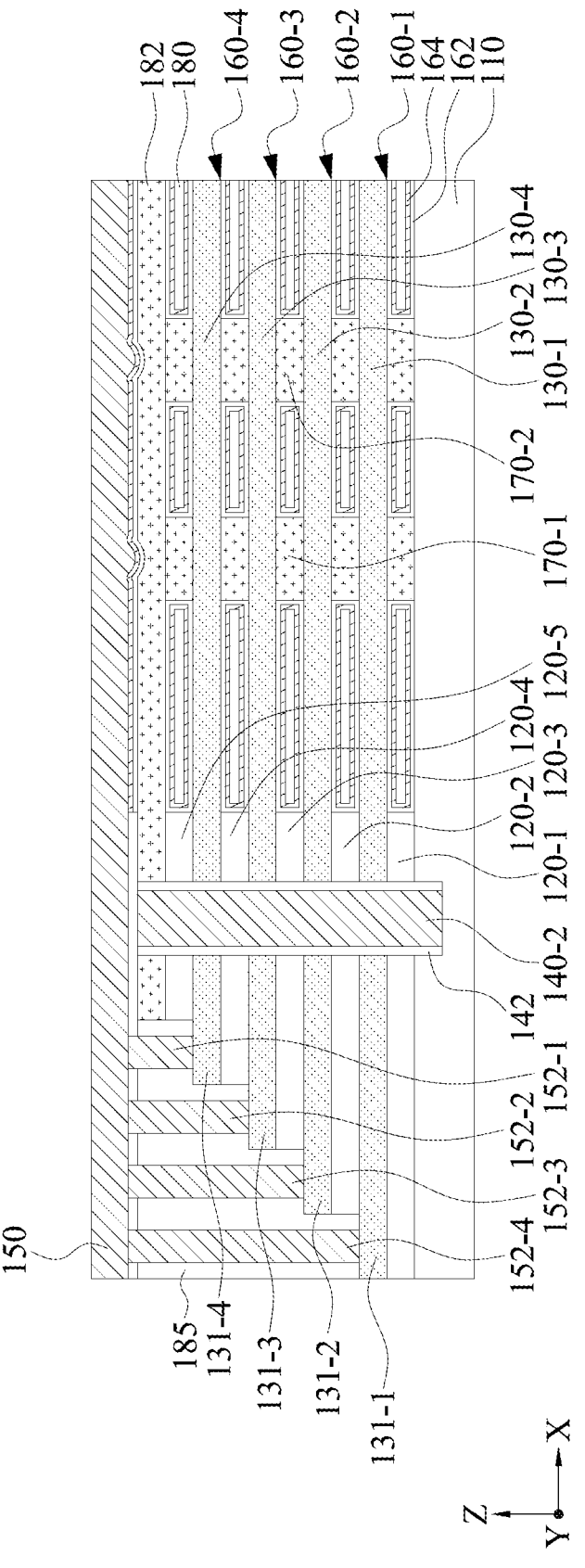

Referring to FIG. 50A, FIG. 50B, and FIG. 50C, a metallization layer 150 may be formed to cover the conductive plugs 152-1, 152-2, 152-3, and 152-4 as well as the word lines 140-1, 140-2, 140-3, and 140-4. The metallization layer 150 may include a conductive material, such as tungsten or other suitable materials. The metallization layer 150 may be formed by CVD, PVD, ALD, LPCVD, PECVD, or other suitable processes.

Figure 51A:
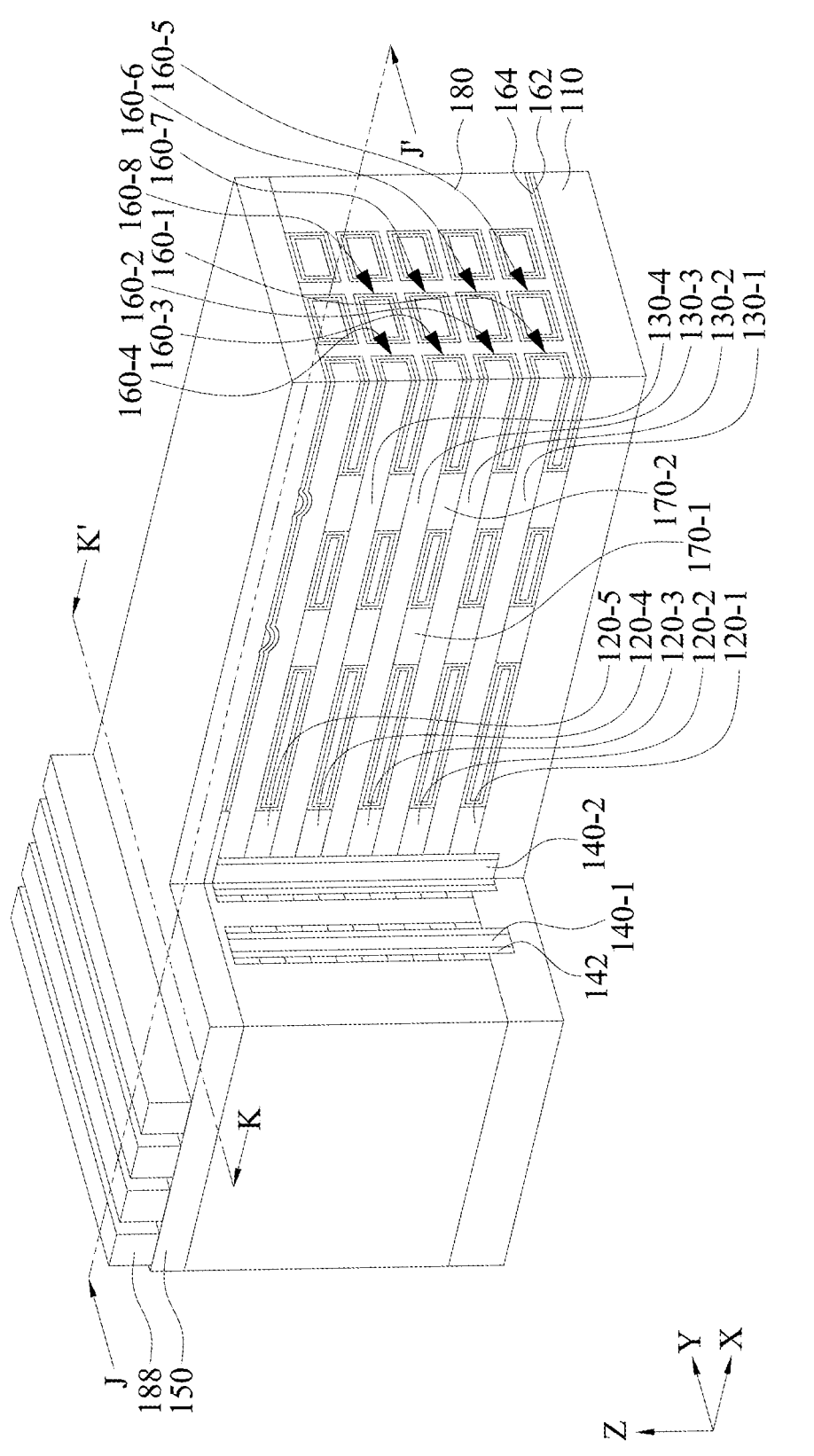
Figure 51B:
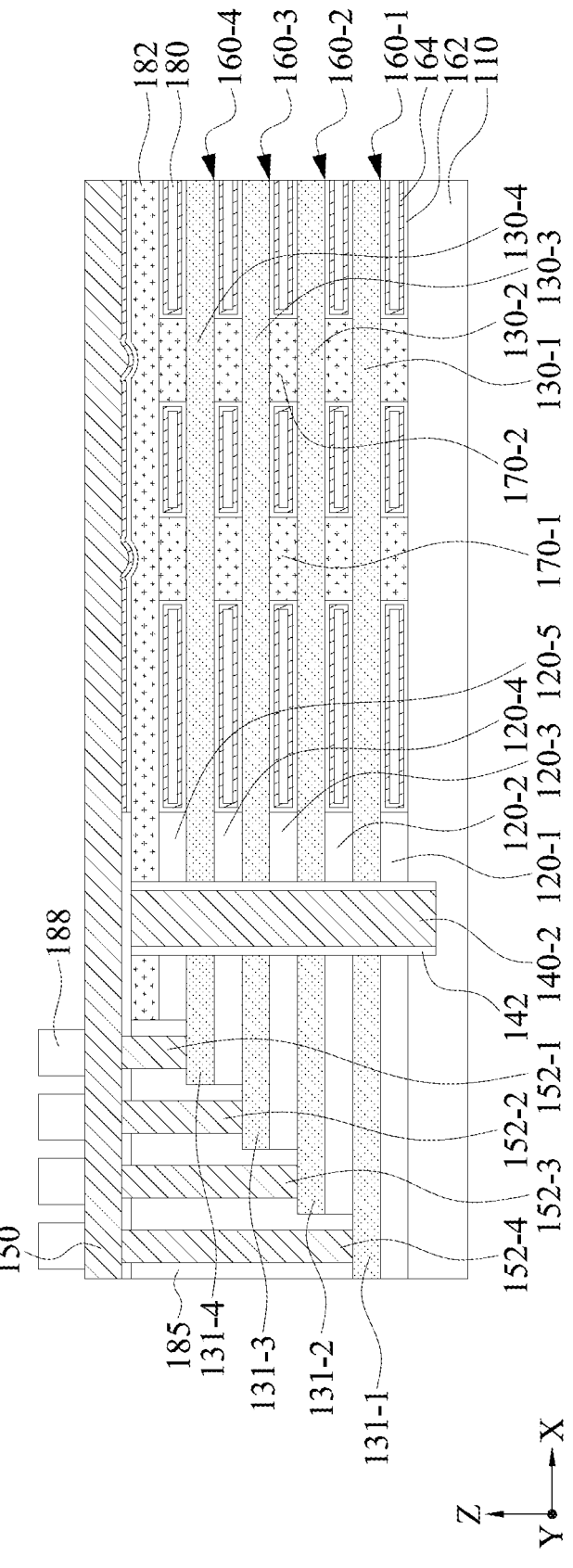

Referring to FIG. 51A, FIG. 51B, and FIG. 51C, a mask 188 may be formed to cover the metallization layer 150. A portion of the metallization layer 150 may be exposed from the mask 188.

Figure 52A:
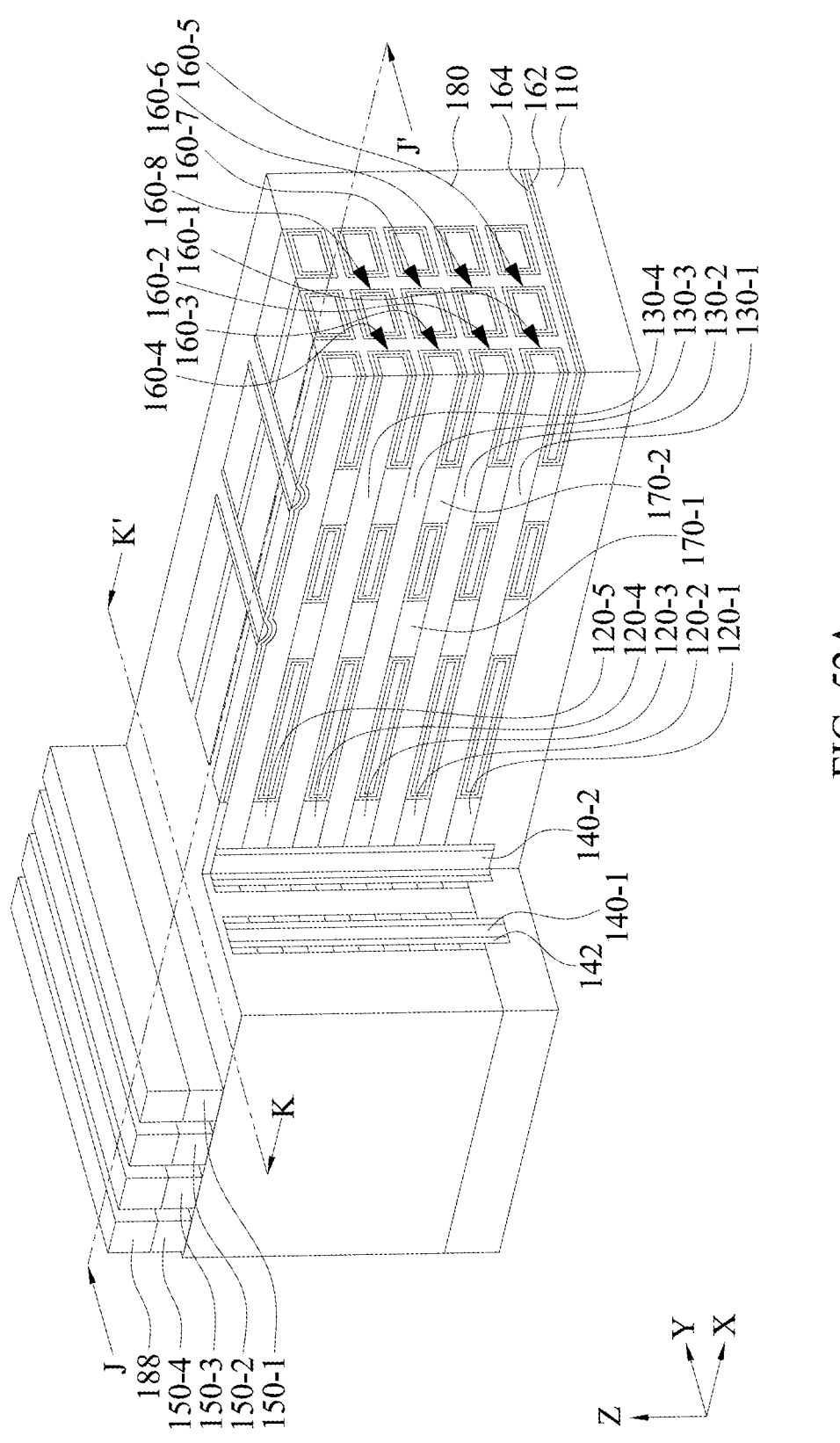
Figure 52B:
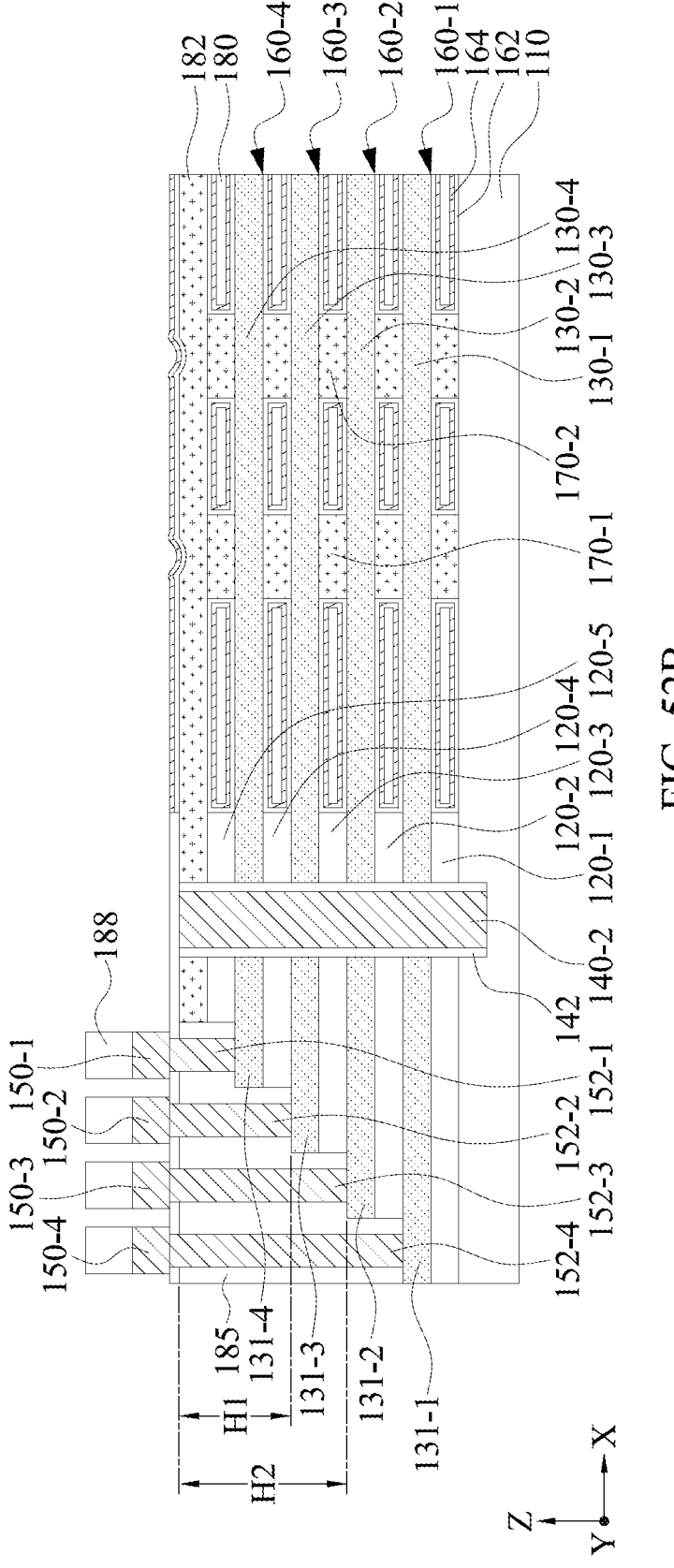

Referring to FIG. 52A, FIG. 52B, and FIG. 52C, a portion of the metallization layer 150 may be patterned to form bit lines 150-1, 150-2, 150-3, and 150-4. The metallization layer 150 may be patterned by a dry etching technique.

Figure 53A:
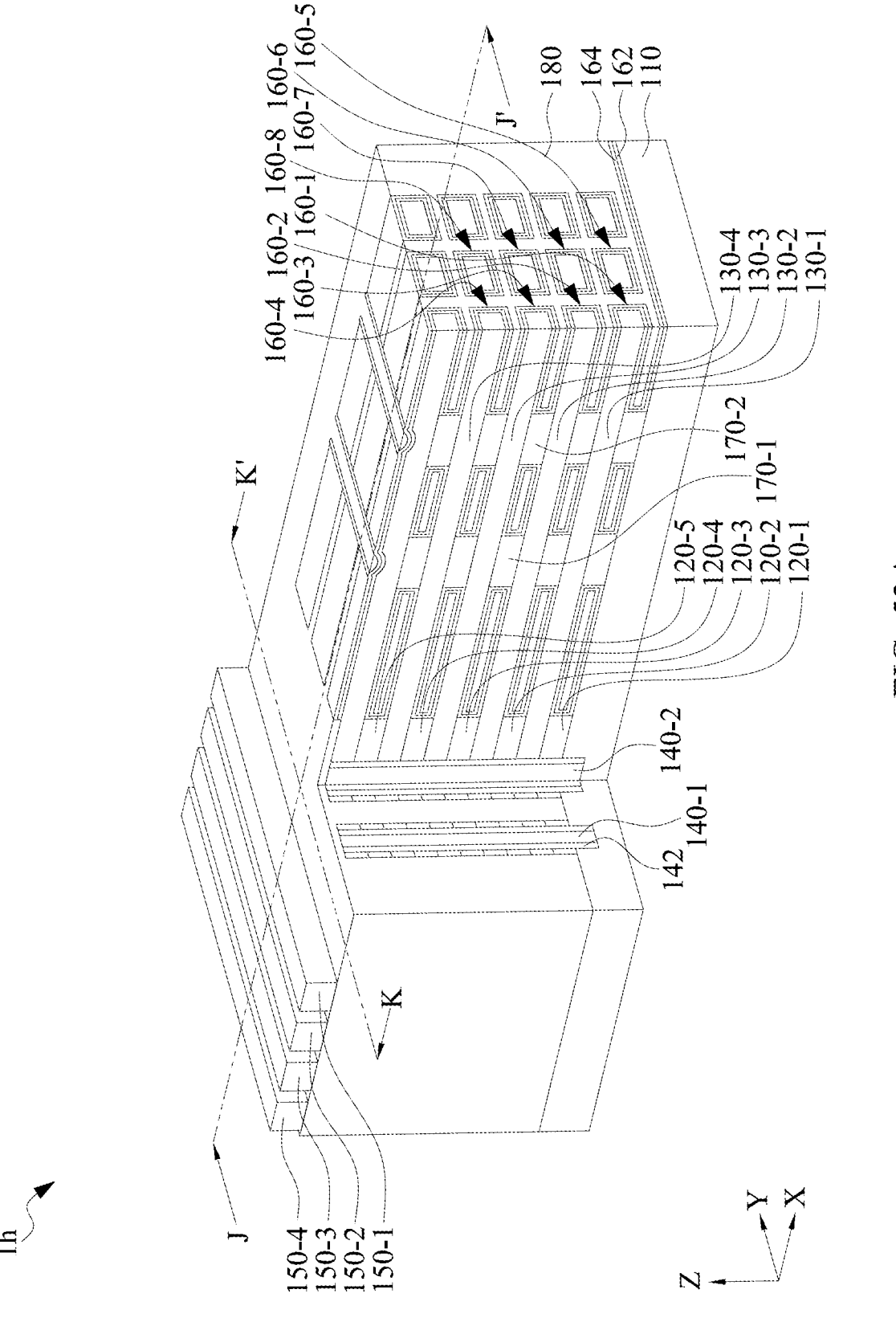
FIG. 53A, FIG. 53B and FIG. 53C illustrate one or more stages of an exemplary method for manufacturing a semiconductor device according to some embodiments of the present disclosure.
Figure 53B:
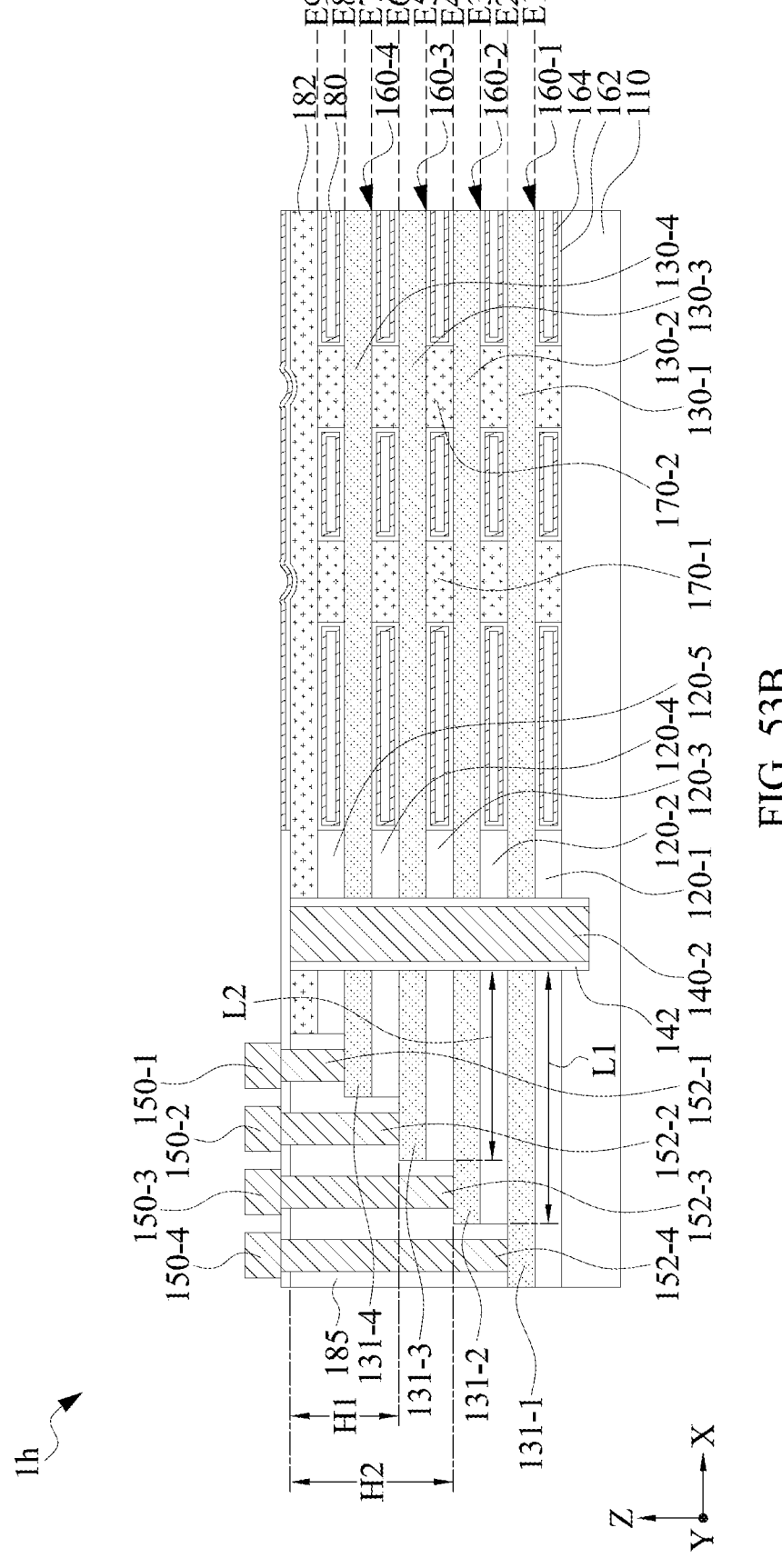
Figure 53C:
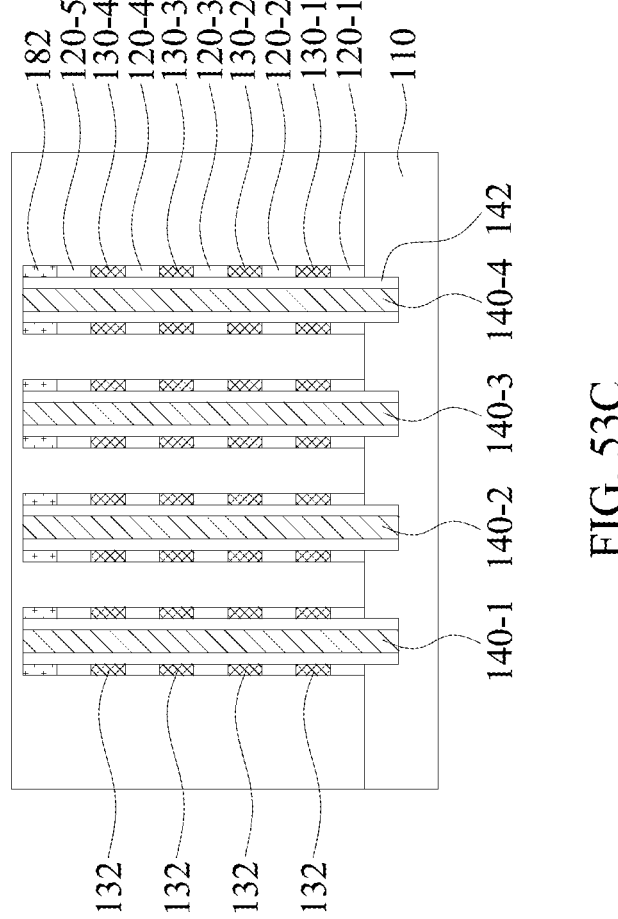
Figure 53C:
Figure 53C:
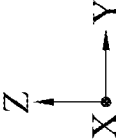

Referring to FIG. 53A, FIG. 53B, and FIG. 53C, the mask 188 may be removed. The semiconductor device 1h may be produced.

One aspect of the present disclosure provides a semiconductor device. The semiconductor device includes a substrate, a word line, a first capacitor, a second capacitor, a first bit line and a second bit line. The word line is disposed on the substrate and extends along a first direction. The first capacitor extends along a second direction different from the first direction and is located at a first level. The second capacitor extends along the second direction and is located at a second level different from the first level. The first bit line is electrically connected to the first capacitor and the word line. The second bit line is electrically connected to the second capacitor and the word line.

Another aspect of the present disclosure provides a semiconductor device. The semiconductor device includes a substrate, a first word line, a second word line, a first capacitor, a second capacitor, and a supporting layer. The first word line is disposed on the substrate and extends along a first direction. The second word line is disposed on the substrate and extends along the first direction. The first capacitor is electrically connected to the first word line and extends along a second direction different from the first direction. The first capacitor is located at a first level. The second capacitor is electrically connected to the second word line and extends along the second direction. The second capacitor is located at the first level. The supporting layer extends along a third direction different from the first direction and the second direction. The supporting layer extends across the first capacitor and the second capacitor.

Another aspect of the present disclosure provides a method for manufacturing a semiconductor device. The method includes providing a substrate. The method also includes forming a word line disposed on the substrate. The word line extends along a first direction. The method further includes forming a first capacitor. The first capacitor extends along a second direction different from the first direction and located at a first level. In addition, the method includes forming a second capacitor. The second capacitor extends along the second direction and located at a second level different from the first level. The method also includes forming a first bit line electrically connected to the first capacitor and the word line. The method further includes forming a second bit line electrically connected to the second capacitor and the word line.

The embodiments of the present disclosure provide a semiconductor device. The semiconductor device may define a three-dimensional memory device. For example, the capacitors and the word lines may be arranged horizontally, which reduces the overall thickness of the semiconductor device. Further, the semiconductor device may include supporting layers. The supporting layers may be configured to reinforce the intermediate structure during manufacturing processes. The supporting layers may be configured to increase the length of the first electrode of the capacitor and prevent the first electrode from collapsing, which may increase the number of capacitors.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a word line disposed on the substrate and extending along a first direction perpendicular to the substrate;
a first capacitor extending along a second direction different from the first direction and located at a first level;
a second capacitor extending along the second direction and located at a second level different from the first level;
a first bit line electrically connected to the first capacitor and the word line, the first bit line extending along a third direction and located at a third level; and
a second bit line electrically connected to the second capacitor and the word line, the second bit line extending along the third direction and located at the third level, wherein bottom surfaces of the first bit line and the second bit line are coplanar,
wherein the third direction is perpendicular to the first direction and the second direction, and the first level, the second level and the word line are disposed between the third level and the substrate.

2. The semiconductor device of claim 1, further comprising:
a first channel layer electrically connecting the first bit line and the word line,
wherein the first channel layer extends along the second direction and located at the first level.

3. The semiconductor device of claim 2, further comprising:
a second channel layer electrically connecting the second bit line and the word line,
wherein the second channel layer extends along the second direction and located at the second level.

4. The semiconductor device of claim 3, further comprising:
a first contact plug electrically connecting the first bit line and the first channel layer;
a second contact plug electrically connecting the second bit line and the second channel layer,
wherein the first contact plug extends along the first direction; the second contact plug extends along the first direction, the first contact plug has a first height along the first direction, and the second contact plug has a second height along the first direction different from the first height.

5. The semiconductor device of claim 3, wherein the first channel layer has a first length along the second direction, and the second channel layer has a second length along the second direction different from the first length.

6. The semiconductor device of claim 2, wherein the first capacitor comprises a first capacitor electrode, and the first capacitor electrode extends along the second direction, and the first capacitor electrode comprises a semiconductor material.

7. The semiconductor device of claim 6, wherein a material of the first channel layer is the same as a material of the first capacitor electrode.

8. The semiconductor device of claim 1, further comprising:
a third capacitor extending along the second direction and located at the first level; and a first supporting layer extending the third direction different from the first direction and the second direction;

a second supporting layer parallel to the first supporting layer, wherein the first supporting layer extends across the first capacitor and the third capacitor, and the first capacitor comprises a second capacitor electrode, and the second capacitor electrode is disposed between the first supporting layer and the second supporting layer.

9. A semiconductor device, comprising:

a substrate;

a first word line disposed on the substrate and extending along a first direction perpendicular to the substrate;

a second word line disposed on the substrate and extending along the first direction;

a first capacitor electrically connected to the first word line and extending along a second direction different from the first direction, wherein the first capacitor is located at a first level;

a second capacitor electrically connected to the second word line and extending along the second direction, wherein the second capacitor is located at the first level; and a supporting layer extending along a third direction different from the first direction and the second direction, wherein the supporting layer extends across the first capacitor and the second capacitor at the first level, and the first capacitor, the supporting layer, the second capacitor and the first word line disposed sequentially in the second direction at the first level.

10. The semiconductor device of claim 9, further comprising:

a third capacitor electrically connected to the first word line;

a first bit line electrically connected to the first capacitor extending along the third direction; and a first channel layer electrically connecting the first bit line and the first word line, wherein the first channel layer extends along the second direction.

11. The semiconductor device of claim 10, further comprising:

a second bit line electrically connected to the third capacitor; and a second channel layer electrically connecting the second bit line and the third capacitor, wherein a first length of the first channel layer is different from a second length of the second channel layer along the second direction.

12. The semiconductor device of claim 10, wherein the first channel layer is located at the first level.

13. The semiconductor device of claim 10, further comprising:

a second bit line electrically connected to the third capacitor;

a second channel layer electrically connecting the second bit line and the third capacitor;

a first contact plug electrically connecting the first bit line and the first channel layer, wherein the first contact plug has a first height along the first direction; and a second contact plug electrically connecting the second bit line and the second channel layer, wherein the second contact plug has a second height along the first direction different from the first height.

14. The semiconductor device of claim 10, wherein the first channel layer comprises a doped region at least partially surrounding the first word line, and the first capacitor comprises a first capacitor electrode located at the first level.

15. The semiconductor device of claim 10, wherein the first bit line is disposed over the first word line and the second word line.

16. The semiconductor device of claim 9, wherein the first capacitor comprises a capacitor dielectric, and the capacitor dielectric is disposed on the supporting layer.

* * * * *